United States Patent
Yamada et al.

(10) Patent No.: US 10,748,589 B1
(45) Date of Patent: Aug. 18, 2020

(54) MEMORY SYSTEM

(71) Applicant: TOSHIBA MEMORY CORPORATION, Minato-ku (JP)

(72) Inventors: Hideki Yamada, Yokohama (JP); Marie Takada, Yokohama (JP); Masanobu Shirakawa, Chigasaki (JP); Naomi Takeda, Yokohama (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 16/524,536

(22) Filed: Jul. 29, 2019

(30) Foreign Application Priority Data

Mar. 12, 2019 (JP) .................. 2019-044961

(51) Int. Cl.
*G11C 8/12* (2006.01)
*G11C 11/16* (2006.01)
*G06F 11/10* (2006.01)
*G06F 13/16* (2006.01)

(52) U.S. Cl.
CPC ............ *G11C 8/12* (2013.01); *G06F 11/1008* (2013.01); *G06F 13/1689* (2013.01); *G11C 11/1673* (2013.01); *G11C 11/1675* (2013.01)

(58) Field of Classification Search
CPC ... G11C 8/12; G11C 11/1675; G11C 11/1673; G06F 13/1689; G06F 11/1008
See application file for complete search history.

(56) References Cited

U.S. PATENT DOCUMENTS

| 9,093,156 | B2 * | 7/2015 | Fukuzumi | G11C 19/02 |
| 2010/0128510 | A1 * | 5/2010 | Cowburn | B82Y 10/00 365/80 |
| 2016/0224242 | A1 | 8/2016 | Kondo et al. | |
| 2019/0287593 | A1 | 9/2019 | Ueda | |
| 2020/0082863 | A1 | 3/2020 | Ueda et al. | |
| 2020/0089567 | A1 | 3/2020 | Takeda et al. | |

FOREIGN PATENT DOCUMENTS

| JP | 2016-143432 A | 8/2016 |
| JP | 2019-164848 A | 9/2019 |
| JP | 2020-42882 A | 3/2020 |
| JP | 2020-46916 A | 3/2020 |

OTHER PUBLICATIONS

Susisu, "Three Different Detection Algorithm", downloaded from: https://susisu.hatenablog.com/entry/2017/10/09/134032, , Oct. 9, 2017, 36 pages (with Machine Generated English Translation).

* cited by examiner

*Primary Examiner* — Ajay Ojha
(74) *Attorney, Agent, or Firm* — Oblon, McClelland, Maier & Neustadt, L.L.P.

(57) ABSTRACT

According to one embodiment, a memory system includes a nonvolatile memory and a controller. The nonvolatile memory includes first blocks each including magnetic memory lines and performs writing and reading of data for each block by a last-in first-out (LIFO) method by shifting, in a unit of a layer, data portions stored in a plurality of layers, respectively, in a first direction from a top layer to a last layer or in a second direction opposite to the first direction, the magnetic memory lines including the plurality of layers. The controller controls the nonvolatile memory. The controller selects a source block of a compaction process from the first blocks based on a ratio of layers of a second attribute to the plurality of layers in each of the first blocks.

14 Claims, 53 Drawing Sheets

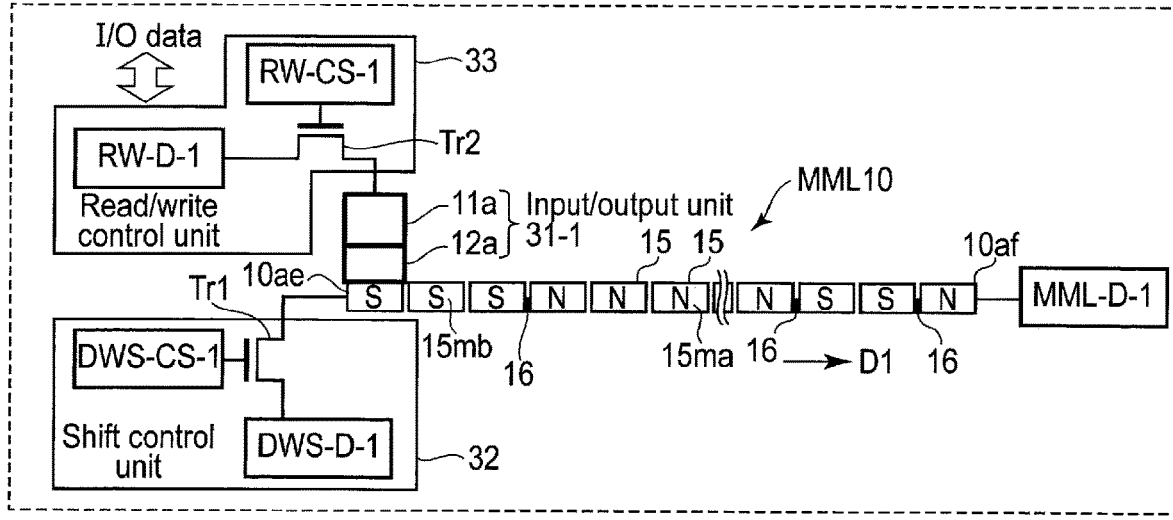
F I G. 3
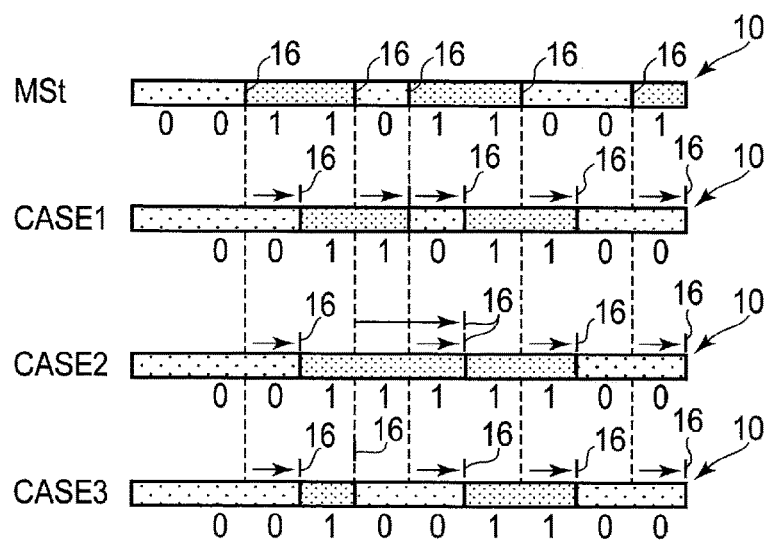
F I G. 4

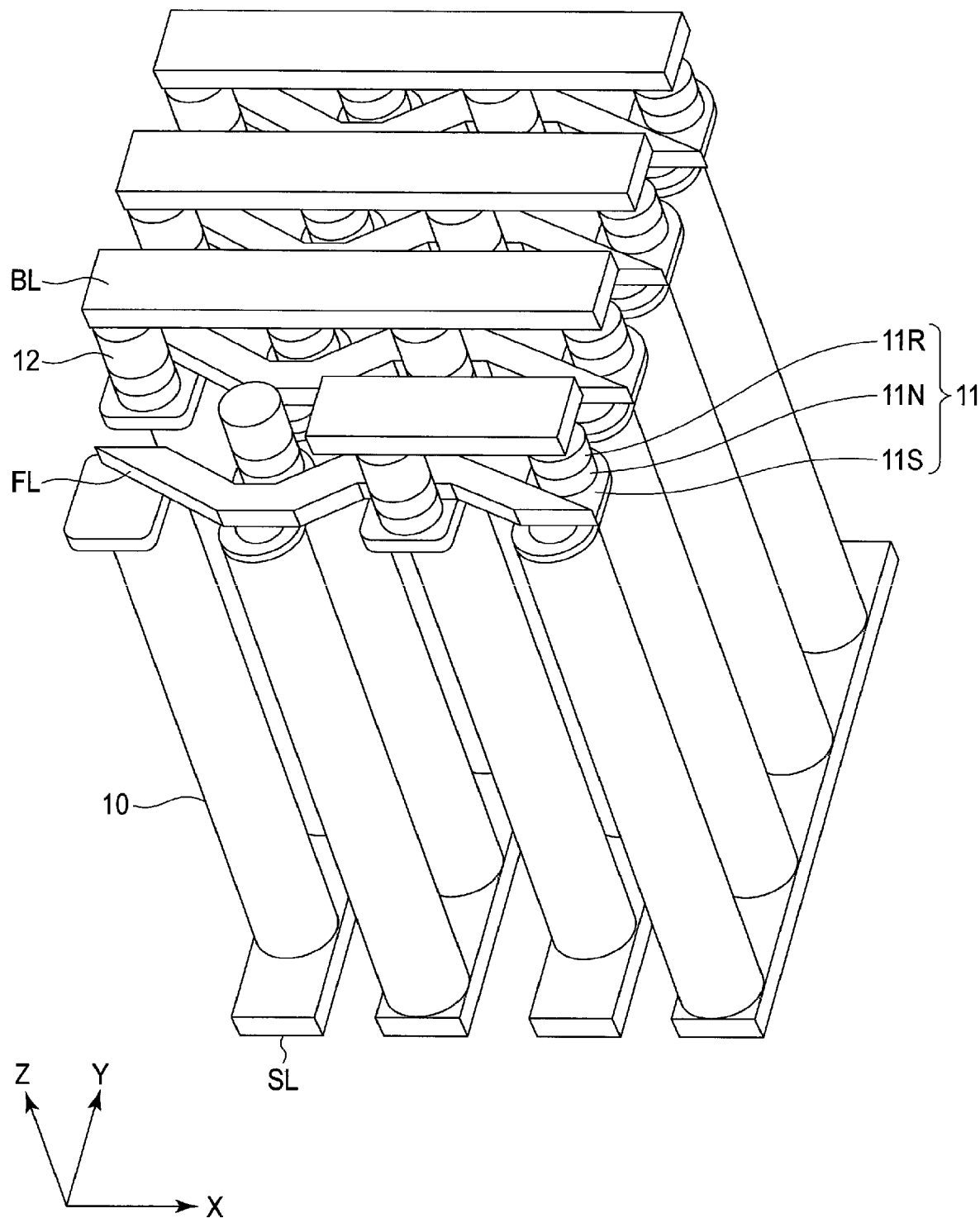
F I G. 11

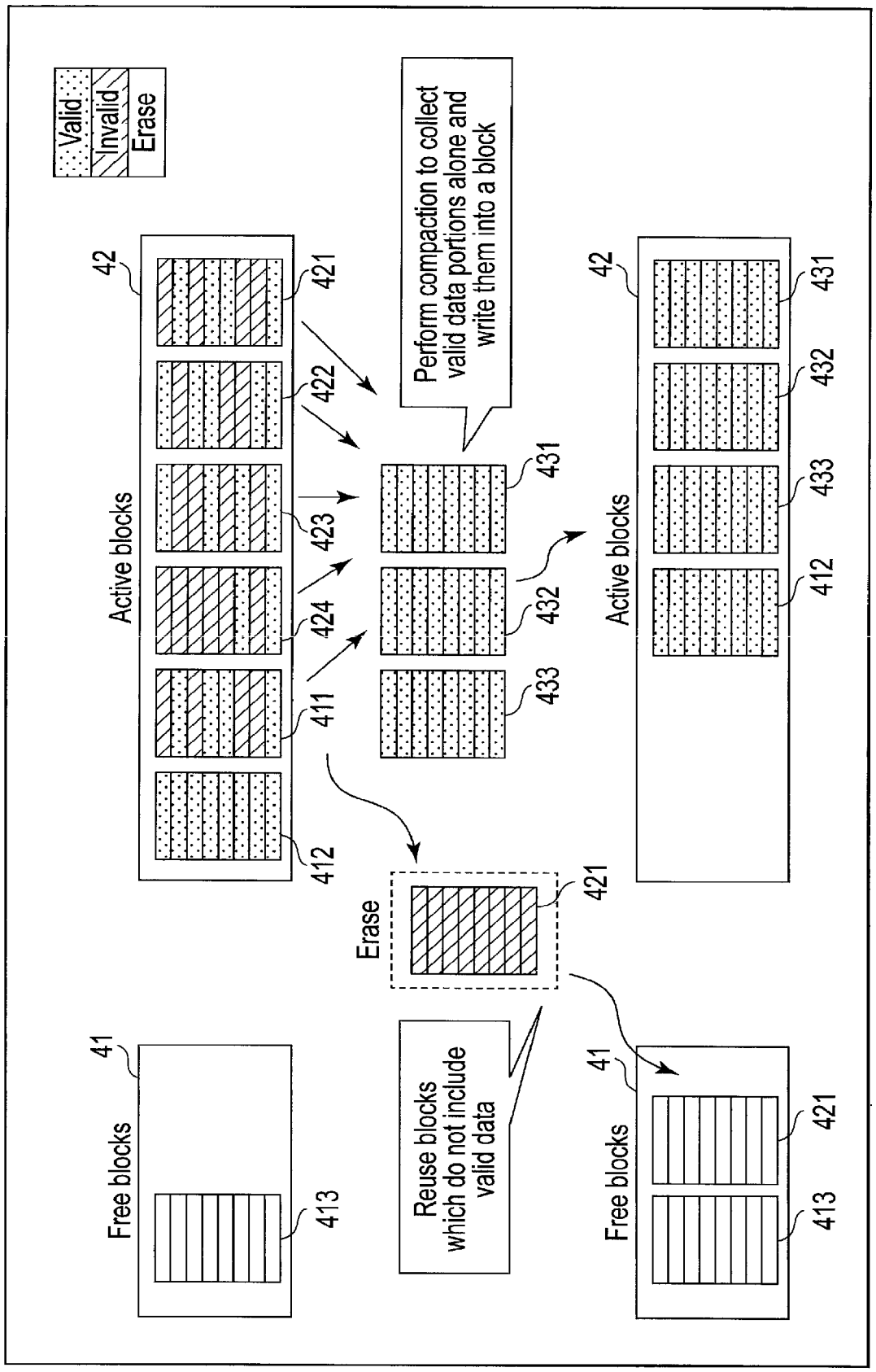
F I G. 16

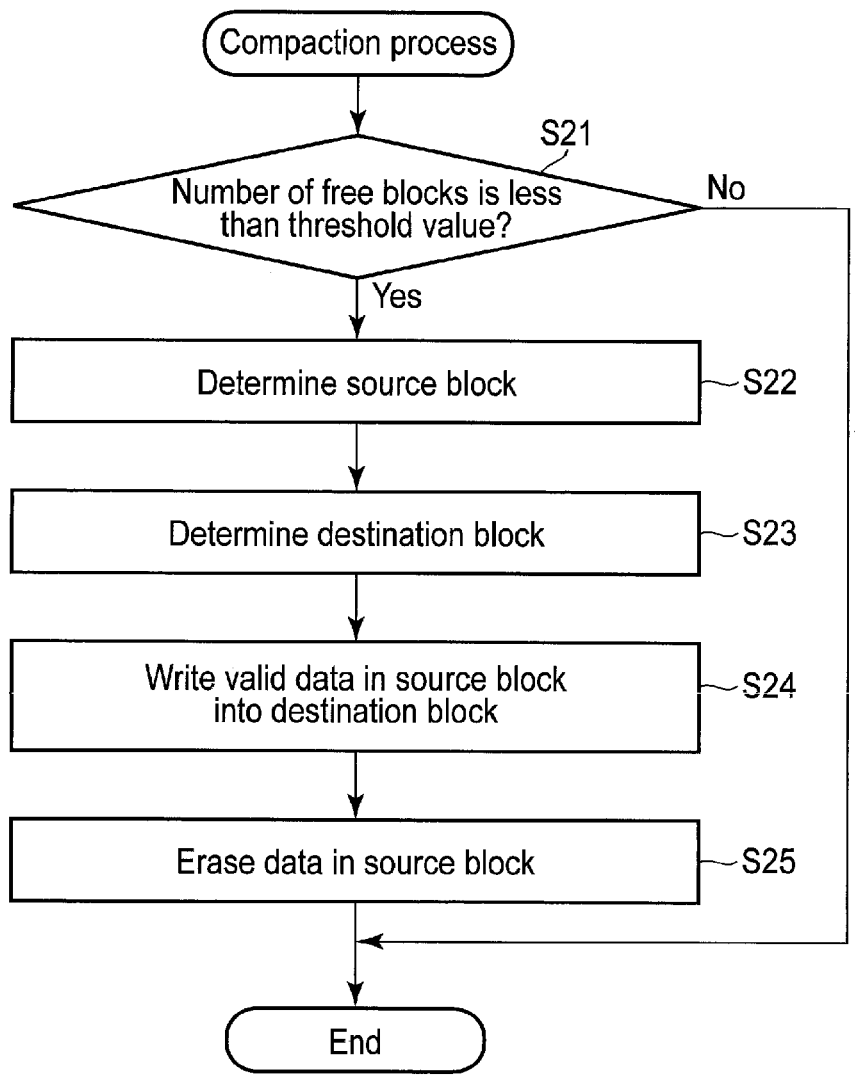
F I G. 17

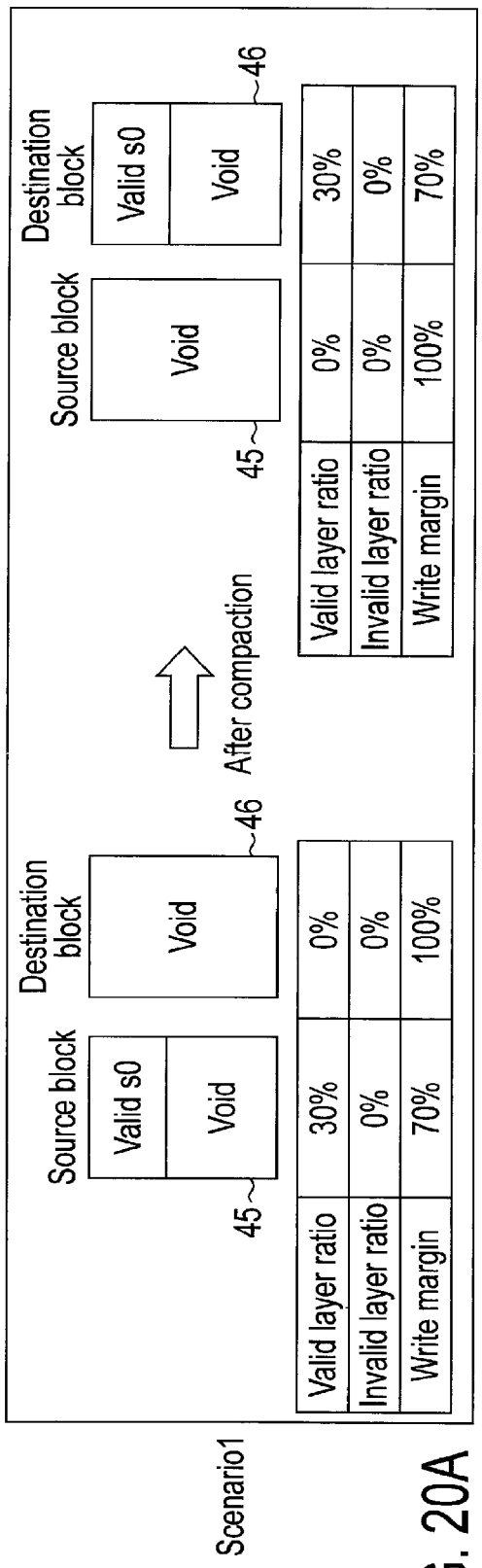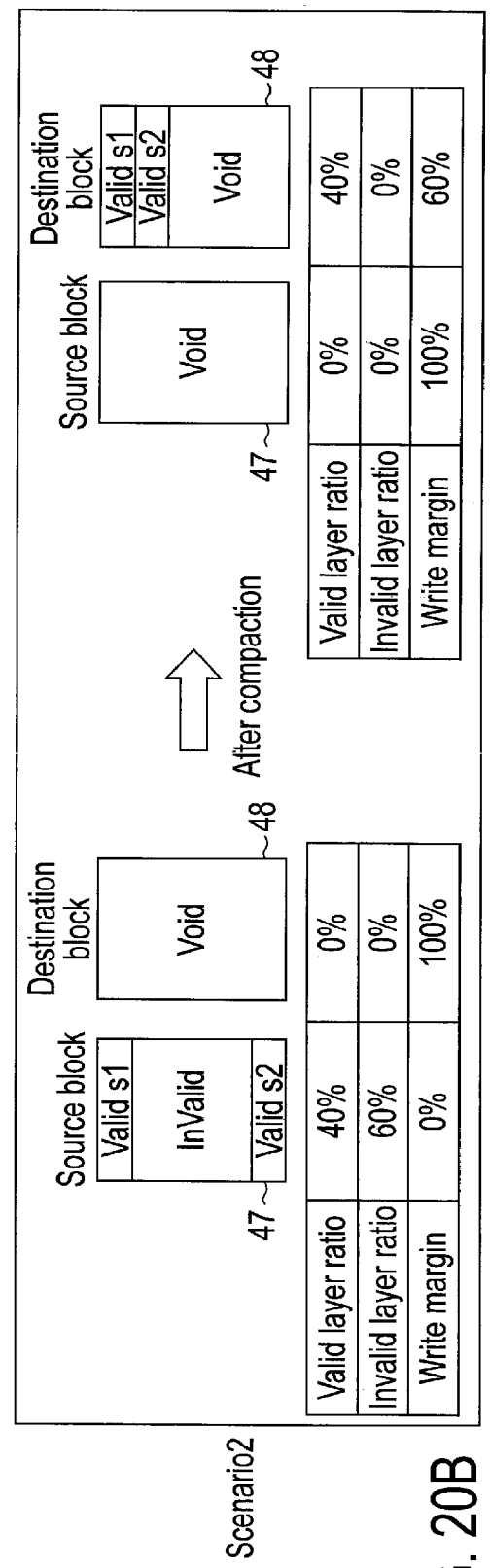
FIG. 20A
FIG. 20B

| | NAND/NOR flash memory | Magnetic domain wall memory |
|---|---|---|
| Compaction activation condition | Free block ratio or number of free blocks < threshold value | Free block ratio or number of free blocks < threshold value |
| Source block | Block with low valid data ratio | Prioritize block with greater invalid layer ratio and prioritize block with deeper valid layer depth between blocks with same invalid layer ratio |
| Destination block | Free block (because overwrite is impossible) | • Free block (invalid layer ratio = 0)<br>• Block including void area size of which is equal to or larger than size of valid-data in source block |

F I G. 21

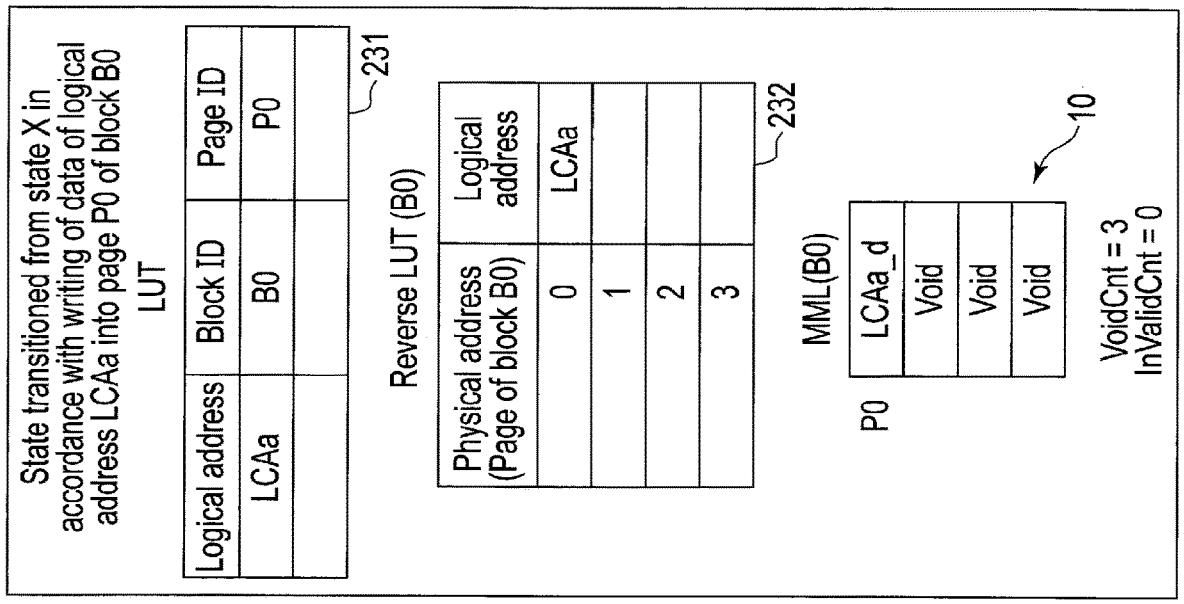
F I G. 22B
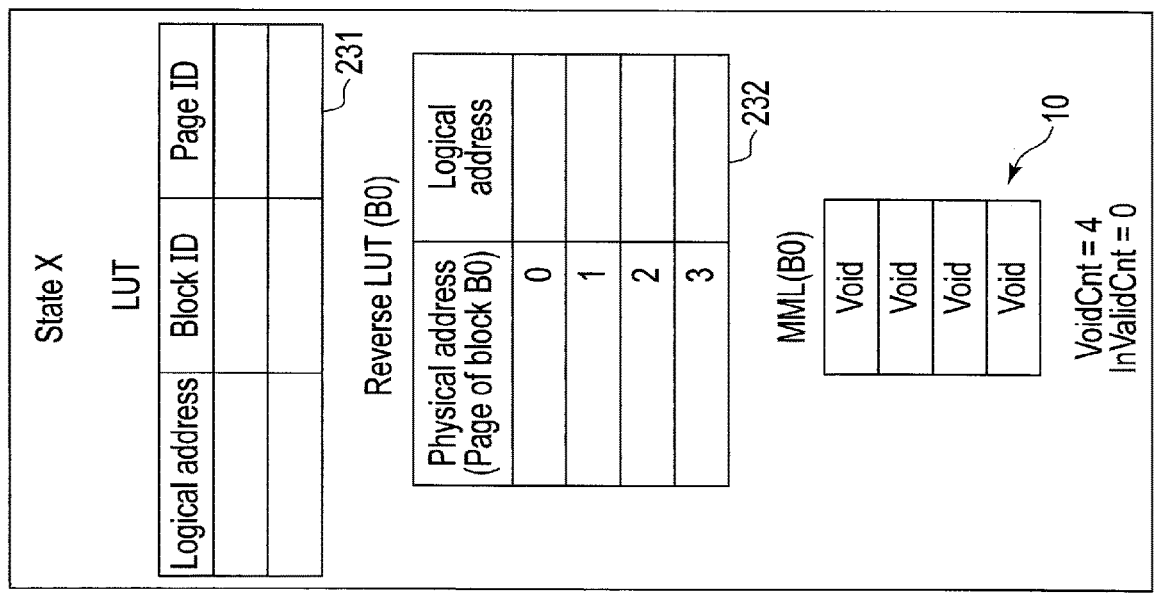
F I G. 22A

FIG. 26A

State A

LUT 231:

| Logical address | Block ID | Page ID |
|---|---|---|
| LCAa | B0 | P2 |
| LCAb | B0 | P1 |
| LCAc | B0 | P0 |

Reverse LUT(B0) 232:

| Physical address (page of block B0) | Logical address |
|---|---|
| 0 | LCAc |
| 1 | LCAb |
| 2 | LCAa |
| 3 |  |

MML(B0):

| | |
|---|---|
| P2 | LCAa_d |
| P1 | LCAb_d |
| P0 | LCAc_d |
|  | Void |

VoidCnt = 1
InValidCnt = 0

State transitioned from state A in accordance with deletion of data of logical address LCAb

LUT 231:

| Logical address | Block ID | Page ID |
|---|---|---|
| LCAa | B0 | P2 |
| LCAc | B0 | P0 |

Reverse LUT(B0) 232:

| Physical address (page of block B0) | Logical address |
|---|---|
| 0 | LCAc |
| 1 | LCAb |
| 2 | LCAa |
| 3 |  |

MML(B0):

| | |
|---|---|
| P2 | LCAa_d |
| P1 | LCAb_d→Invalid |
| P0 | LCAc_d |
|  | Void |

VoidCnt = 1
InValidCnt = 0→1

When deleted page becomes invalid, reverse LUT may not be updated

State B

LUT

| Logical address | Block ID | Page ID |
|---|---|---|
| LCAb | B0 | P1 |

~231

Reverse LUT(B0)

| Physical address (page of block B0) | Logical address |
|---|---|
| 0 | |
| 1 | LCAb |
| 2 | LCAa |
| 3 | |

~232

MML(B0)

| | |
|---|---|
| P2 | Invalid |
| P1 | LCAb_d |
| P0 | Void |
| | Void |

VoidCnt = 2
InValidCnt = 1

F I G. 27A

State transitioned from state B in accordance with deletion of data of logical address LCAb

LUT

| Logical address | Block ID | Page ID |
|---|---|---|

~231

Reverse LUT(B0)

| Physical address (page of block B0) | Logical address |
|---|---|
| 0 | |
| 1 | |
| 2 | |
| 3 | |

When deleted page becomes void, reverse LUT is updated

~232

MML(B0)

| | |
|---|---|
| P2 | Invalid→Void |
| P1 | LCAb_d→Void |
| P0 | Void |
| | Void |

VoidCnt = 4
InValidCnt = 1→0

F I G. 27B

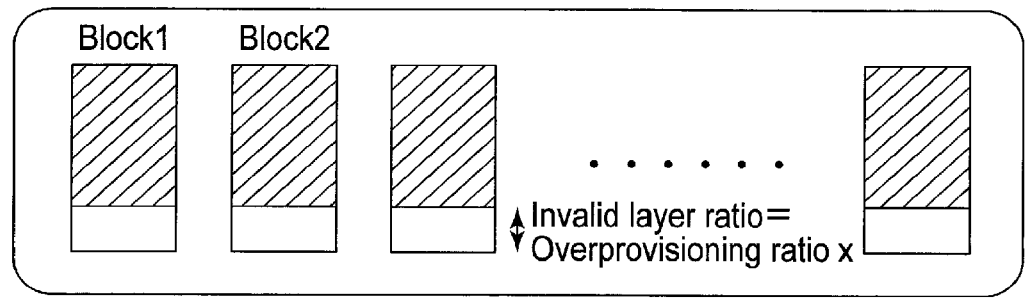
F I G. 30
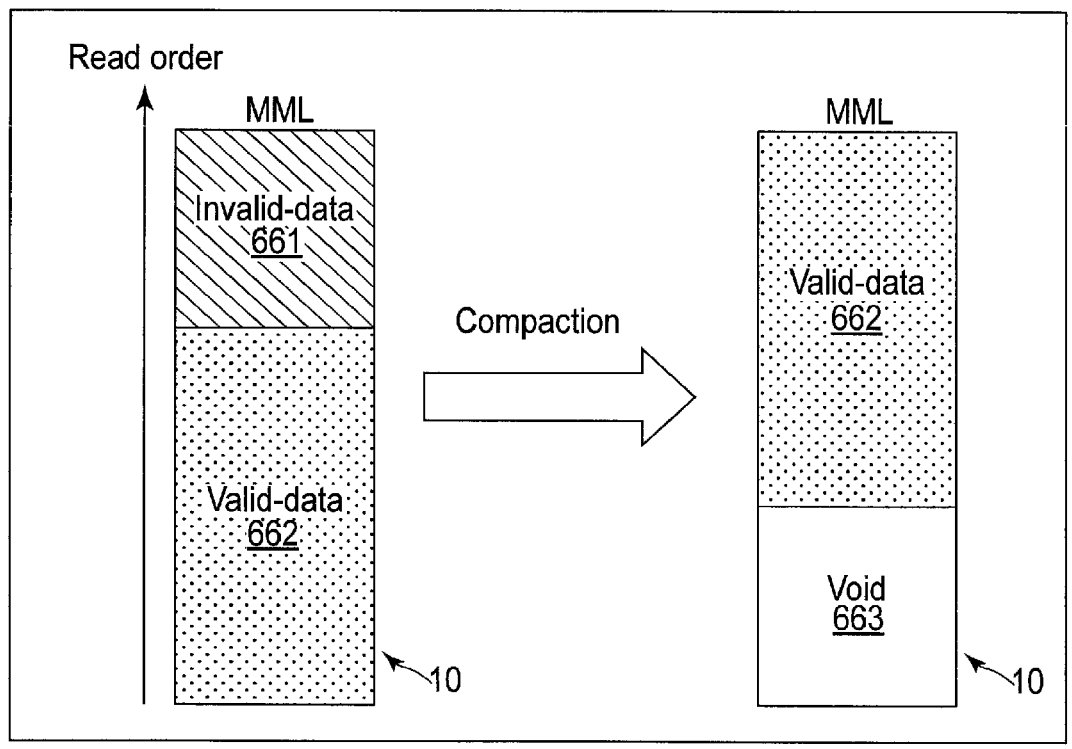
F I G. 31

FIG. 32A

State C

LUT 231

| Logical address | Block ID | Page ID |
|---|---|---|
| LCAa | B0 | P3 |
| LCAb | B0 | P2 |
| LCAc | B0 | P1 |
| LCAd | B0 | P0 |

Reverse LUT (B0) 232

| Physical address (page of block B0) | Logical address |
|---|---|
| 0 | LCAd |
| 1 | LCAc |
| 2 | LCAb |
| 3 | LCAa |

Source block

| | |
|---|---|
| P3 | LCAa_d |
| P2 | LCAb_d |
| P1 | LCAc_d |
| P0 | LCAd_d |

VoidCnt= 0
InValidCnt= 0
Valid layer depth= 4
Write margin= 0(0%)

FIG. 32B

State transitioned from state C in accordance with deletion of data of logical address LCAa

LUT 231

| Logical address | Block ID | Page ID |
|---|---|---|
| LCAb | B0 | P2 |
| LCAc | B0 | P1 |
| LCAd | B0 | P0 |

Reverse LUT (B0) 232

| Physical address (page of block B0) | Logical address |
|---|---|
| 0 | LCAd |
| 1 | LCAc |
| 2 | LCAb |
| 3 | LCAa |

Source block

| | |
|---|---|
| P3 | LCAa_d(Invalid) |
| P2 | LCAb_d |
| P1 | LCAc_d |
| P0 | LCAd_d |

VoidCnt= 0
InValidCnt= 0→1
Valid layer depth= 4
Write margin= 0(0%)

FIG. 32C

State where read operation is performed in accordance with increase of InValidCnt after deletion of data of logical address LCAa

LUT 231

| Logical address | Block ID | Page ID |
|---|---|---|
| LCAb | B0 | P2 |
| LCAc | B0 | P1 |
| LCAd | B0 | P0 |

Reverse LUT (B0) 232

| Physical address (page of block B0) | Logical address |
|---|---|
| 0 | LCAd |
| 1 | LCAc |
| 2 | LCAb |
| 3 | Void |

Source block

| | |
|---|---|
| P2 | LCAb_d |
| P1 | LCAc_d |
| P0 | LCAd_d |

VoidCnt= 1
InValidCnt= 1→0
Valid layer depth= 4→3
Write margin= 0→1(0%→25%)

FIG. 33A

State D

LUT 231

| Logical address | Block ID | Page ID |
|---|---|---|
| LCAa | B0 | P2 |
| LCAc | B0 | P0 |

Reverse LUT (B0) 232

| Physical address (page of block B0) | Logical address |
|---|---|
| 0 | LCAc |
| 1 | LCAb |
| 2 | LCAa |
| 3 | |

Source block

| | |
|---|---|
| P2 | LCAa_d |
| P1 | LCAb_d (Invalid) |
| P0 | LCAc_d |
| | Void |

VoidCnt= 1
InValidCnt= 1
Valid layer depth= 3
Write margin= 1(25%)

FIG. 33B

State transitioned from state D in accordance with deletion of data of logical address LCAa

LUT 231

| Logical address | Block ID | Page ID |
|---|---|---|
| LCAc | B0 | P0 |

Reverse LUT (B0) 232

| Physical address (page of block B0) | Logical address |
|---|---|
| 0 | LCAc |
| 1 | LCAb |
| 2 | LCAa |
| 3 | |

Source block

| | |
|---|---|
| P2 | LCAa_d (Invalid) |
| P1 | LCAb_d (Invalid) |
| P0 | LCAc_d |
| | Void |

VoidCnt= 1
InValidCnt= 1→2
Valid layer depth= 3
Write margin= 1(25%)

FIG. 33C

State where read operation is performed in accordance with increase of InValidCnt after deletion of data of logical address LCAa

LUT 231

| Logical address | Block ID | Page ID |
|---|---|---|
| LCAc | B0 | P0 |

Reverse LUT (B0) 232

| Physical address (page of block B0) | Logical address |
|---|---|
| 0 | LCAc |
| 1 | LCAb |
| 2 | |
| 3 | |

Source block

| | |
|---|---|
| P1 | LCAb_d (Invalid) |
| P0 | LCAc_d |
| | Void |
| | Void |

VoidCnt= 2
InValidCnt= 2→1
Valid layer depth= 3→2
Write margin= 1→2(25%→50%)

FIG. 33D

State where invalid page as top page is read after read operation is performed in accordance with increase of InValidCnt

LUT 231

| Logical address | Block ID | Page ID |
|---|---|---|
| LCAc | B0 | P0 |

Reverse LUT (B0) 232

| Physical address (page of block B0) | Logical address |
|---|---|
| 0 | LCAc |
| 1 | |
| 2 | |
| 3 | |

Source block

| | |
|---|---|
| P0 | LCAc_d |
| | Void |
| | Void |
| | Void |

VoidCnt= 3
InValidCnt= 1→0
Valid layer depth= 2→3(50%→75%)
Write margin= 2→3(50%→75%)

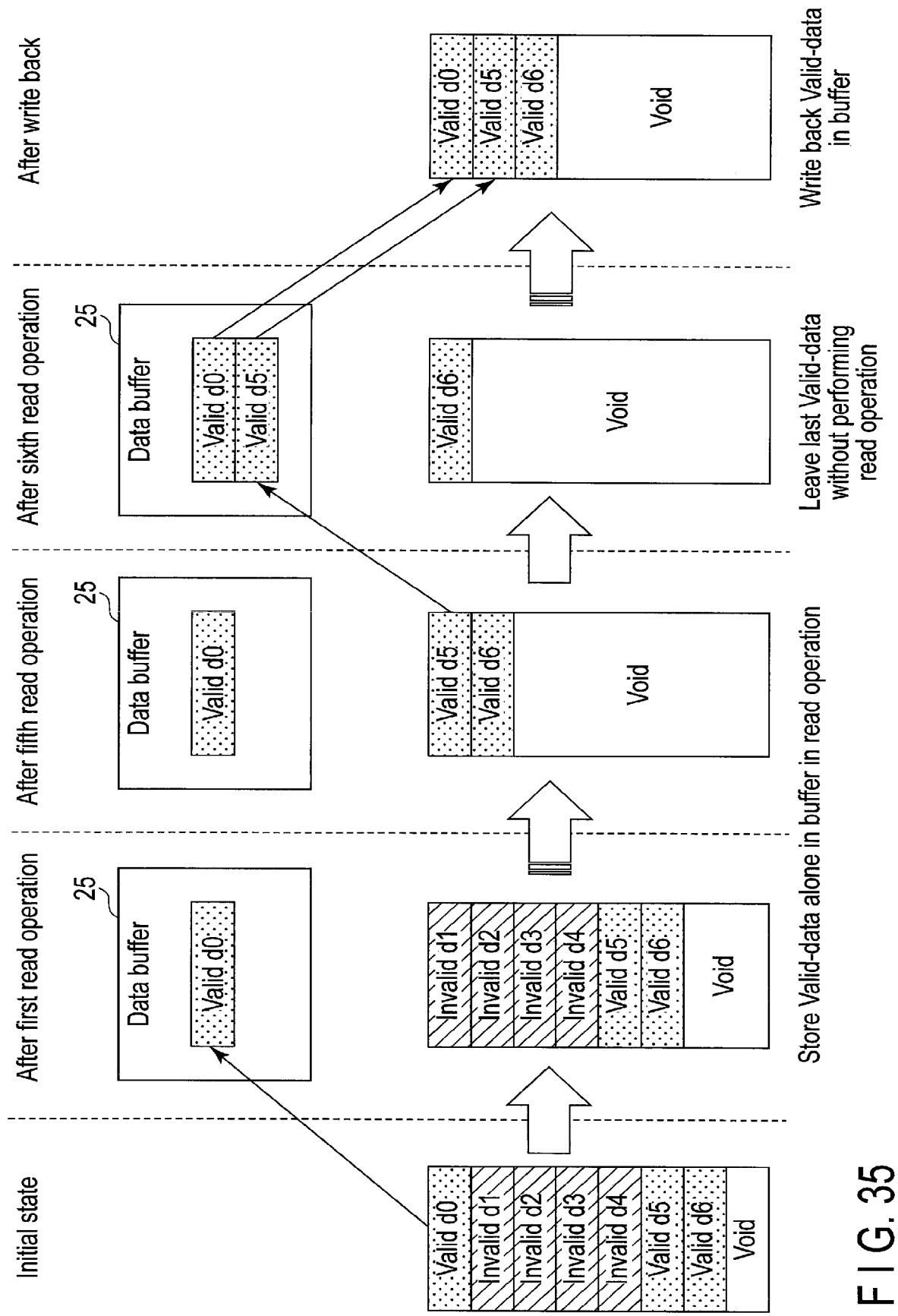
F I G. 35

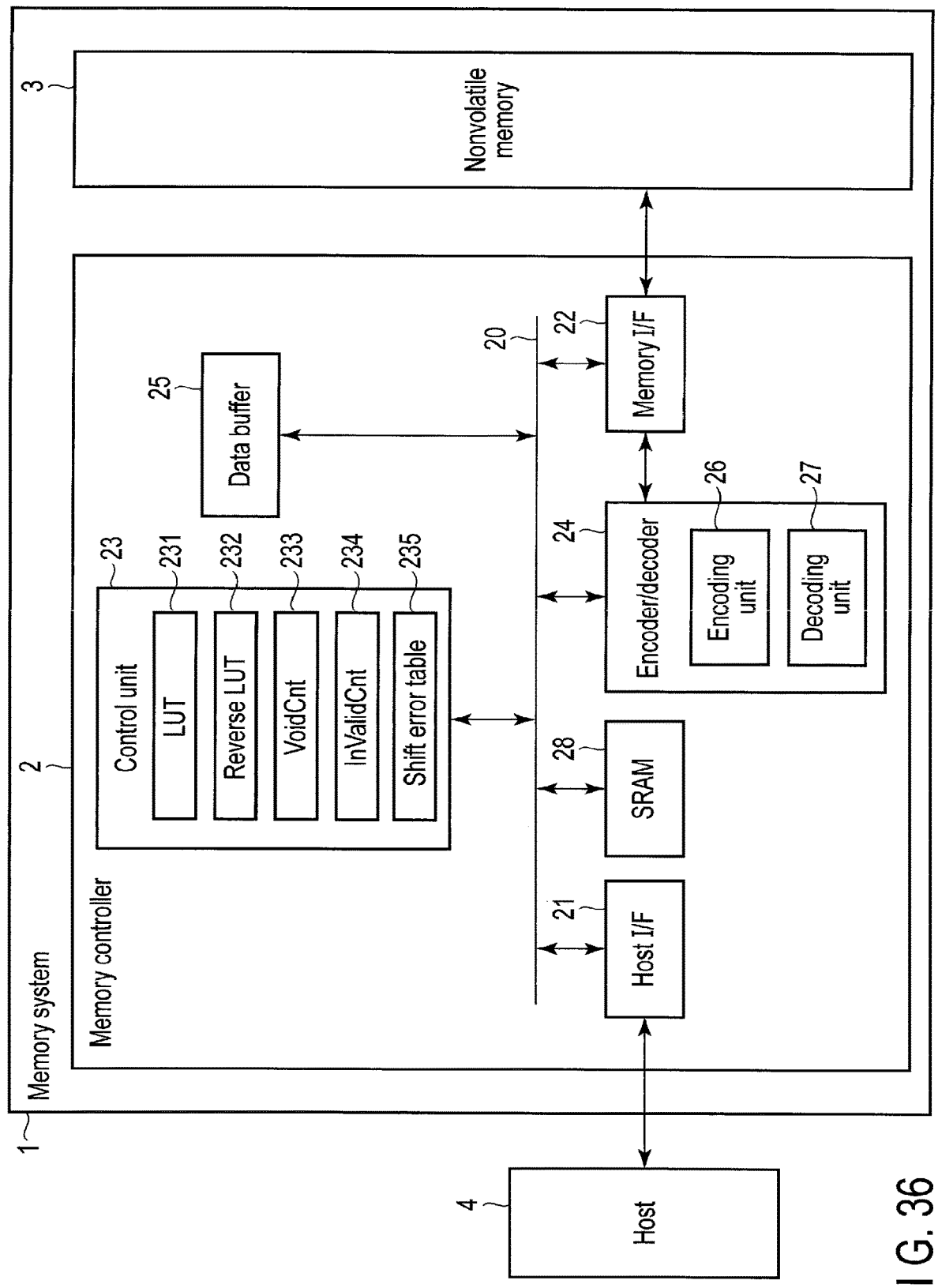
F I G. 36

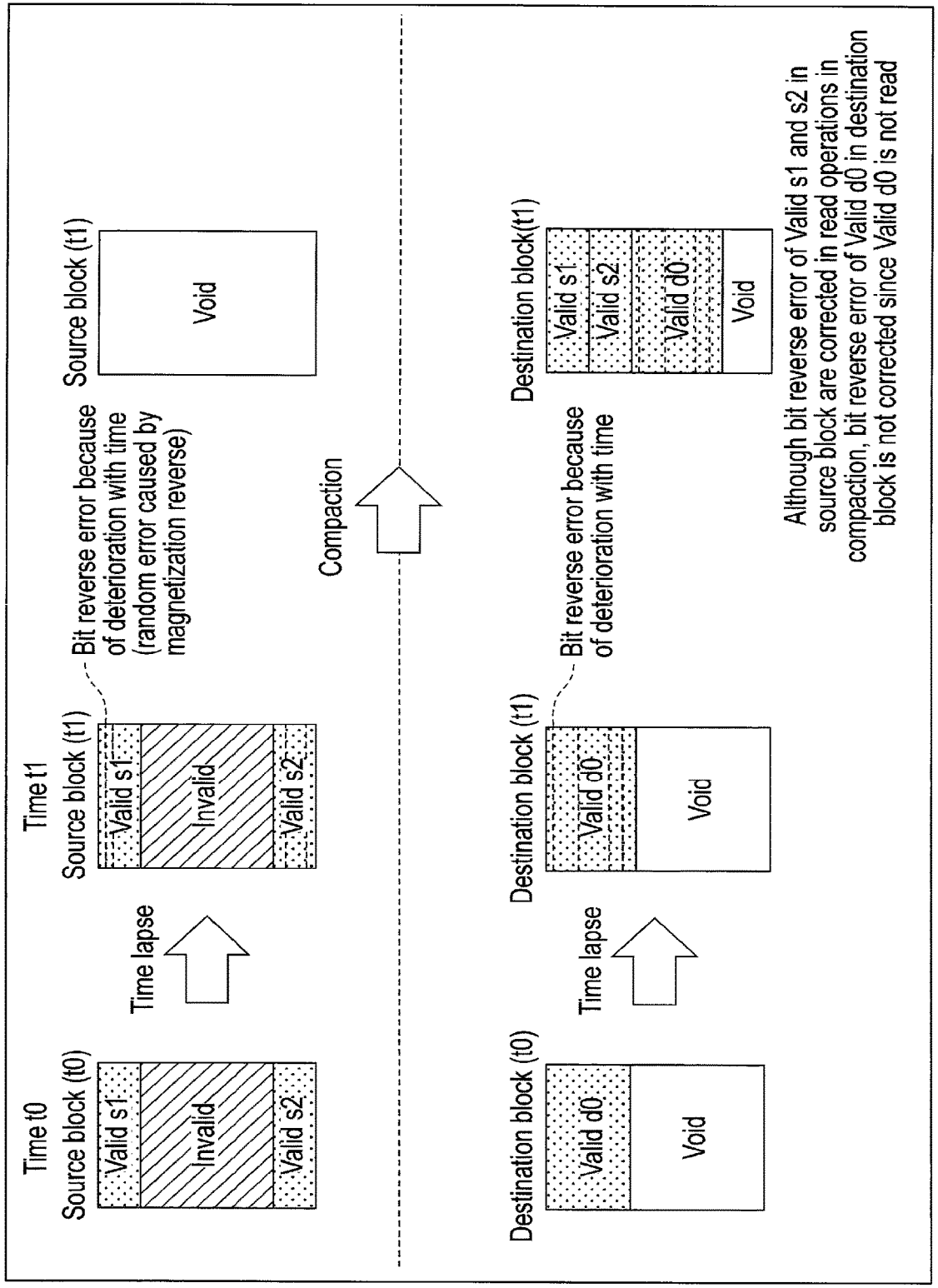
F I G. 37

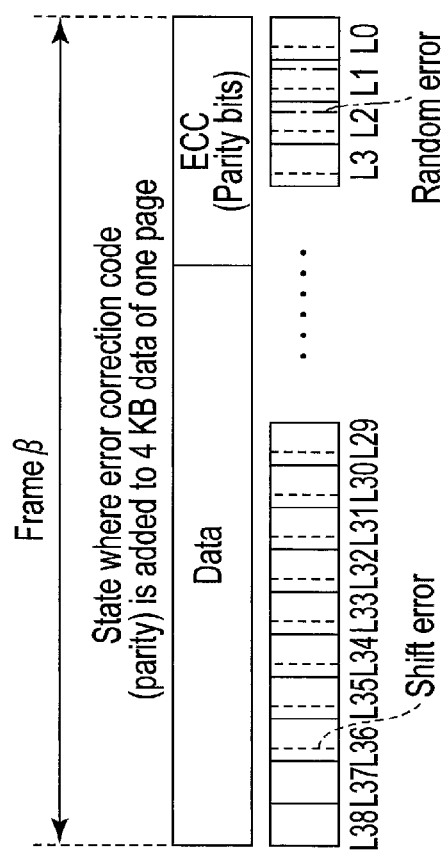
F I G. 41A
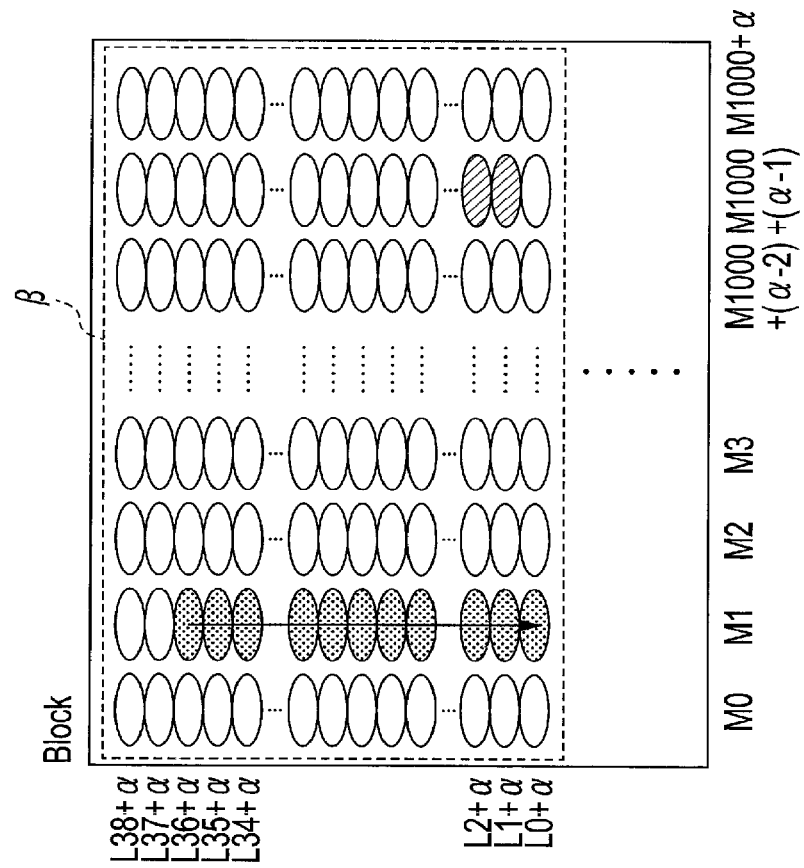
F I G. 41B

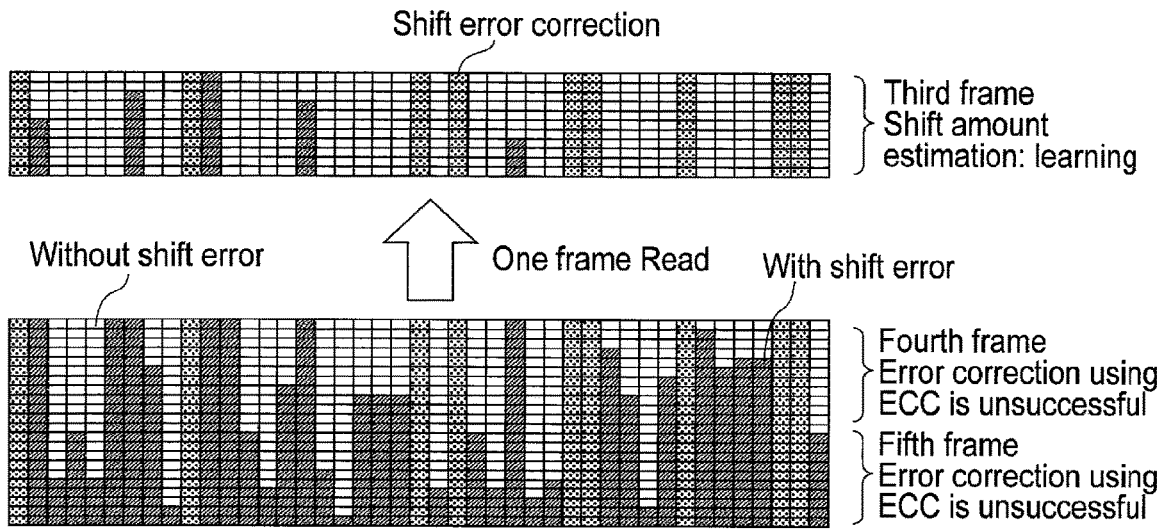
F I G. 47
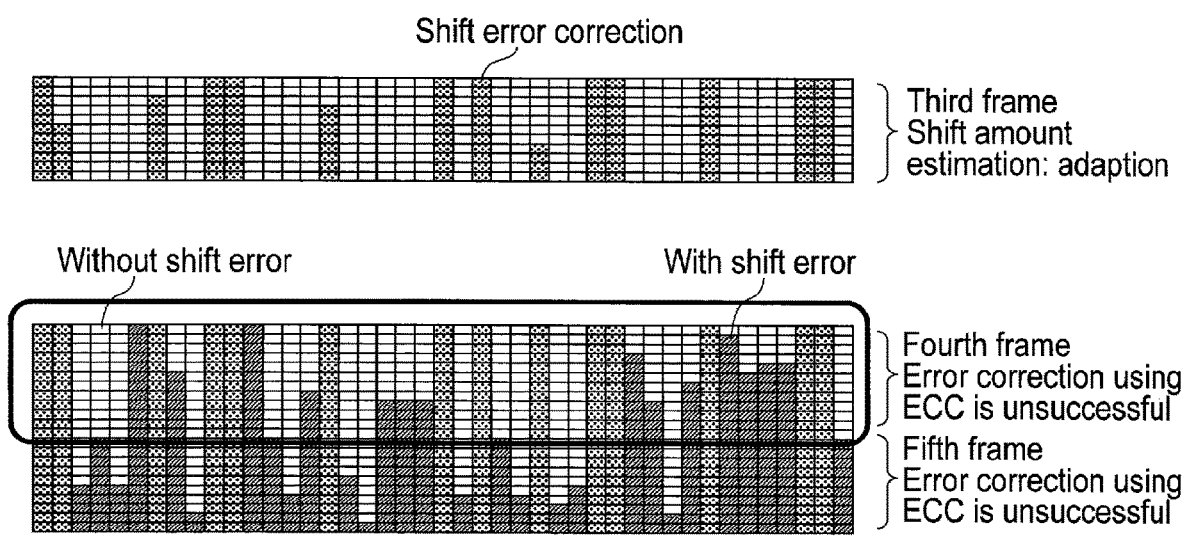
F I G. 48

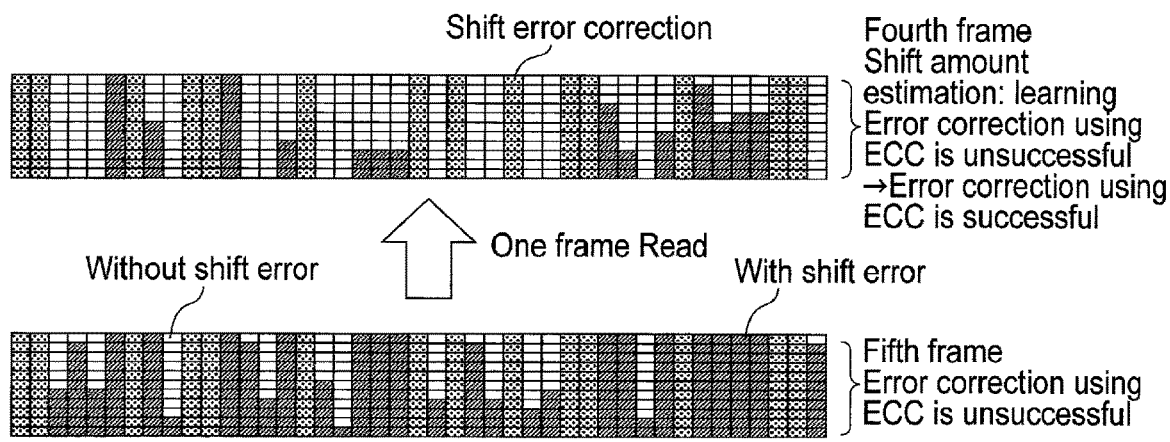
F I G. 49
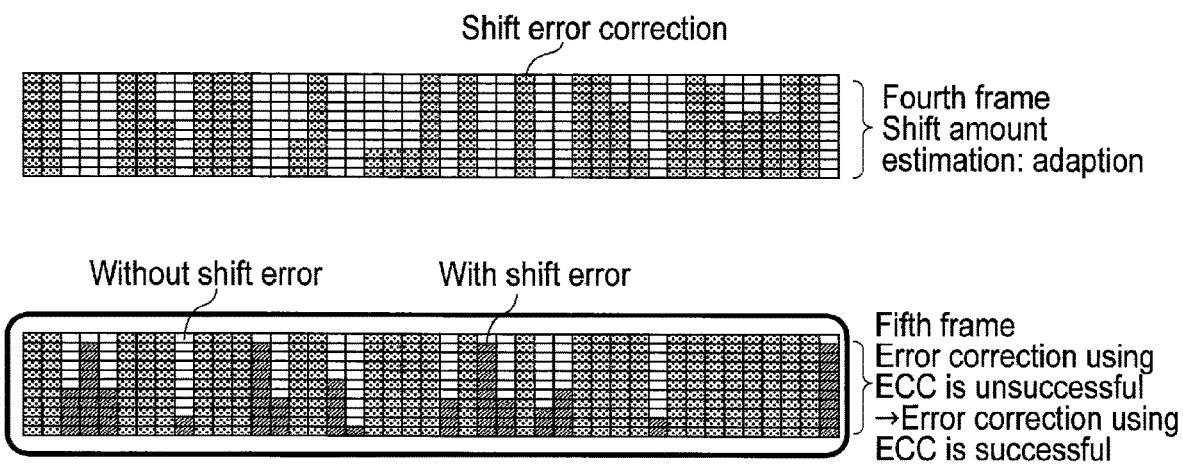
F I G. 50

Shift error table

| ID | MML position | Shift amount |
|---|---|---|
| 1 | M1 | +1 |
| 2 | M3 | -2 |
| ... | ... | ... |

| Magnetic domain | Expected value | | Read result when shift error occurs | | |
|---|---|---|---|---|---|
| | Memory value on MML | Data | Memory value on MML | Data | Error determination |
| 0 | N | 1 | N | 1 | |
| 1 | S | 0 | S | 0 | |
| 2 | S | 1 | S | 0 | Error |
| 3 | N | 1 | S | 1 | |
| 4 | S | 1 | N | 1 | |
| 5 | N | 0 | S | 1 | Error |
| 6 | N | 0 | N | 0 | |
| 7 | N | 1 | N | 0 | Error |
| 8 | S | 0 | N | 1 | Error |
| 9 | S | 1 | S | 0 | Error |
| 10 | N | 1 | S | 1 | |
| 11 | S | 1 | N | 1 | |
| 12 | N | | S | | |

FIG. 56

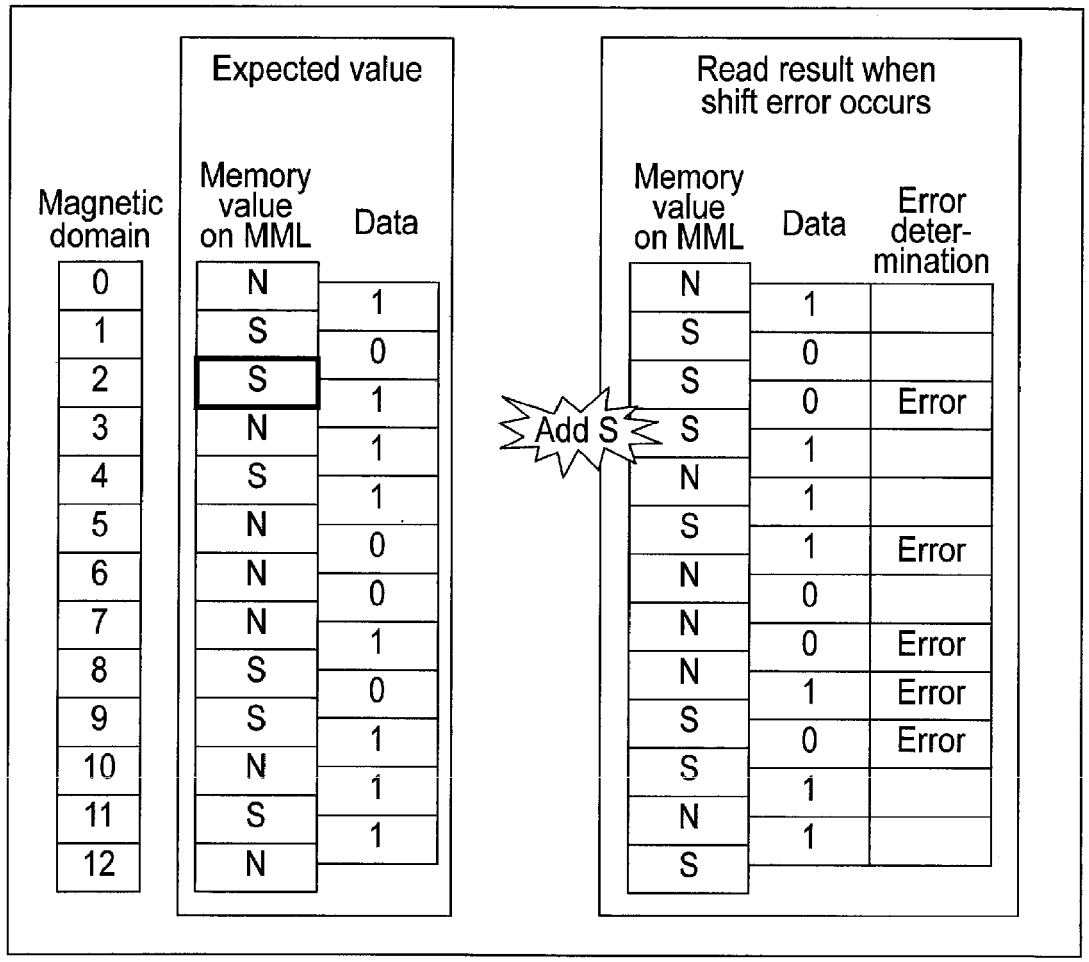
F I G. 57
| Read result | 1 | 0 | 0 | 1 | 1 | 1 | 0 | 0 | 1 | 0 | 1 | 1 |
|---|---|---|---|---|---|---|---|---|---|---|---|---|
| Error determination | | | E | | | E | | E | E | E | | |
| Error correction result | 1 | 0 | 1 | 1 | 1 | 0 | 0 | 1 | 0 | 1 | 1 | 1 |
F I G. 58

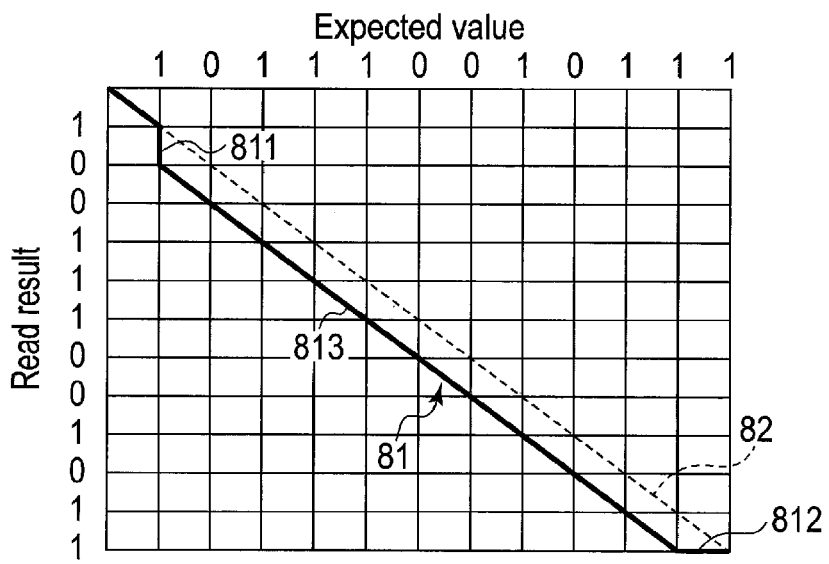
F I G. 59
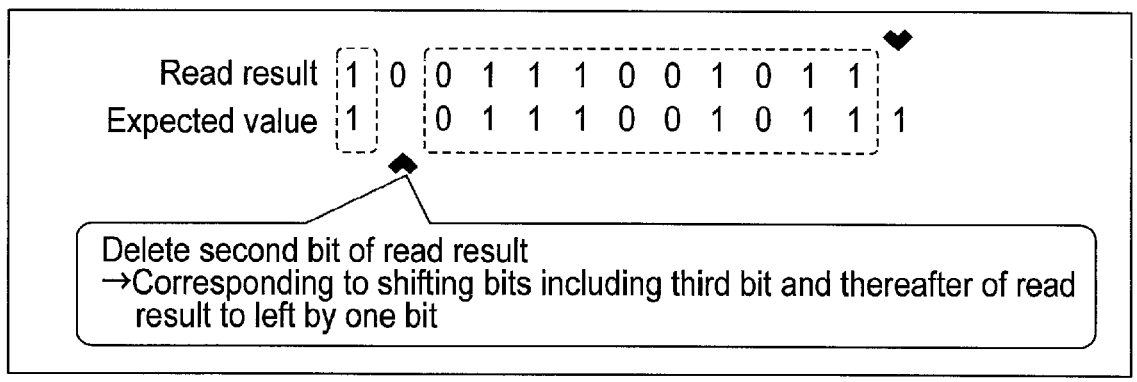
Delete second bit of read result
→Corresponding to shifting bits including third bit and thereafter of read result to left by one bit
F I G. 60
| Read result after shift | 1 | 0 | 1 | 1 | 1 | 0 | 0 | 1 | 0 | 1 | 1 | X |
| --- | --- | --- | --- | --- | --- | --- | --- | --- | --- | --- | --- | --- |
| Error determination | | | | | | | | | | | | E |
| Error correction result | 1 | 0 | 1 | 1 | 1 | 0 | 0 | 1 | 0 | 1 | 1 | 1 |
When bits including third bit and thereafter of read result are shifted to left by one bit, errors of said bits are decreased to one bit
F I G. 61

| Read result | 1 | 0 | 0 | 1 | 0 | 0 | 1 | 0 | 1 | 1 | 1 | 1 |
|---|---|---|---|---|---|---|---|---|---|---|---|---|
| Error determination | | | E | | E | | E | E | E | | | |
| Error correction result | 1 | 0 | 1 | 1 | 1 | 0 | 0 | 1 | 0 | 1 | 1 | 1 |

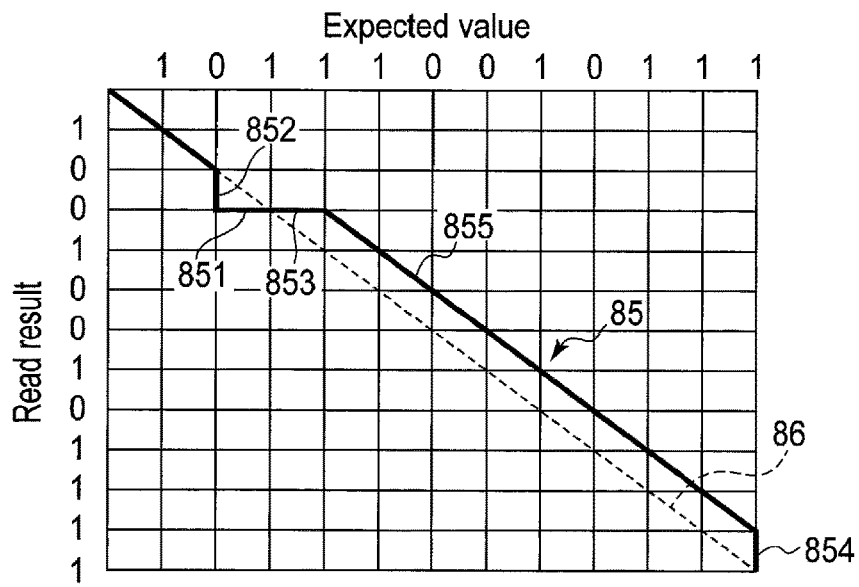

F I G. 64

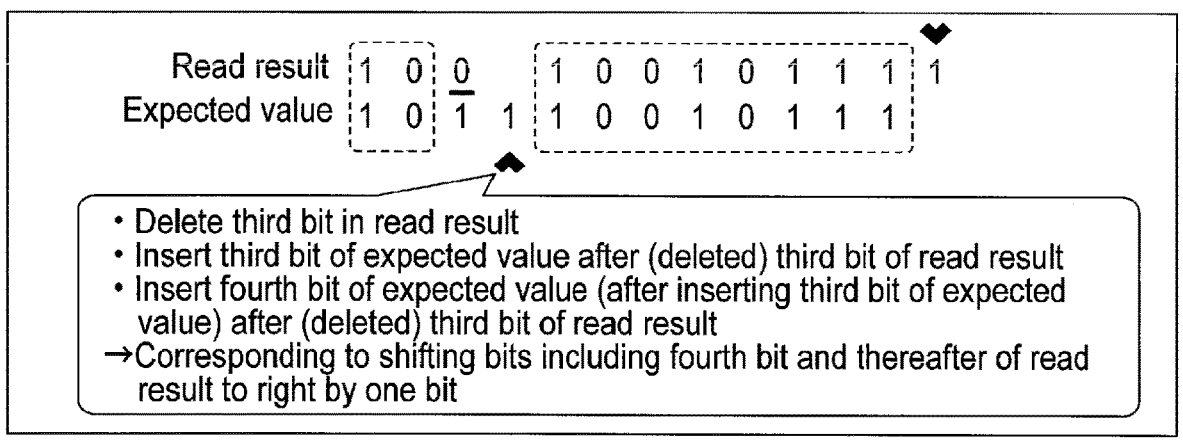

- Delete third bit in read result
- Insert third bit of expected value after (deleted) third bit of read result
- Insert fourth bit of expected value (after inserting third bit of expected value) after (deleted) third bit of read result
→Corresponding to shifting bits including fourth bit and thereafter of read result to right by one bit

F I G. 65

| Read result after shift | 1 | 0 | 0 | 1 | 0 | 0 | 1 | 0 | 1 | 1 | 1 |
|---|---|---|---|---|---|---|---|---|---|---|---|
| Error determination |  |  | E | E |  |  |  |  |  |  |  |
| Error correction result | 1 | 0 | 1 | 1 | 1 | 0 | 0 | 1 | 0 | 1 | 1 | 1 |

When bits including fourth bit and thereafter of read result are shifted to right by one bit, errors of said bits are decreased to one bit

F I G. 66

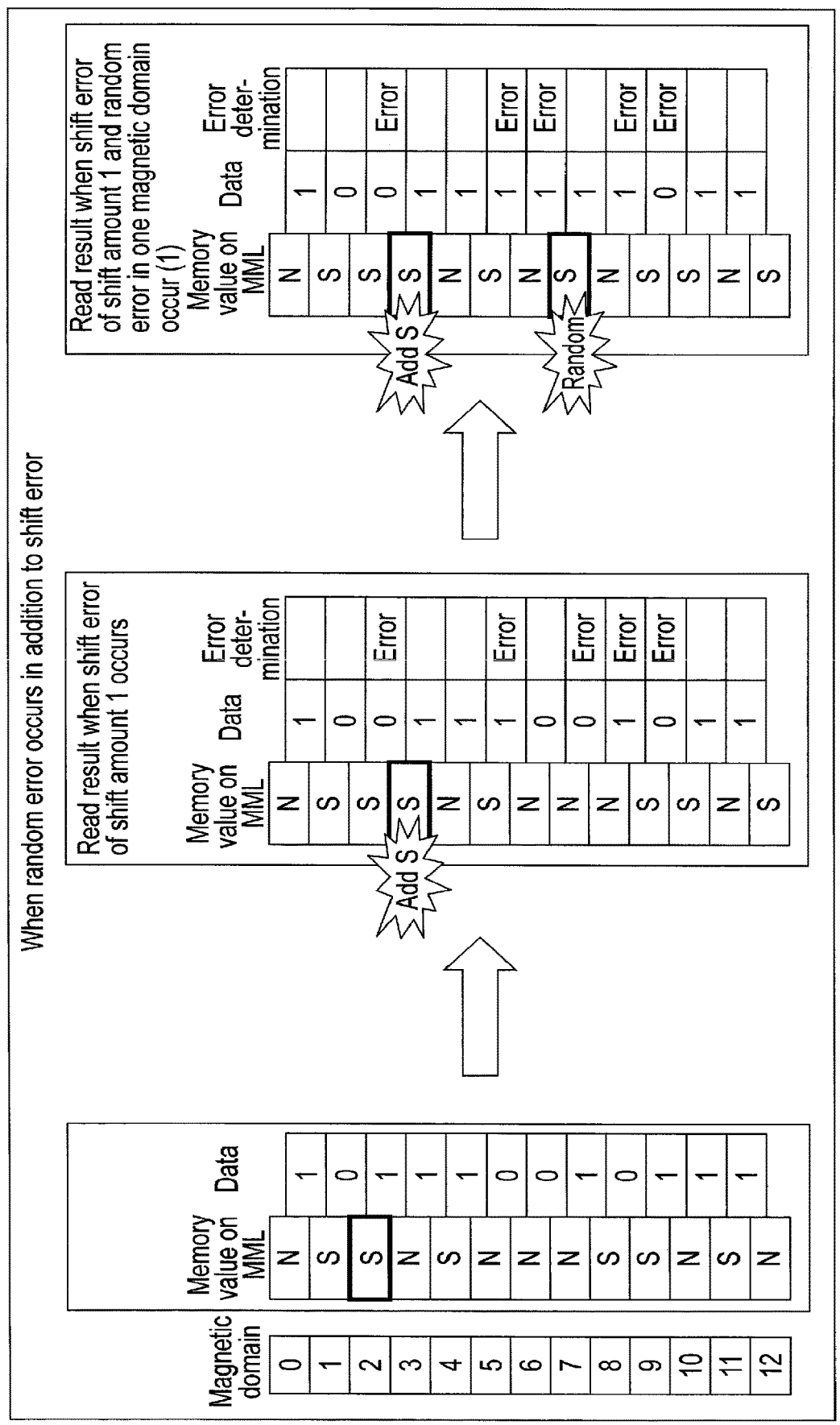
F I G. 68

MEMORY SYSTEM

CROSS-REFERENCE TO RELATED APPLICATIONS

This application is based upon and claims the benefit of priority from Japanese Patent Application No. 2019-044961, filed Mar. 12, 2019, the entire contents of which are incorporated herein by reference.

FIELD

Embodiments described herein relate generally to a memory system including a nonvolatile memory.

BACKGROUND

In recent years, memory systems including a nonvolatile memory are widely used. As a type of the memory systems, a solid state drive (SSD) including a NAND flash memory is known. Various computing devices use SSD as the main storage.

Recently, non-volatile memories of the type in which write and read of data are carried out by the last-in first-out (LIFO) method are being developed as next-generation nonvolatile memories.

BRIEF DESCRIPTION OF THE DRAWINGS

FIG. 3 is a diagram illustrating an exemplary circuit configuration corresponding to one of magnetic memory lines (MMLs) included in each block in the cell array.

FIG. 4 is a diagram illustrating a movement of memory states (a movement of magnetic domain walls) in the MML.

FIG. 11 is a perspective view illustrating an example of the exterior of the cell array.

FIG. 16 is a diagram illustrating block shortage in the memory system of the comparative example.

FIG. 17 is a flowchart illustrating an example of the procedure of a compaction process performed by the memory system of the comparative example.

FIG. 20A is a diagram illustrating an example where the memory system of the first embodiment is assumed to perform compaction based on a valid layer ratio.

FIG. 20B is a diagram illustrating another example where the memory system of the first embodiment is assumed to perform compaction based on a valid layer ratio.

FIG. 21 is a diagram illustrating a difference in compaction between a NAND/NOR flash memory and the nonvolatile memory of FIG. 2.

FIG. 22A is a diagram illustrating an example of VoidCnt to manage write margin of an MML and InValidCnt to manage an invalid layer ratio of the MML.

FIG. 22B is a diagram illustrating an example of VoidCnt and InValidCnt when data of one page is written into the MML.

FIG. 26A is a diagram illustrating an example of VoidCnt and InvalidCnt.

FIG. 26B is a diagram illustrating an example of VoidCnt and InvalidCnt when data of one page is deleted.

FIG. 27A is a diagram illustrating another example of VoidCnt and InvalidCnt.

FIG. 27B is a diagram illustrating another example of VoidCnt and InvalidCnt when data of one page is deleted.

FIG. 30 is a diagram indicating that when the nonvolatile memory of FIG. 2 has an overprovisioning ratio, each block has a free area that is equal to or larger than an area based on the specific overprovisioning ratio.

FIG. 31 is a diagram illustrating an example of self-compaction using only read operations.

FIG. 32A is a diagram illustrating an example of VoidCnt and InvalidCnt.

FIG. 32B is a diagram illustrating an example of VoidCnt and InvalidCnt when data of one page is deleted.

FIG. 32C is a diagram illustrating an example of VoidCnt and InvalidCnt when self-compaction using only read operations is performed.

FIG. 33A is a diagram illustrating another example of VoidCnt and InvalidCnt.

FIG. 33B is a diagram illustrating another example of VoidCnt and InvalidCnt when data of one page is deleted.

FIG. 33C is a diagram illustrating another example of VoidCnt and InvalidCnt when self-compaction using only read operations is performed.

FIG. 33D is a diagram illustrating still another example of VoidCnt and InvalidCnt when self-compaction using only read operations is performed.

FIG. 35 is a diagram of an example of self-compaction where a source block and a destination block are the same.

FIG. 36 is a block diagram illustrating a configuration example of a memory system according to a second embodiment.

FIG. 37 is a diagram illustrating an example of compaction performed in the memory system of the second embodiment in which each of a source block and a destination block has an error caused by deterioration with time.

FIG. 41A is a diagram illustrating an example where a shift error and a random error occur in a frame that includes a data portion and an error correction code (parity).

FIG. 41B is a diagram illustrating an example of a block into which the frame is written.

FIG. 47 is a diagram illustrating an example where a shift amount is learnt in a third frame.

FIG. 48 is a diagram illustrating an example where the third frame is adapted to the learnt shift amounts.

FIG. 49 is a diagram illustrating an example where a shift amount is learnt in a fourth frame.

FIG. 50 is a diagram illustrating an example where error corrections of fourth and fifth frames are successful by adapting the fourth and fifth frames to the learnt shift amounts.

FIG. 55 is a diagram illustrating an example of a random error.

FIG. 56 is a diagram illustrating an example of a shift error.

FIG. 57 is a diagram illustrating a first example of expected values and a read result when a shift error occurs.

FIG. 58 is a diagram illustrating an example of the read result of FIG. 57 and an error correction result.

FIG. 59 is a diagram illustrating an example of an edit graph indicating a relationship between the expected values and the read result of FIG. 57.

FIG. 60 is a diagram illustrating an example where a shift amount is determined based on the edit graph of FIG. 59.

FIG. 61 is a diagram illustrating an example of a read result shifted by the shift amount of FIG. 60 and an error correction result.

FIG. 64 is a diagram illustrating an example of an edit graph indicating a relationship between the expected values and the read result of FIG. 62.

FIG. 65 is a diagram illustrating an example where a shift amount is calculated based on the edit graph of FIG. 64.

FIG. 66 is a diagram illustrating an example of the read result shifted by the shift amount of FIG. 65 and the error correction result.

FIG. 68 is a diagram illustrating an example of expected values, a read result when a shift error occurs, and a read result when a random error further occurs.

DETAILED DESCRIPTION

Various embodiments will be described hereinafter with reference to the accompanying drawings.

In general, according to one embodiment, a memory system includes a nonvolatile memory and a controller. The nonvolatile memory includes first blocks each including magnetic memory lines and is configured to perform writing and reading of data for each block by a last-in first-out (LIFO) method by shifting, in a unit of a layer, data portions stored in a plurality of layers, respectively, in a first direction from a top layer to a last layer or in a second direction opposite to the first direction, the magnetic memory lines including the plurality of layers. The controller is configured to control the nonvolatile memory. The plurality of layers includes at least one of a layer of a first attribute storing a data portion associated with a logical address and a layer of a second attribute storing a data portion that is not associated with any logical address. At a location adjacent to a layer of the second attribute in the first direction, a layer of the first attribute exists. The controller is configured to select a source block of a compaction process from the first blocks based on a ratio of layers of the second attribute to the plurality of layers in each of the first blocks.

First Embodiment

Figure 1:
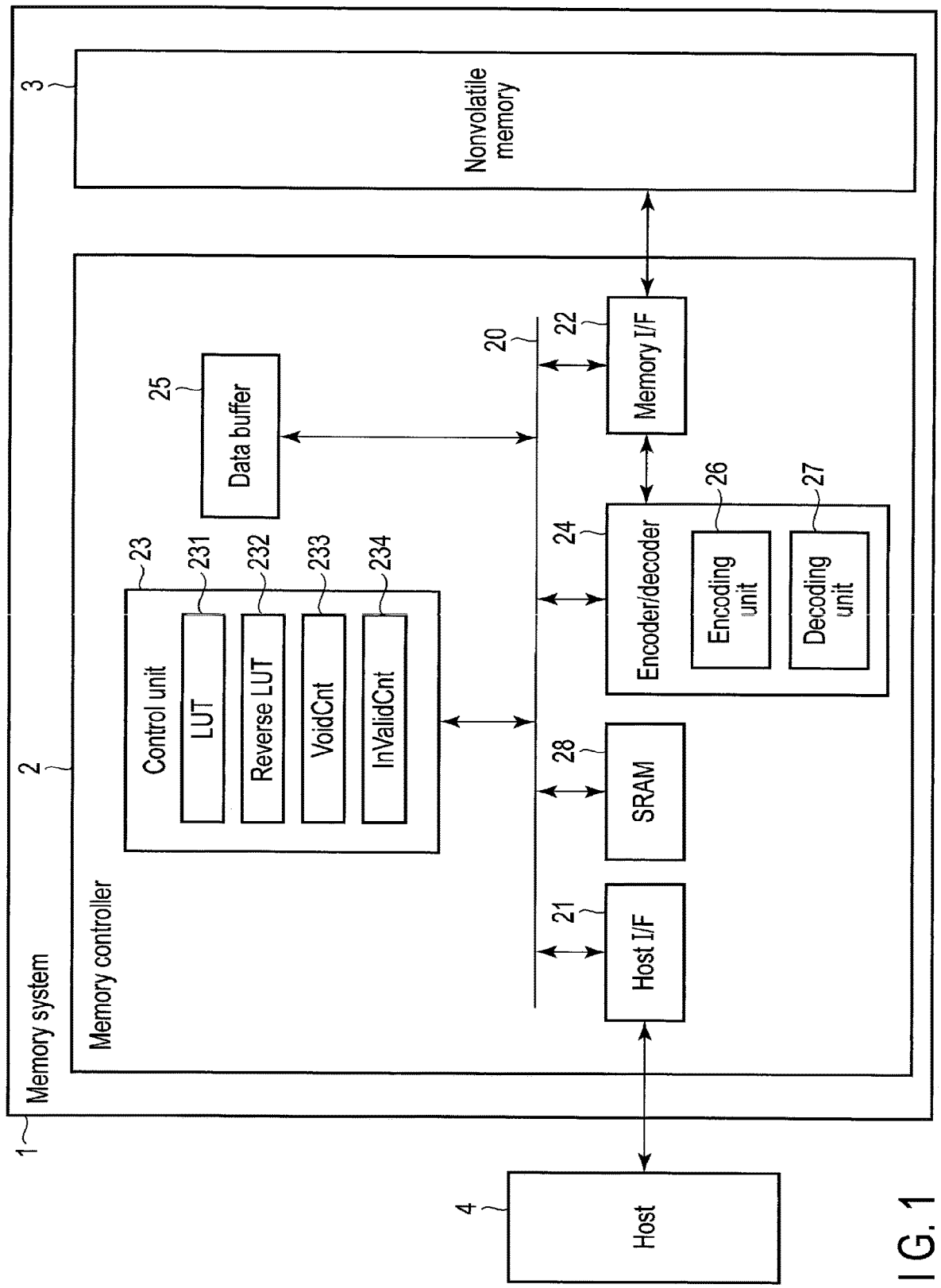
FIG. 1 is a block diagram illustrating a configuration example of a memory system according to a first embodiment.

FIG. 1 illustrates a configuration example of a memory system 1 according to a first embodiment. The memory system 1 includes a controller (memory controller) 2 and a nonvolatile memory 3. The memory system 1 is connectable to a host 4, and FIG. 1 illustrates that the memory system 1 is connected to the host 4. The host 4 is an electronic device such as a personal computer, a server, a portable terminal, or the like.

The nonvolatile memory 3 is a memory that stores data persistently. The nonvolatile memory 3 is configured to perform writing and reading of data in a certain capacity unit referred to as a block in a last-in first-out (LIFO) method (also referred to as a first-in last-out method). That is, the nonvolatile memory 3 includes a plurality of blocks. Each block includes a plurality of layers that function as a plurality of stages of a shift register. In other words, one layer functions as one of stages in the shift register. The nonvolatile memory 3 performs writing and reading of data for each block by the last-in first-out method by shifting data stored in individual layers in a first direction from a layer corresponding to a first stage to a layer corresponding to a last stage or a second direction opposite to the first direction in a unit of a layer.

An example of the type of nonvolatile memory that uses the last-in first-out method to perform writing and reading of data is a magnetic domain wall memory. The magnetic domain wall memory is a type of magnetic memory that performs writing and reading of data while causing a current to flow through a magnetic shift register including magnetic domains to shift (move) each magnetic domain that stores information ("1" or "0").

The memory system 1 may be realized as a solid state drive (SSD), or may be realized as a memory card in which the memory controller 2 and the nonvolatile memory 3 are configured as one package.

The memory controller 2 controls writing of data to the nonvolatile memory 3 according to a write request (a write command) received from the host 4. Further, the memory controller 2 controls reading of data from the nonvolatile memory 3 according to a read request (a read command) received from the host 4.

The memory controller 2 may be implemented as a circuit such as SoC. The memory controller 2 includes a host interface 21, a memory interface 22, a control unit 23, an encoder/decoder 24, a data buffer 25, and a static random access memory (SRAM) 28. The host interface 21, the memory interface 22, the control unit 23, the encoder/decoder 24, the data buffer 25, and the SRAM 28 are connected to an internal bus 20.

The host interface 21 performs processing according to an interface standard between a host and a device, and outputs a request, user data, and the like received from the host 4, to the internal bus 20. Further, the host interface 21 transmits user data read from the nonvolatile memory 3, a response received from the control unit 23, and the like to the host 4. In the present embodiment, data written to the nonvolatile memory 3 in accordance with a write request from the host 4 is referred to as user data.

The memory interface 22 performs a write operation for writing data to the nonvolatile memory 3 based on an instruction from the control unit 23. Further, based on an instruction from the control unit 23, the memory interface 22 performs a read operation for reading data from the nonvolatile memory 3.

The control unit 23 totally controls components of the memory system 1. The control unit 23 may be implemented as a CPU (processor).

When receiving a request from the host 4 via the host interface 21, the control unit 23 performs control according to the request. For example, the control unit 23 instructs the memory interface 22 to write user data and parity into the nonvolatile memory 3 according to a write request received from the host 4. Further, in accordance with a read request received from the host 4, the control unit 23 instructs the memory interface 22 to read user data and parity from the nonvolatile memory 3. Here, the parity means an error correction code (ECC) obtained by encoding user data. The write request designates a logical address, a length of write data to be written, and the like. The logical address designated by the write request indicates a logical address to which the write data is to be written. The read request designates a logical address, a length of data to be read, and the like. The logical address designated by the read request indicates a logical address corresponding to the data to be read.

Further, when receiving a write request from the host 4, the control unit 23 determines a storage area (memory area) in the nonvolatile memory 3 to which user data stored in the data buffer 25 is to be written. That is, the control unit 23 manages a writing destination of user data. The control unit 23 manages mapping between a logical address designated by a write request received from the host 4 and a physical address indicating a storage area in the nonvolatile memory 3 into which user data corresponding to the logical address is written by using a lookup table (LUT) 231 functioning as an address translation table. The LUT 231 may be stored in a RAM (dynamic RAM (DRAM) or the SRAM 28) in the memory system 1, or may be stored persistently in the nonvolatile memory 3. In the latter case, when the memory system 1 is powered on, the LUT 231 may be loaded from the nonvolatile memory 3 into the RAM in the memory system 1.

Further, when receiving a read request from the host 4, the control unit 23 translates a logical address designated by the read request into a physical address using the LUT 231, and instructs the memory interface 22 to read data from this physical address.

The control unit 23 may further manage various data for controlling the nonvolatile memory 3 such as a reverse LUT 232 to convert a physical address to a logical address, VoidCnt 233 to manage a write margin of the nonvolatile memory 3, and InValidCnt 234 to manage an invalid layer ratio of the nonvolatile memory 3. The reverse LUT 232, VoidCnt 233, and InValidCnt 234 are managed per block, for example. Furthermore, such data may be stored in RAM such as the SRAM 28.

Each of the blocks included in the nonvolatile memory 3 includes a plurality of layers as described above. These layers are logically divided into a plurality of pages. Each page includes a set of several adjacent layers. The size of one page is predefined by the size of an ECC frame (hereinafter, also referred to as a frame) including user data and an ECC. Therefore, in the nonvolatile memory 3, writing and reading are generally performed in a unit of data that is referred to as a page (or an ECC frame).

The data buffer 25 temporarily stores user data received from the host 4. The data buffer 25 temporarily stores user data read from the nonvolatile memory 3. Further, the data buffer 25 temporarily stores a code word (including user data and an ECC) generated by encoding the user data. For example, a part of the aforementioned RAM (SRAM or DRAM) is used as the data buffer 25.

User data transmitted from the host 4 is transferred to the internal bus 20 and stored in the data buffer 25. The encoder/decoder 24 encodes data to be written in the nonvolatile memory 3 to generate a code word. Any coding method may be used for this encoding. For example, Reed Solomon (RS) coding, Bose Chaudhuri Hocquenghem (BCH) coding, and low density parity check (LDPC) coding may be used. The encoder/decoder 24 includes an encoding unit 26 and a decoding unit 27. Details of encoding and decoding according to the present embodiment will be described later.

For simplicity of explanation, in the present embodiment, it is assumed that the nonvolatile memory 3 includes one nonvolatile memory chip. However, the present embodiment is applicable to a configuration in which the nonvolatile memory 3 includes multiple nonvolatile memory chips.

Figure 2:
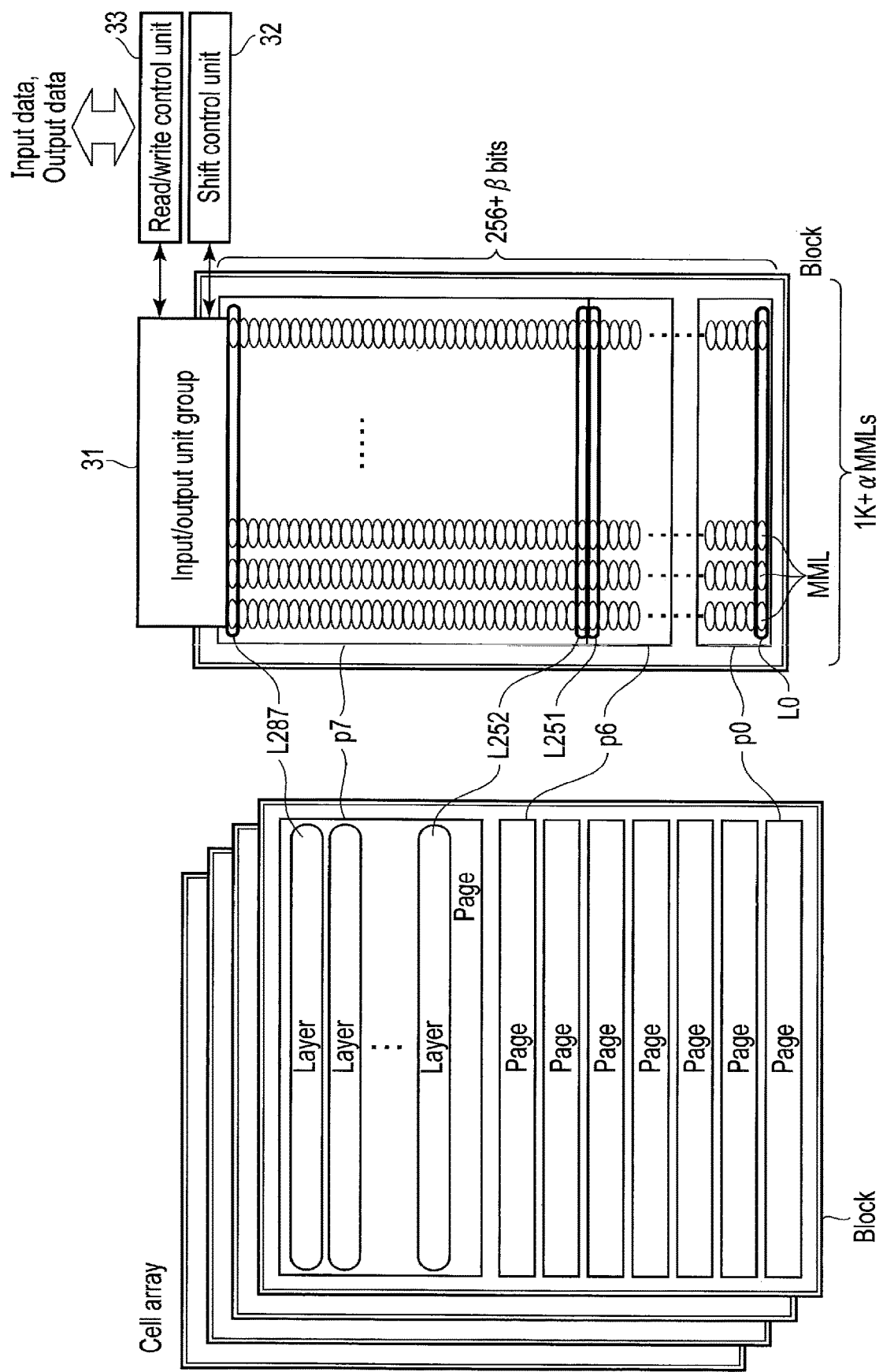
FIG. 2 is a diagram illustrating a configuration example of a cell array in a nonvolatile memory included in the memory system of the first embodiment.

FIG. 2 illustrates a configuration example of a cell array in the nonvolatile memory 3. In the following description, for ease of understanding, a configuration example of a cell array will be described using specific numerical values. However, these numerical values are merely examples, the present embodiment is not limited to these specific numerical values, and any numerical value can be applied to the configuration of the cell array of the present embodiment.

The cell array includes a plurality of blocks. Each of the plurality of blocks is a unit of writing and reading of data by the last-in first-out method.

Here, it is assumed that each block includes a total of 288 layers of layers L0 to L287. These 288 layers function as a plurality of stages of the above-described shift register. The layer L287 corresponds to a first stage of the shift register and the layer L0 corresponds to a last stage of the shift register.

The layers L0 to L287 in each block may be obtained by a plurality of magnetic memory lines (MMLs) in each block. In each of the plurality of MMLs, writing and reading of data is performed in a unit of data of 1-bit width by the last-in first-out method. An MML is a magnetic material that is referred to as a magnetic memory line, a magnetic material pillar, a magnetic wire, a magnetic narrow wire, a string, or the like.

Here, it is assumed that each block includes 1K+α MMLs. Each MML in the magnetic domain wall memory is a magnetic shift register, and is implemented, for example, by a magnetic material extending in one direction. Each MML in the magnetic domain wall memory may be referred to as a magnetic narrow wire. Each MML may include a plurality of magnetic domains that correspond to a plurality of stages from a first stage to a last stage, respectively. A direction of magnetization of each magnetic domain is used as information indicative of "1" or "0".

Each MML is accessed by the last-in first-out method in which a stored position of data previously written (programmed) is moved to a back side when a next data is written, and the data on the back side cannot be read before the data that is programmed later is read.

In the present embodiment, it is assumed that one MML can store 256+β bits. This corresponds to a configuration in which each MML in the magnetic domain wall memory includes 256+β magnetic domains.

In this case, the size of one block is (1K+α)×(256+β) bit=32 KB+α'. Here, it is conceivable that α, β, α' (α'=α×(256+β)+β×(1K+α)−α×β) is used as an area for storing parity, as well as an area for storing information to be stored in a manner attached to data. In the following description, α, β, and α' are used as parity for the sake of simplicity. Parity is an error correction code (ECC) added to data. The numerical values of α, β, α' described above are given as an example, and in the present embodiment, various other numerical values may be applied.

In the following description, a case where α=0 and β=32 will be described by way of example.

In FIG. 2, a set of ellipses continuing in a vertical direction indicates one MML. A set of 1K+α MMLs constitutes one block. Each block is represented by a double square. The 1K+α MMLs included in a block constitute the 288 (=256+32) layers L0 to L287. Each of the layers L0 to L287 is represented by a rounded square.

One end of each of 1K+α MMLs included in each block is connected to each of 1K+α input and output units. In FIG. 2, a set of the 1K+α input and output units is represented as an input and output unit group 31. Write and read of data for this block are performed via the input and output unit group 31.

The layer L287 closest to the input and output unit group 31 is used as a first stage of the shift register, and the layer L0 farthest from the input and output unit group 31 is used as a last stage of the shift register.

In a write operation, data stored in each layer is shifted in a unit of a layer in a first direction from the layer L287 corresponding to the first stage to the layer L0 corresponding to the last stage (in the direction from the top to the bottom in FIG. 2).

In a read operation, data stored in each layer is shifted in a unit of a layer in a second direction opposite to the first direction (in a direction from the bottom to the top in FIG. 2).

The layers L0 to L287 are divided into eight layer groups each including 36 (=288/8) adjacent layers. These layer groups are referred to as pages. In other words, the layers L0 to L287 are logically divided into eight pages p0 to p7. One page includes 36 adjacent layers (=288/8). Each of the pages p0 to p7 is represented by a square. One block is constituted by eight pages p0 to p7.

The capacity of each of the pages p0 to p7 is predefined so that a data portion having a predetermined size can be stored. For example, one page may be defined to have the capacity capable of storing an ECC frame including a data portion having the predetermined size and an error correction code (ECC) corresponding to this data portion. The size of a data portion included in one ECC frame may be, for example, 4 KB. In this case, one ECC frame includes 4 KB of user data and an ECC. One block can store eight data portions (eight ECC frames) corresponding to the eight pages p0 to p7, respectively.

Hereinafter, the page p7 closest to the input and output unit group 31 is also referred to as a "first page", and the page p0 farthest from the input and output unit group 31 is also referred to as a "last page".

The input and output unit group 31 is connected to a shift control unit 32 and a read and write control unit 33. The shift control unit 32 shifts data of each layer in a block in the direction from the layer L287 to the layer L0 or in the direction from the layer L0 to the layer L287 in a unit of a layer.

In the magnetic domain wall memory, the shift control unit 32 supplies a current pulse to each MML in a block to shift (move) each magnetic domain wall in each MML. In each MML, each magnetic domain is shifted (moved) in a unit of a layer (that is, in a unit of one bit) by movement of magnetic domain walls.

The read and write control unit 33 controls writing of data into the block and reading of data from the block via the input and output unit group 31.

FIG. 3 illustrates an exemplary circuit configuration corresponding to one MML 10 of a plurality of MMLs included in each block. Here, it is assumed that the nonvolatile memory 3 is a magnetic domain wall memory.

The MML 10 is a magnetic material referred to as a magnetic memory line, a magnetic material pillar, a magnetic wire, a magnetic narrow wire, a string, or the like, and functions as a magnetic shift register. The MML 10 extends in one direction and has a plurality of magnetic domains 15 arranged along a longitudinal direction of the MML 10. A magnetic domain wall 16 exists between adjacent ones of the magnetic domains 15 having mutually different magnetization directions.

The MML 10 has one end portion 10ae and the other end portion 10af. The one end portion 10ae is connected to an input and output unit 31-1 and to a first transistor Tr1 of the shift control unit 32. The other end portion 10af is connected to a magnetic wire driver MML-D-1.

The input and output unit 31-1 is an input and output unit for the MML 10. Writing of data into the MML 10 and reading of data from the MML 10 are executed via the input and output unit 31-1. In a write operation, the input and output unit 31-1 forms magnetization having a specific magnetization direction in a portion of the MML 10, which is connected to the input and output unit 31-1, based on a signal from the read and write control unit 33. In a read write operation, the input and output unit 31-1 detects the magnetization direction of the portion of the MML 10, which is connected to the input and output unit 31-1, to read data from the MML 10. The input and output unit 31-1 includes, for example, a magnetic layer 11a and an intermediate layer 12a. The intermediate layer 12a is disposed between the magnetic layer 11a and the MML 10. The magnetic layer 11a is connected to a transistor Tr2 of the read and write control unit 33.

The read and write control unit 33 includes, in addition to the transistor Tr2, a read and write driver RW-D-1 for driving the MML 10 via the input and output unit 31-1 and a read and write selector RWCS-1 for selecting the MML 10.

In order to shift the magnetization of each magnetic domain in the MML 10 in a unit of one bit, the shift control unit 32 supplies a current to the MML 10 in cooperation with the magnetic wire driver MML-D-1. The shift control unit 32 includes, in addition to the transistor Tr1, a shift driver (domain wall shift driver) DWS-D-1 for supplying a current to the MML 10, and a shift selector (domain wall shift selector) DWS-CS-1 for selecting the MML 10.

The MML 10 extends in a first direction D1. The magnetization of each of the magnetic domains 15 included in the MML 10 is in a first magnetization direction 15ma (here, a magnetization direction N) in one state (a first state). The first magnetization direction 15ma crosses the first direction D1. The magnetization of each of the magnetic domains 15 is in a second magnetization direction 15mb (here, a magnetization direction S) in another state (a second state). The second magnetization direction 15mb crosses the first direction D1 and is opposite to the first magnetization direction 15ma.

The magnetization of the plurality of magnetic domains 15 of the MML 10 is controlled by a signal supplied from the read and write control unit 33 to the input and output unit 31-1. As a result, the first magnetization direction 15ma and the second magnetization direction 15mb are formed. The directions of the magnetizations (the first magnetization direction 15ma and the second magnetization direction 15mb) of the plurality of magnetic domains 15 in the MML 10 correspond to information (including 1 and/or 0) being stored.

Due to the current flowing through the MML 10, each of the magnetic domain walls 16 in the MML 10 shifts (moves), and as a result, each of the magnetizations of the plurality of magnetic domains 15 shifts (moves). For example, when current flows from the one end portion 10ae to the other end portion 10af in the MML 10, the magnetizations of the plurality of magnetic domains 15 moves from the one end portion 10ae to the other end portion 10af. In contrast, when current flows from the other end portion 10af to the one end portion 10ae in the MML 10, the magnetizations of the plurality of magnetic domains 15 moves from the other end portion 10af to the one end portion 10ae. The direction of the current and the shift direction of the magnetizations may be reversed.

In a case where information is stored (written) in the MML 10, a pulse of a current flowing from the one end portion 10ae to the other end portion 10af is supplied to the MML 10, and a portion in the MML 10, which is connected to the input and output portion 31-1, is magnetized in the first magnetization direction 15ma or the second magnetization direction 15mb by the input and output portion 31-1. As a result, the magnetizations of the plurality of magnetic domains 15 move from the one end portion 10ae to the other end portion 10af, and, at the same time, information is written into the portion in the MML 10, which is connected to the input and output portion 31-1.

In a case where information stored in the MML 10 is reproduced (read), a pulse of a current flowing from the other end portion 10af to the one end portion 10ae is supplied to the MML 10, and the input and output portion 31-1 detects a direction of the magnetization (the first magnetization direction 15ma or the second magnetization direction 15mb) in the portion in the MML 10, which is connected to the input and output portion 31-1. As a result, information is read from the portion in the MML 10, which is connected to the input and output unit 31-1 and, at the same time, the magnetizations 15m of the plurality of magnetic domains 15 move from the other end portion 10af to the one end portion 10ae.

In an input and output unit 31-1, for example, a direction of the magnetization in the portion in the MML 10, which is connected to the input and output unit 31-1, is detected by using a magnetoresistive effect or the like.

In this manner, writing of information into the MML 10 and reading of information to the MML 10 are performed by the last-in first-out method. An operation of reading information from the MML 10 is a destructive read operation.

In this example, a write operation and a read operation of information for one MML 10 have been described. However, in actuality, write operations and read operations of information for all MMLs included in the same block are executed in parallel.

FIG. 4 illustrates a movement of memory states (a movement of magnetic domain walls 16) in the MML 10.

In FIG. 4, it is assumed that information "0011011001" is stored in the MML 10 in an initial memory state MSt. FIG. 4 exemplifies three states (CASE1, CASE2, CASE3) after this information is shifted by supplying a current pulse for one-bit shift.

CASE1 corresponds to a correct shift operation. In this case, all the magnetic domain walls 16 move at the same speed. In this case, the information of the initial memory state MSt is maintained even after the shift operation.

CASE2 is an example of an incorrect operation. In CASE2, the second magnetic domain wall 16 moves at a faster speed than the other magnetic domain walls 16. The second magnetic domain wall 16 catches up with the third magnetic domain wall 16, and part of the information is lost. That is, the information of the initial memory state MSt is not maintained and the information changes.

CASE3 is also an example of an incorrect operation. In CASE3, the moving speed of the second magnetic domain wall 16 is slow. In this example, the second magnetic domain wall 16 is drawn as not moving. Also in this case, the information of the initial memory state MSt is not maintained and the information changes.

As described above, when there is a variation in the moving speed of the magnetic domain walls 16, an incorrect operation occurs in the magnetic memory. This incorrect operation becomes prominent when the number of times information is shifted increases. That is, as the number of times of shift operation increases, information deteriorates.

Hereinafter, details of the memory system 1 will be described. First, an outline of some features of the memory system 1 will be described. In the following description, specific numerical values will be exemplified for easy understanding. However, the present embodiment is not limited to these numerical values.

<Data Handling Unit>

Basically, writing and reading of data to and from a block are executed in a unit of data corresponding to a block size.

<Ecc Frame>

The size of an ECC frame is 4 KB+$\alpha'$/8.

<Encoding and Decoding>

The memory controller 2 encodes a data portion to be written to a block of the nonvolatile memory 3 to generate a data portion to which an ECC (parity) is added, and writes the data portion to which the ECC (parity) is added to the block of the nonvolatile memory 3. The memory controller 2 decodes a data portion read from a block of the nonvolatile memory 3 using an ECC attached to the data portion and corrects an error of the read data portion.

<Data Read>

Even if read target data designated by the host 4 is only a part of a plurality of data portions stored in a block, the memory controller 2 reads all the data portions in this block from the nonvolatile memory 3. The memory controller 2 re-encodes all the data portions that have been read and writes back the re-encoded data portions, that is, data portions to which ECCs (parities) are added, to the same block or another block.

<Writing Back Destination>

In a case where the data buffer 25 has a sufficient capacity, the memory controller 2 may write back each data portion, which is read from a block in the nonvolatile memory 3, to the same block or to another block. Here, the writing back is performed for recovering the data portions read from the nonvolatile memory 3. This is because when data is read from each block in the nonvolatile memory 3, the data is lost from the nonvolatile memory 3.

When the capacity of the data buffer 25 is small, the memory controller 2 may write back data portions which are read one by one from a block in the nonvolatile memory 3 to another block one by one. In this case, arrangement of data portions in the other block is in the reverse order to arrangement of data portions in the original block from which the data portions are read.

<Block Shift Counter>

The memory controller 2 manages a counter value for each of a plurality of blocks in the nonvolatile memory 3. The counter value is indicative of a cumulative value of the number of times of performing the operation of shifting data. This counter value is used to evaluate the degree of wear of each block. This counter is referred to as a block shift counter.

<Distribution of Code Amount of Error Correction Code>

The memory controller 2 may change a code amount of an error correction code added to a data portion in accordance with a position of a page in a block to which the data portion is to be written.

Hereinafter, an example of an operation of the memory system 1 will be described.

Here, it is assumed that writing and reading of data are requested from the host 4 in a unit of 4 KB (=page size), and the memory controller 2 writes and reads data to and from the nonvolatile memory 3 in a unit of a block size.

First, a writing process will be described. The 4-KB data received from the host 4 is stored in the data buffer 25. The encoding unit 26 in the encoder/decoder 24 encodes the 4-KB data to generate an error correction code corresponding to the 4-KB data. The 4-KB data to which the generated error correction code is added is stored again in the data buffer 25.

When data corresponding to eight pages (eight 4-KB data portions to which error correction codes are added) is stored in the data buffer 25, the memory controller 2 writes the data corresponding to eight pages into a block in the nonvolatile memory 3.

Figure 8:
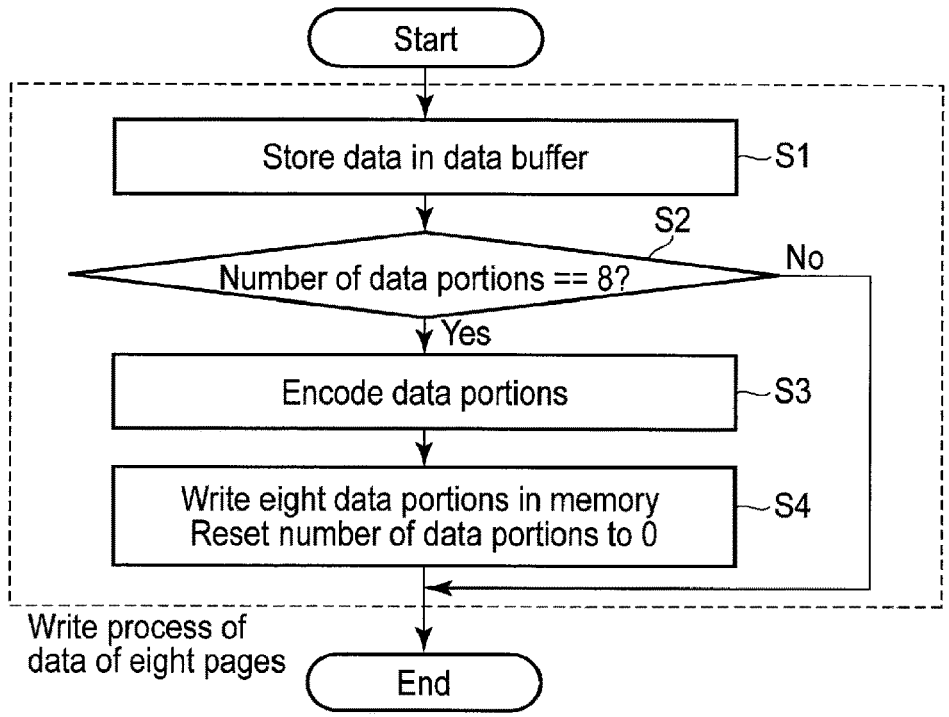
FIG. 8 is a flowchart illustrating an example of the procedure of a process of encoding data portions whose total size corresponds to a block size and writing the encoded data portions into the block.
Figure 9:
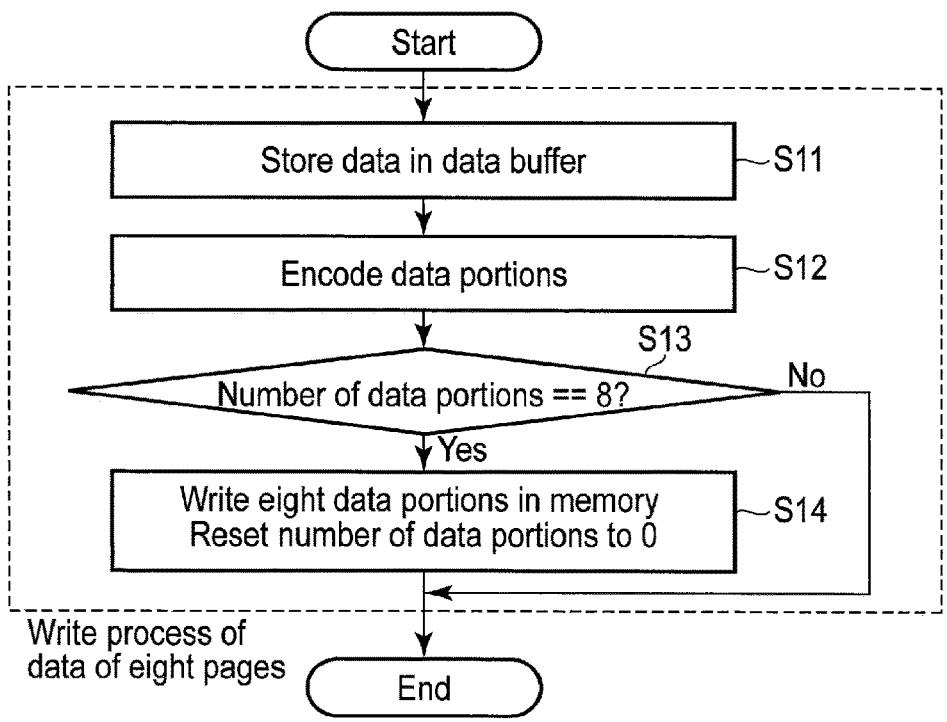
FIG. 9 is a flowchart illustrating another example of the procedure of the process of encoding data portions whose total size corresponds to the block size and writing the encoded data portions into the block.

The procedure of the writing process is illustrated in FIGS. 8 and 9. When a delay in an encoding process is sufficiently small with respect to a transfer speed from the data buffer 25 to the nonvolatile memory 3, a method of performing the encoding process when writing data into the nonvolatile memory 3 may be employed as in a flowchart of FIG. 8. On the other hand, when the encoding process is performed in advance, the writing process is executed according to the procedure illustrated in a flowchart of FIG. 9.

First, the writing process illustrated in the flowchart of FIG. 8 will be described.

When receiving a write request from the host 4, the memory controller 2 starts the writing process illustrated in the flowchart of FIG. 8.

The memory controller 2 receives 4-KB data associated with the write request from the host 4 and stores the 4-KB data in the data buffer 25 (step S1). The memory controller 2 counts the number of data portions stored in the data buffer 25 and determines whether the number of data portions accumulated in the data buffer 25 has reached eight (step S2). When the number of data portions stored in the data buffer 25 has not reached eight (NO in step S2), the memory controller 2 ends the process.

When the number of data portions stored in the data buffer 25 has reached eight (YES in step S2), the memory controller 2 encodes each of the eight data portions with the encoding unit 26 to generate an error correction code, and writes the eight data portions to which the error correction codes are added to a block in the nonvolatile memory 3 (step S4). In step S4, the memory controller 2 also executes a process of resetting the number of data portions accumulated in the data buffer 25 to zero.

Next, the writing process illustrated in the flowchart of FIG. 9 will be described.

When the memory controller 2 receives a write request from the host 4, the memory controller 2 starts the writing process illustrated in the flowchart of FIG. 9.

The memory controller 2 receives 4-KB data associated with the write request from the host 4, and stores the 4-KB data in the data buffer 25 (step S11). The memory controller 2 encodes the 4-KB data with the encoding unit 26 to generate an error correction code (step S12), and stores the 4-KB data to which the error correction code is added in the data buffer 25.

The memory controller 2 counts the number of data portions accumulated in the data buffer 25, that is, the number of 4-KB data portions to which error correction codes are added, and determines whether the number of data portions accumulated in the data buffer 25 has reached eight (step S13). When the number of data portions accumulated in the data buffer 25 has not reached eight (NO in step S13), the memory controller 2 ends the process.

When the number of data portions accumulated in the data buffer 25 has reached eight (YES in step S13), the memory controller 2 writes eight data portions to which error correction codes are added to a block in the nonvolatile memory 3 (step S14). In step S14, the memory controller 2 also executes a process of resetting the number of data portions accumulated in the data buffer 25 to zero.

<Code Amount of Error Correction Code to be Added>

As described above, in the present embodiment, an error correction code (parity) is added to 4-KB data for one page. The size of the error correction code (parity) is, for example, $\alpha'/8$. As a result, the total size of data corresponding to eight pages, to which error correction codes are added, is 32 KB+$\alpha'$.

<About Write Operation>

The write operation performed in each of step S4 in FIG. 8 and step S14 in FIG. 9 will be described.

The memory controller 2 sends data of a first one layer of the data of 32 KB+$\alpha'$ together with a write instruction (a program command) to the nonvolatile memory 3 and writes the data of this one layer into the layer L287 of a selected block. The size of the data for one layer is 1 Kbit+$\alpha$.

At the same time as the data of one layer is written into the layer L287 of the selected block, data of each layer (n) of the selected block is shifted to a layer (n−1).

When this is repeated and data of a 36th layer is written into the selected block, a data portion (page data) having the size of 4 KB+$\alpha'/8$ is written into a portion of the layer L287 to the layer L252, that is, the page p7.

Figure 5:
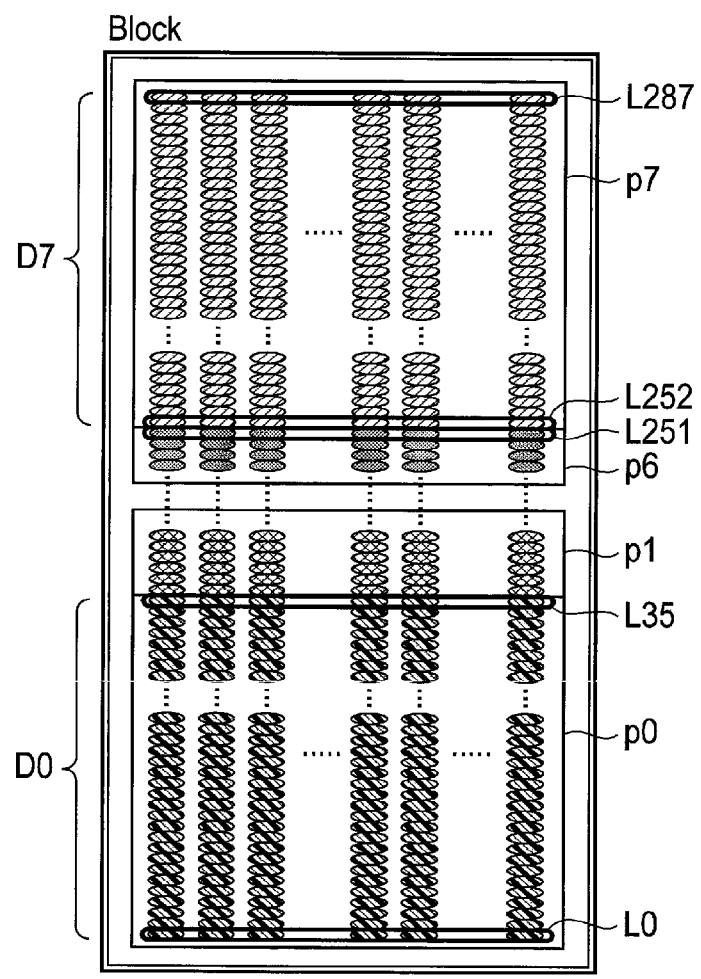
FIG. 5 is a diagram illustrating an example of code amount distribution of error correction codes for data portions written into a block.

When a process of writing each of data portions of the remaining seven pages into the selected block is completed, as illustrated in FIG. 5, page data D0 that is input first is written into (programmed into) the page p0, and page data D7 input at last, that is, eighth, is written into (programmed into) the page p7.

In the above description, the encoding process is executed so that parities having same size ($\alpha'/8$) are added to all the 4-KB data portions as error correction codes. Therefore, all pages are divided by boundaries so that each page includes 36 layers. For example, the page p0 is composed of the layers L0 to L35, and the page p7 is composed of the layers L252 to L287.

It may be considered that a case where an ECC, which is added to a data portion, has different intensity depending on a position in a block where the data portion is to be written. In one example, a large amount of parity is allocated to a data portion which is finally programmed to the page p0, that is, page data input first to a block, and, conversely, a small amount of parity is allocated to a data portion which is finally programmed to the page p7, that is, page data input finally to the block. In that case, as illustrated in FIG. 6, the size of the data portion D0 with the parity (ECC) to be inputted first is 4 KB+$\alpha'/8$+$\gamma$, the size of the data portion D7 with the parity (ECC) programmed at last is 4 KB+$\alpha'/8$−$\gamma$, and the size of each of the other data portions D2 to D6 with the parities (ECCs) is 4 KB+$\alpha'/8$.

Figure 6:
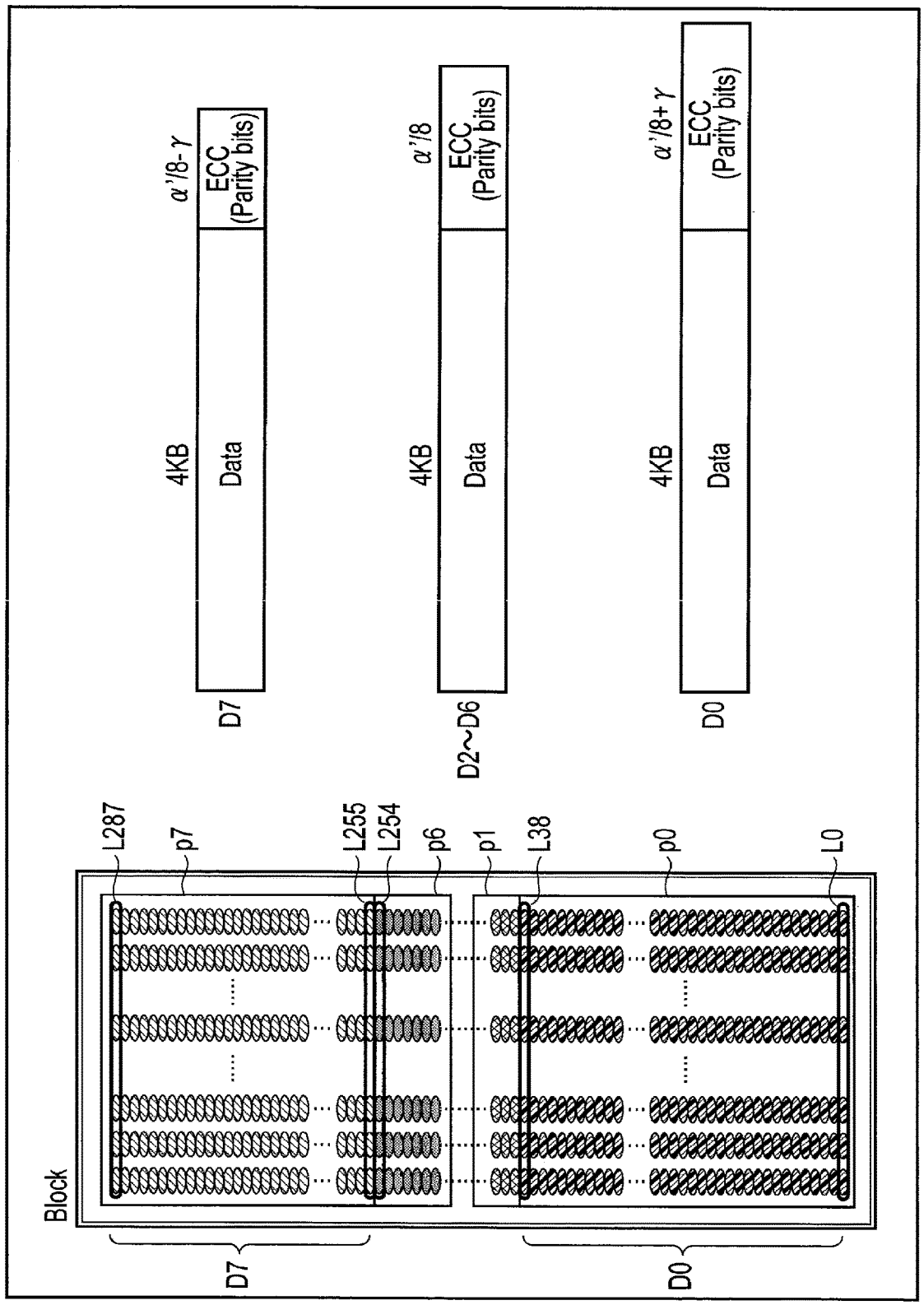
FIG. 6 is a diagram illustrating an example in which code amount distribution of an error correction code is changed according to a location of a page in a block in which a data portion is to be written.

For example, in a case where $\gamma$ has a size corresponding to three layers, the page p0 is composed of 39 layers of the layer L0 to the layer L38, and the page p7 is composed of 33 layers of the layer L255 to the layer L287 as illustrated in FIG. 6.

The total size of the parities included in the entire data stored in one block is maintained at $\alpha'$. The size of the parity included in the data D7 programmed finally into the page p7 is reduced by three layers and the size of the parity included in the data D0 programmed finally into the page p0 is increased by three layers. The above distribution of parity is just an example. For example, it is conceivable to adjust the parity size also between the page p1 and the page p6. In this case, the size of the parity included in the data programmed finally into the page p6 may be reduced by two layers, and the size of the parity included in the data programmed finally into the page p1 may be increased by two layers.

As described above, in the present embodiment, when a plurality of data portions (here, eight page data items) corresponding to the capacity of a write destination block are written to the write destination block, the memory controller 2 changes a code amount of an error correction code to be added to a page data item to be written according to the order of input of the page data item to be written to the write destination block.

In the write operation, the page data that is input first to the write destination block, that is, the data D0 that is finally programmed into the page p0 is shifted many times. On the other hand, the number of times the page data input last to the write destination block, that is, the data D7 programmed finally into the page p7 is shifted is extremely small. Also in the read operation, the number of times the data D0 is shifted is much larger than the number of times the data D7 is shifted. Therefore, errors are likely to be accumulated in the data D0 that is finally programmed into the page p0.

In the present embodiment, a code amount of an error correction code added to a page data item to be written is changed according to the order in which the page data item is input to a write destination block. Therefore, it is possible to distribute more code amount of an error correction code to the data D0 which is finally programmed into the page p0.

Figure 7:
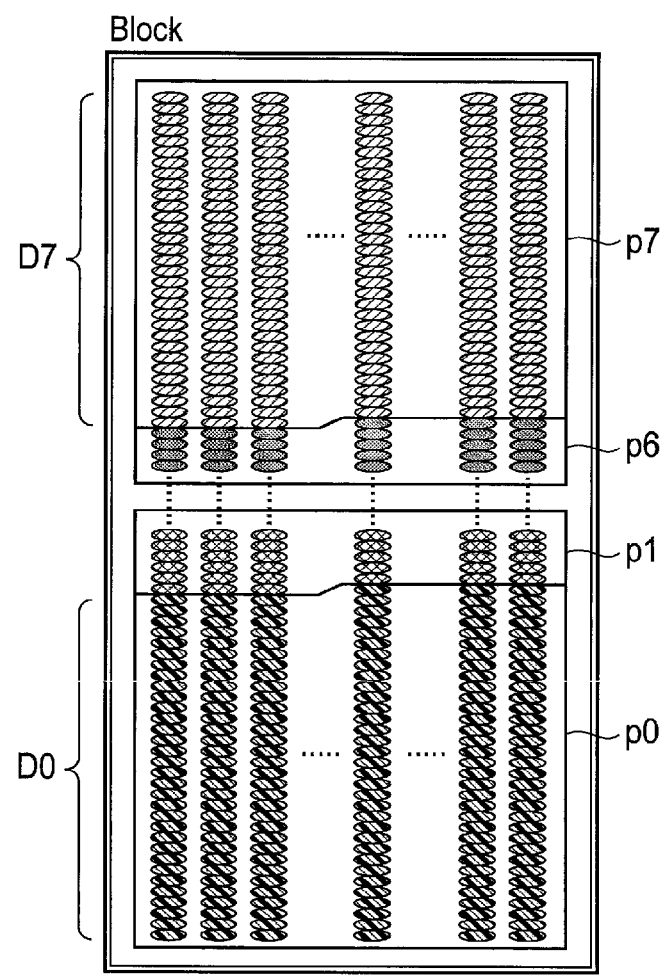
FIG. 7 is a diagram illustrating an example of changing code amount distribution of an error correction code at a boundary of MMLs in the same layer.

The above code amount distribution of an error correction code describes an example in which distribution of code amounts of error correction codes to the pages p0 to p7 is determined so that the pages p0 to p7 include different layer groups. However, distribution of code amounts of error correction codes to the pages p0 to p7 may be determined so that two adjacent pages are separated from each other on the boundary between MMLs in the same layer as illustrated in FIG. 7.

In this case, it is necessary to handle part of data read in a unit of a layer for a next page, which complicates the process. However, a distribution amount of an error correction code to each of the pages p0 to p7 is predetermined. Therefore, for each page, a top layer, a top MML in the top layer, a final layer, and a final MML in the final layer are also predetermined. Therefore, by merely performing a simple operation on an identifier of a page (for example, a page number) to be accessed, a top layer, a top MML in the top layer, a final layer, and a final MML in the final layer, which correspond to the page to be accessed, can be easily calculated.

In the present embodiment, the code amount distribution of an error correction code to each data portion is performed by the control unit 23 in FIG. 1.

When the writing of the eight data portions (eight page data items) to a write destination block is completed, the memory controller 2 updates the LUT 231 so that physical addresses indicating storage locations in the memory 3 where the eight page data items are stored are mapped to logical addresses corresponding to the eight page data items.

Figure 10:
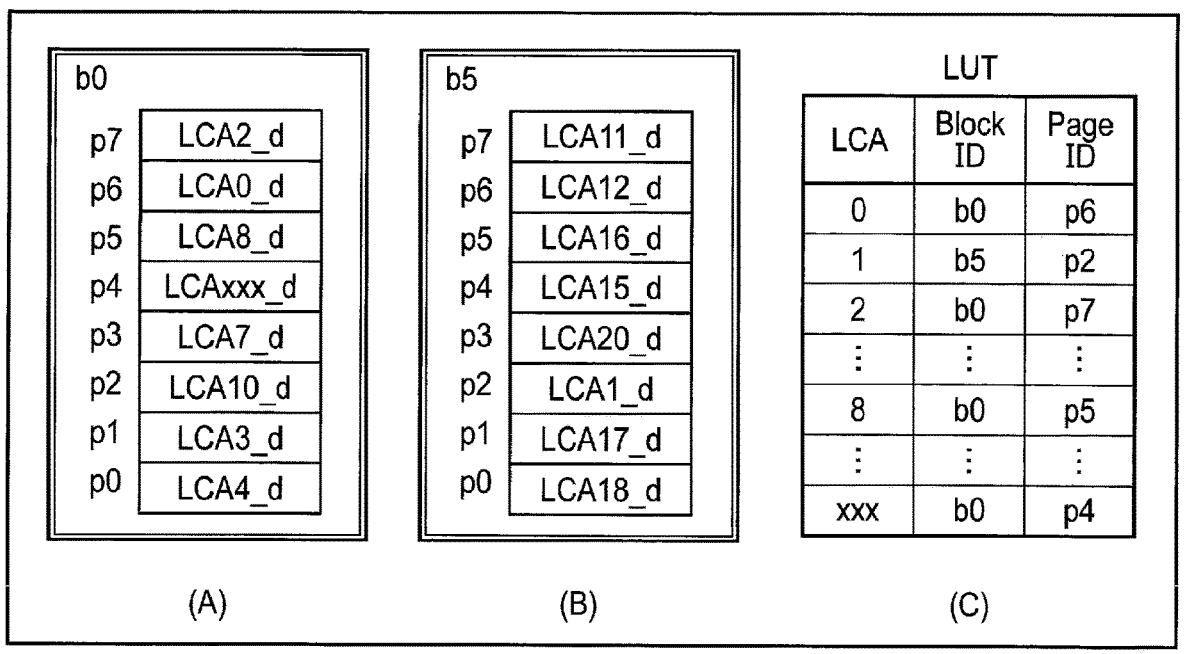
FIG. 10 is a diagram illustrating an example of mapping information in a lookup table (LUT).

As illustrated in FIG. 10, the LUT 231 may manage mapping between each of logical addresses and each of physical addresses of the nonvolatile memory 3 where data portions corresponding to the logical addresses are written. Each physical address may be represented by a combination of a block ID and a page ID. A logical address may be either a logical block address (LBA) or a logical cluster address (LCA). Hereinafter, it is assumed that the LCA is used as the logical address. Each LCA designates an address in a unit of 4 KB. The block ID is a block identifier (e.g., block number) designating a specific block, and the page ID is a page identifier designating any one of the pages p0 to p7.

FIG. 10 assumes a case where page data LCA0-*d* corresponding to LCA0 is written to the page p6 of the block b0, page data LCA1-*d* corresponding to LCA1 is written to the page p2 of the block b5, page data LCA2-*d* corresponding to LCA2 is written to page p7 of the block b0, . . . , page data LCA8-*d* corresponding to LCA8 is written to the page p5 of the block b0.

In this case, in the LUT 231, the block ID b0 and the page ID p6 are stored in an entry corresponding to LCA0, the block ID b5 and the page ID p2 are stored in an entry corresponding to LCA1, the block ID b0 and the page ID p7 are stored in an entry corresponding to LCA2, and similarly, the block ID b0 and the page ID p5 are stored in an entry corresponding to LCA8.

For example, when LCA2 is designated by a read request received from the host 4, the memory controller 2 acquires the block ID b0 and the page ID p7 as a storage location in the nonvolatile memory 3 where the page data LCA2-*d* corresponding to LCA2 is stored, by referring to the LUT 231.

When receiving a read request from the host 4, the memory controller 2 executes a process described below.

Using the LUT 231, the memory controller 2 obtains a block ID and a page ID where page data corresponding to LCAi, which is designated by the read request from the host 4, is stored. Next, the memory controller 2 sequentially reads page data items corresponding to all pages of the block one by one page from the page p7.

Here, the block b0 of FIG. 10 is taken as an example. In a case where the page data LCA2_*d* in the page p7 of the block b0 is read, the page data LCA2_*d* is taken to the outside of the block b0, the page data LCA0_*d* located in the page p6 of the block b0 moves (shifts) to the page p7 of the block b0, the page data LCA8_*d* located in the page p5 of the block b0 moves (shifts) to the page p6 of the block b0, . . . , and the page data LCA4_*d* located in the page p0 of block b0 moves (shifts) to the page p1 of the block b0.

In a case where the page data LCA0_*d* that has been moved to the page p7 of the block b0 is read, the page data LCA0_*d* is taken to the outside of the block b0, the page data LCA8_*d* that has been moved to the page p6 of the block b0 moves to the page p7 of the block b0, the page data LCAxxx_d that has been moved to the page p5 of the block b0 moves to the page p6 of the block b0, . . . , the page data LCA4_*d* that has been moved to the page p1 of the block b0 moves to the page p2 of block b0.

In this way, the memory controller 2 sequentially reads eight page data items stored in the block b0 of FIG. 10 from the nonvolatile memory 3. Note that, in practice, the movement (shift) operation of data as described above is executed in a unit of a layer. When one page includes 36 layers, data of each page is shifted by one page by performing 36 shift operations.

Then, the memory controller 2 decodes each of the read page data items with the decoding unit 27 of the encoder/decoder 24 in order to correct an error of each of the read page data items. When the page data item decoded by the decoding unit 27 is data requested by the host 4, the memory controller 2 returns the decoded page data item to the host 4 through the host interface 21. Furthermore, when the page data item decoded by the decoding unit 27 is data requested by the host 4, the memory controller 2 stores the decoded page data item in the data buffer 25. On the other hand, when the page data item decoded by the decoding unit 27 is not data requested by the host 4, the memory controller 2 does not return the decoded page data item but stores the decoded page data item in the data buffer 25.

Each of page data items stored in the data buffer 25 is encoded again by the encoding unit 26 of the encoder/decoder 24, and is programmed into the nonvolatile memory 3.

At this time, when the data buffer 25 has a sufficient capacity and a 32-KB area for reading can be reserved in the data buffer 25 while the reading and programming of page data described above is performed, the memory controller 2 stores all page data items for one block in the data buffer 25. After the above, the memory controller 2 sequentially re-encodes the page data items in the data buffer 25 and programs (writes back) them into the nonvolatile memory 3. This method is similar to the write process described in FIGS. 8 and 9. A block to which the page data items are written back may be the same block as the block from which the page data items are read, or may be another block. Whether to write back to the same block or another block is determined based on values of block shift counters of these blocks. When these page data items are written back to the same page positions in the same block, the storage positions of these page data items are not changed. Thus, updating of the LUT 231 is unnecessary. When writing back these page data items to another block, the block IDs in the LUT 231 that correspond to these page data items, respectively, are updated so that each of the block IDs is changed to a block ID of the other block.

FIG. 11 is a perspective view of an example of the structure of a memory cell array. In FIG. 11, two directions orthogonal to each other will be referred to as a direction X and a direction Y, and the extending direction of MMLs 10 that is orthogonal to the directions X and Y (that is, an XY plane) will be referred to as a direction Z.

Source lines SL extending in the direction Y are arranged in the direction X. On a source line SL, an MML 10, a magnetoresistive effect element 11, and a selector element 12 are arranged in the direction Z. The magnetoresistive effect element 11 is formed of, for example, a magnetic tunnel junction (MTJ) element. The MTJ element includes a magnetic layer 11R, a nonmagnetic layer 11N, and a magnetic layer 11S. Details of the MTJ element will be described later.

The structure of the memory cell array is now described. An MML 10 is disposed on a source line SL, and a magnetic layer 11S is disposed on the MML 10. The magnetic layer 11S extends to a certain distance in the direction Y and the nonmagnetic layer 11N and the magnetic layer 11R are disposed on the extending magnetic layer 11S in this order. On the magnetic layer 11R, a bit line BL is disposed via the selector element 12.

Multiple sets of the MML 10, the magnetoresistive effect element 11, and the selector element 12, which are disposed in the direction Z, are arranged in a matrix in the directions X and Y. A bit line BL is disposed on the selector elements 12 arranged in the direction X. Furthermore, on the magnetic layers 11S, a field line (write line) FL is disposed. The field line FL is arranged in a zigzag fashion in the direction X weaving between magnetoresistive effect elements 11 adjacent to each other in the directions X and Y.

Now, the MTJ element will be described. The MTJ element includes a magnetic layer 11R, a nonmagnetic layer 11N and a magnetic layer 11S. The nonmagnetic layer 11N is disposed between the magnetic layer 11R and the magnetic layer 11S. The magnetic layer 11R functions as a reference layer, and the magnetic layer 11S functions as a memory layer. The nonmagnetic layer 11N functions as a tunnel barrier. Note that the MTJ element may further include another layer.

The magnetic layer (memory layer) 11S is magnetized in a direction along a certain axis. For example, the magnetization of the magnetic layer 11S is stable along the vertical direction to the boundary surfaces of the layers 11S, 11R, and 11N. The magnetization direction of the magnetic layer 11S may be reversed by the magnetization direction of a magnetic domain included in the MML.

The magnetic layer (reference layer) 11R has a fixed or unchangeable magnetization direction, and for example, has a coercive force greater than that of the magnetic layer (memory layer) 11S. The fixed or unchanged magnetization direction of the magnetic layer 11R means that the magnetization direction of the magnetic layer 11R is not reversed by the magnetic direction of the magnetic domain in the MML which reverses the magnetization of the magnetic layer (memory layer) 11S.

A set of the magnetic layer 11R, the nonmagnetic layer 11N, and the magnetic layer 11S has a magnetoresistive effect. Specifically, when the magnetic directions of the magnetic layer 11S and the magnetic layer 11R are parallel, the MTJ element has the minimum resistive value. On the other hand, when the magnetic directions of the magnetic layer 11S and the magnetic layer 11R are not parallel, the MTJ element has the maximum resistive value. The magnetoresistive effect element 11 as the MTJ element is in a low resistive state when a relative relationship of the magnetic directions of the magnetic layer (memory layer) 11S and the magnetic layer (reference layer) 11R is parallel while is in a high resistive state when the relative relationship is not parallel.

Figure 12:
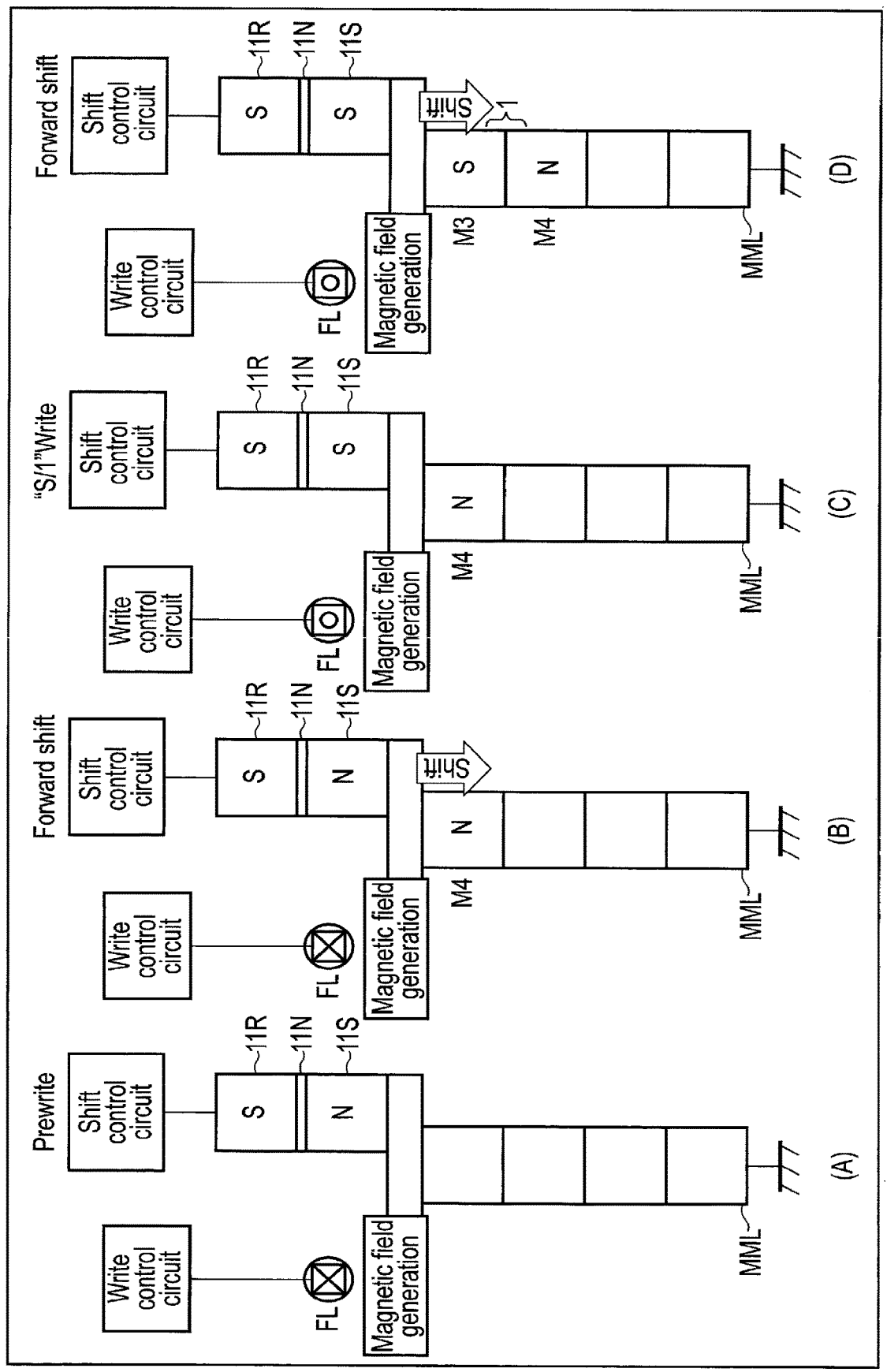
FIG. 12 is a diagram illustrating a first example of a write operation to an MML.
Figure 13:
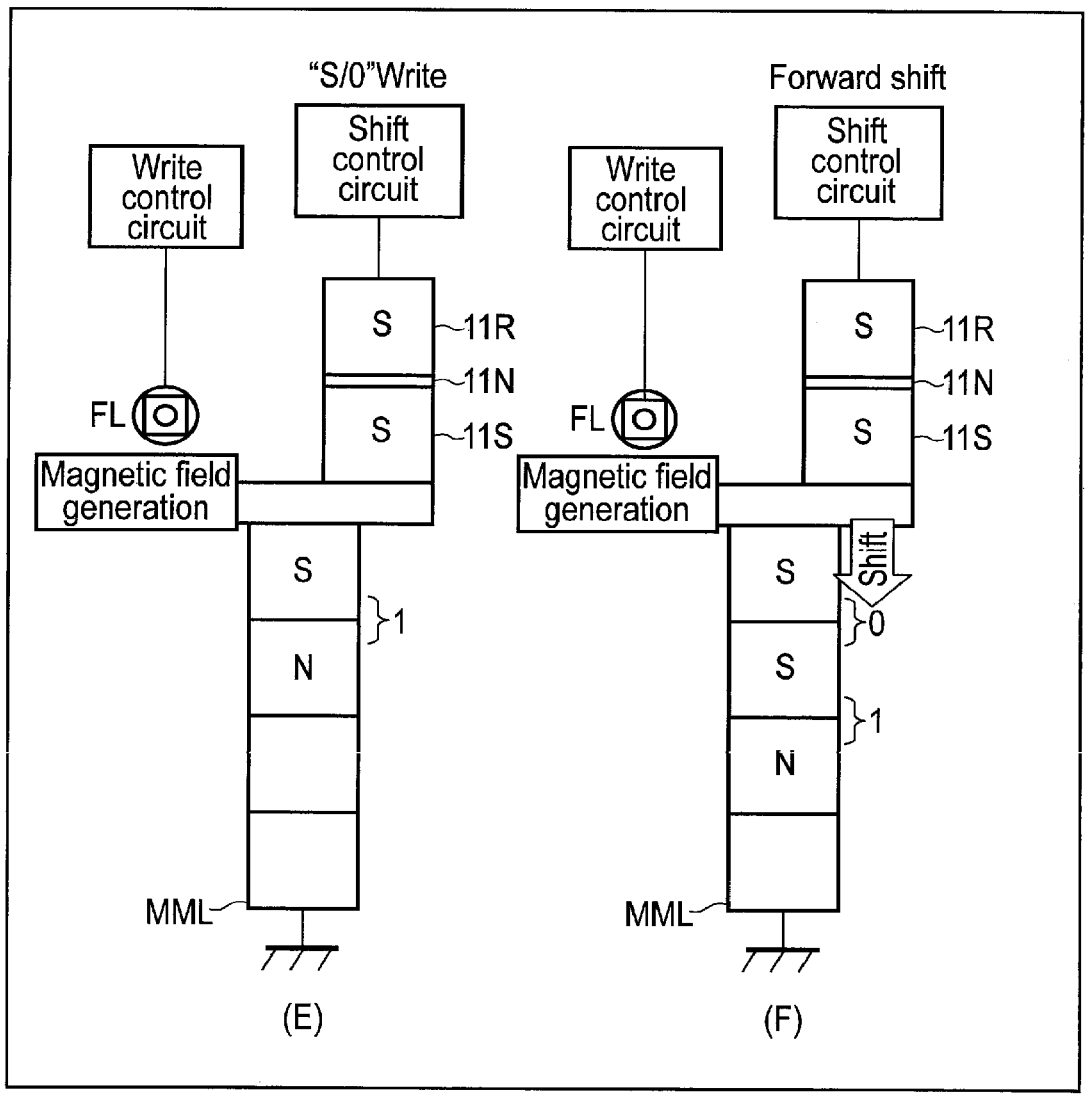
FIG. 13 is a diagram illustrating a second example of the write operation to the MML.

FIGS. 12 and 13 illustrate an example of a write sequence to an MML 10 in the nonvolatile memory 3.

As illustrated in FIG. 12(A), firstly, in order to start the data write sequence, a magnetic domain having a specific magnetization direction (here, a magnetic domain N) is formed by an induction magnetic field that is generated by causing a current to flow through an FL (Pre Write). As illustrated in FIG. 12(B), the formed magnetic domain N is set as a magnetic domain of the uppermost layer in the MML 10 by shifting the magnetic domains in the MML 10 in a unit of a magnetic domain in a direction from magnetic domains of upper layers to magnetic domains of lower layers (forward shift). The shift is generated by causing a current to flow through the MML 10.

After that, as illustrated in FIG. 12(C), a magnetic domain S is formed to write data "1" ("S/1" write). As illustrated in FIG. 12(D), the formed magnetic domain S is set as the magnetic domain of the uppermost layer in the MML 10 by a forward shift. Furthermore, by the forward shift, the magnetic domain N previously set as the magnetic domain of the uppermost layer moves to the one-lower layer. The magnetic domain S of the uppermost layer and the magnetic domain N of the one-lower layer formed in the MML 10 correspond to storage of data "1".

Furthermore, as illustrated in FIG. 13(E), a magnetic domain S is formed to write data "0" ("S/0" write). As illustrated in FIG. 13(F), the formed magnetic domain S is set as the magnetic domain of the uppermost layer in the MML 10 by a forward shift. Furthermore, by the forward shift, the magnetic domain S previously set as the uppermost layer moves to the one-lower layer and the magnetic domain N previously set as the one-lower layer moves to the further one-lower layer. The magnetic domain S of the uppermost layer and the magnetic domain S of the one-lower layer formed in the MML 10 correspond to storage of data "0".

Figure 14:
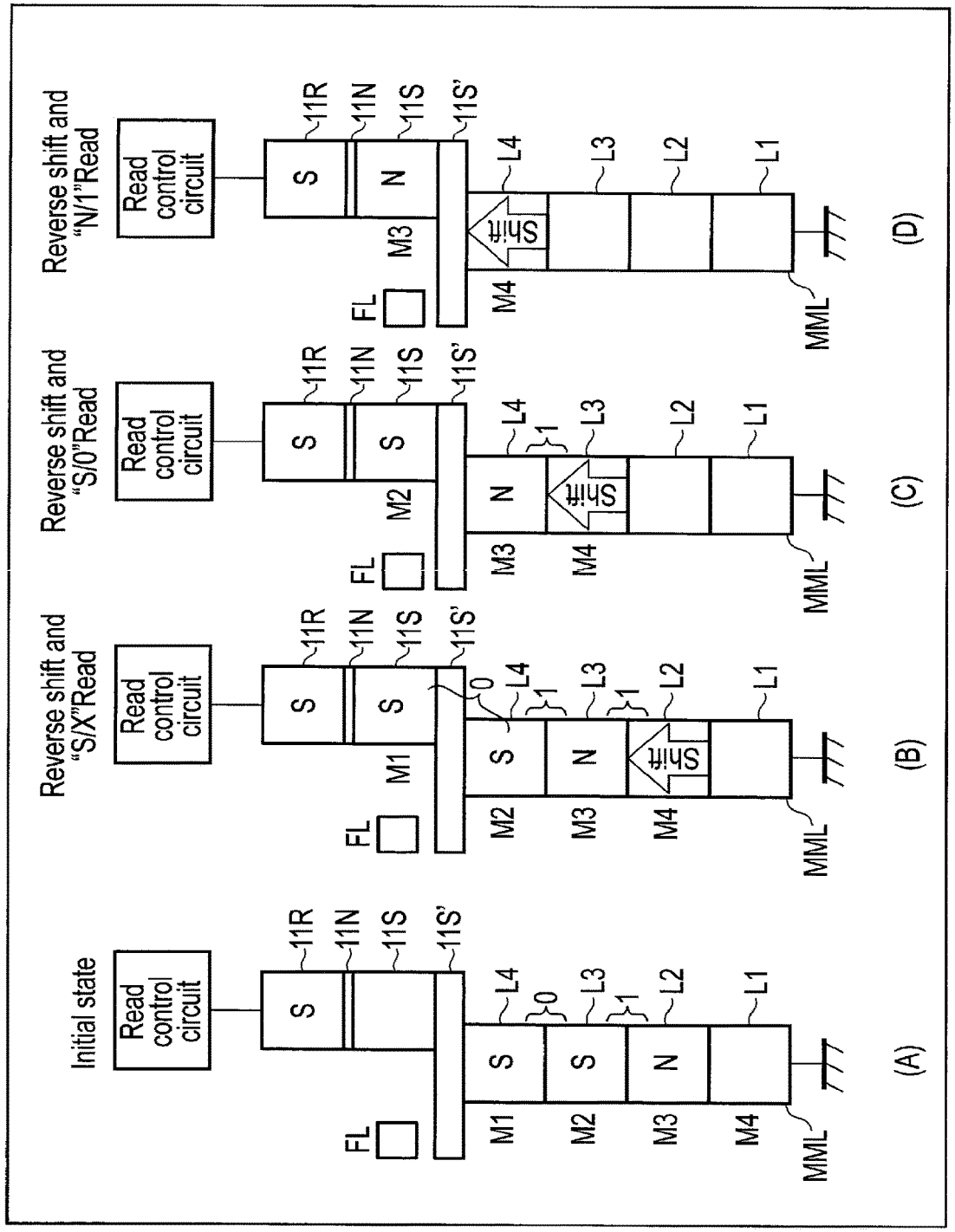
FIG. 14 is a diagram illustrating an example of a read operation from the MML.

FIG. 14 illustrates a read sequence from an MML 10 in the nonvolatile memory 3. FIG. 14(A) illustrates an initial state before starting the read sequence in which a magnetic domain S, a magnetic domain S, and a magnetic domain N are set in sequence from the uppermost layer of the MML 10.

Firstly, as illustrated in FIG. 14(B), by shifting the magnetic domains in the MML 10 in a unit of a magnetic domain in a direction from magnetic domains of lower layers to magnetic domains of upper layers (reverse shift), each of the magnetic domains moves to a one-upper layer. Then, a specific state (here, a low resistive state) of the magnetoresistive effect element 11 caused by the magnetic induction by the magnetic domain S moved from the uppermost layer is detected ("S/X" read).

Then, as illustrated in FIG. 14(C), after a reverse shift to move each of the magnetic domains in the MML 10 to the one-upper layer, a low resistive state of the magnetoresistive effect element 11 caused by the magnetic induction by the magnetic domain S moved from the uppermost layer is detected, and because there is no change from the low resistive state detected one step before, data "0" is output ("S/0 read"). That is, data "0", which is stored by the magnetic domain S set as the uppermost layer and the magnetic domain S set as the one-lower layer in the initial state, is read.

Furthermore, as illustrated in FIG. 14(D), after a reverse shift to move each of the magnetic domains in the MML 10 to the one-upper layer, a high resistive state of the magnetoresistive effect element 11 caused by the magnetic induction by the magnetic domain N moved from the uppermost layer is detected, and because there is a change from the low resistive state detected one step before, data "1" is output ("N/1 read"). That is, data "1", which is stored by the magnetic domain S set in one-lower layer of the uppermost layer and the magnetic domain N set in the further one-lower layer in the initial state, is read.

As described above, the nonvolatile memory 3 has a characteristic in which data write and read sequences are performed by a last-in first-out method and a characteristic of destructive read in which data is destroyed by a read operation. In the following description, a compaction operation in the nonvolatile memory 3 having such characteristics will be explained.

Comparative Example: Compaction in NAND Flash Memory

For better understanding of the compaction operation in the memory system 1 including the nonvolatile memory 3 of the present embodiment, a compaction operation in a memory system including a NAND flash memory will be explained as a comparative example. In the following, a case where the nonvolatile memory 3 is a magnetic domain wall memory will be exemplified.

The NAND flash memory includes blocks. Each block includes pages. Each block functions as a minimum erase unit. Each page functions as a unit of a data write operation and a data read operation.

The blocks are classified into active blocks (written blocks) and free blocks (available blocks). Each active block stores valid data. Each free block does not store valid data and is available for writing new data after erasing data on it. The valid data is data associated with a logical address (for example, a logical block address (LBA)), and is data to possibly be read by the host 4 later.

The active blocks may include invalid data. The invalid data is data that is not associated with any logical address and is data not to be read by the host 4 anymore.

The tolerable maximum number of program/erase (P/E) cycles for each block is limited. One P/E cycle of a block includes an erase operation to erase data stored in all memory cells in the block and a write operation (specifically, a program operation) to write data in each page of the block.

Figure 15:
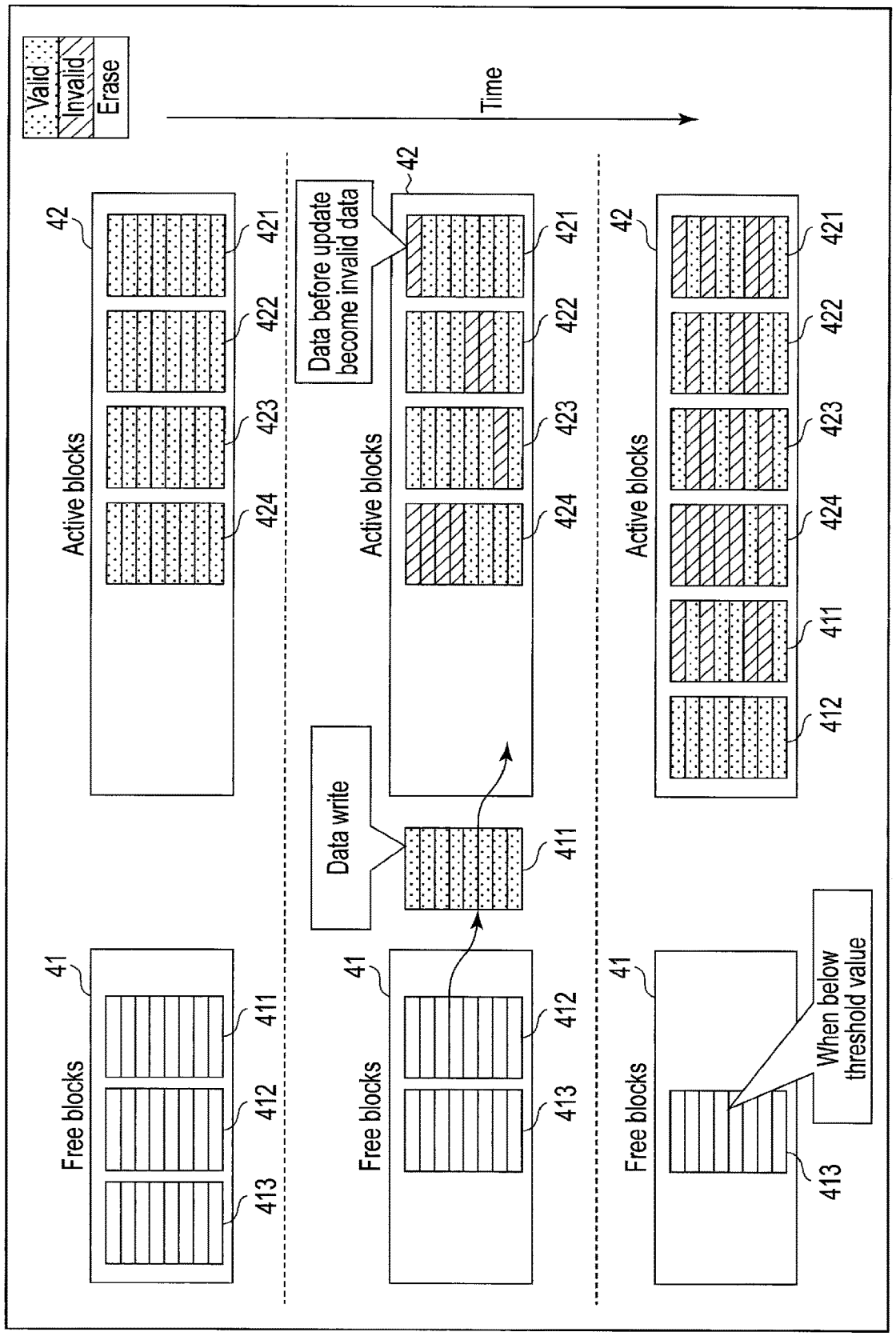
FIG. 15 is a diagram illustrating compaction in a memory system according to a comparative example.

FIG. 15 illustrates a transition of free blocks 41 and active blocks 42 in accordance with data write operations in a chronological order. In this example, the transition start from a state where the NAND flash memory includes the free blocks 41 including three free blocks 411, 412, and 413 and the active blocks 42 including four active blocks (written blocks) 421, 422, 423, and 424 in which data is written in all the pages.

In FIG. 15, pages storing valid data (Valid), pages storing invalid data (Invalid), and pages into which data has not been written (Erase) in the blocks are illustrated in a recognizable manner. For easier management, for example, each block in which data is written in all pages is managed as an active block.

Data write into one page is executable only once in a single P/E cycle. Thus, update data corresponding to an LBA is not written to an original physical memory location in which previous data corresponding to the LBA is stored but to a different physical memory location. Then, an LUT is updated to associate the LBA with the different physical storage location and to invalidate the previous data.

As illustrated in FIG. 15, for example, when items of update data corresponding to LBAs are written into the block 411 that is selected as a new write destination block from the free blocks 41, previous data in the active blocks 421 to 424 corresponding to the LBAs are invalidated. Then, the block 411 in which data is written into all pages is managed as a new active block. Similarly, when the block 412 is selected from the free blocks 41 as a new write destination block and data is written into all pages of the block 412, the block 412 is managed as a new active block.

A memory controller in the memory system manages the number of free blocks. When the number of free blocks becomes below a threshold value while blocks selected from the free blocks 41 are used as new write destination blocks, a compaction process is started during intervals between processes for commands from the host 4.

As illustrated in FIG. 16, through the compaction process, items of valid data in active blocks (source blocks) 421, 422, 423, 424, and 411 are written into write destination blocks 431, 432, and 433 for compaction. Then, each of the blocks 421, 422, 423, 424, and 411, which does not include any valid data, is reused as a free block available for writing new data after erasing data on it. In addition, the destination blocks 431, 432, 433 in which data is written into all pages are newly managed as active blocks.

FIG. 17 illustrates a flowchart of an example of the procedure of a compaction process performed by the memory controller.

Firstly, the memory controller determines whether the number of free blocks is less than a threshold value (step S21). When the number of free blocks is equal to or greater than the threshold value (NO in step S21), the process ends.

When the number of free blocks is less than the threshold value (YES in step S21), the memory controller determines a source block (step S22). As the source block, for example, a block of lower valid data ratio is selected. Then, the memory controller determines a destination block (step S23). A free block is selected as the destination block.

Then, the memory controller writes items of valid data, which are included in the source block, into the destination block (step S24). After all items of valid data in the source block are written into the destination block, the memory controller erases data in the source block (step S25).

Through the above, the memory system including the NAND flash memory may reuse the source block as a free block. Since a block of lower valid data ratio is selected as a source block in order to preferentially erase an invalid data area in the block of greater invalid data ratio, free blocks can be increased efficiently.

<Compaction>

Figure 18:
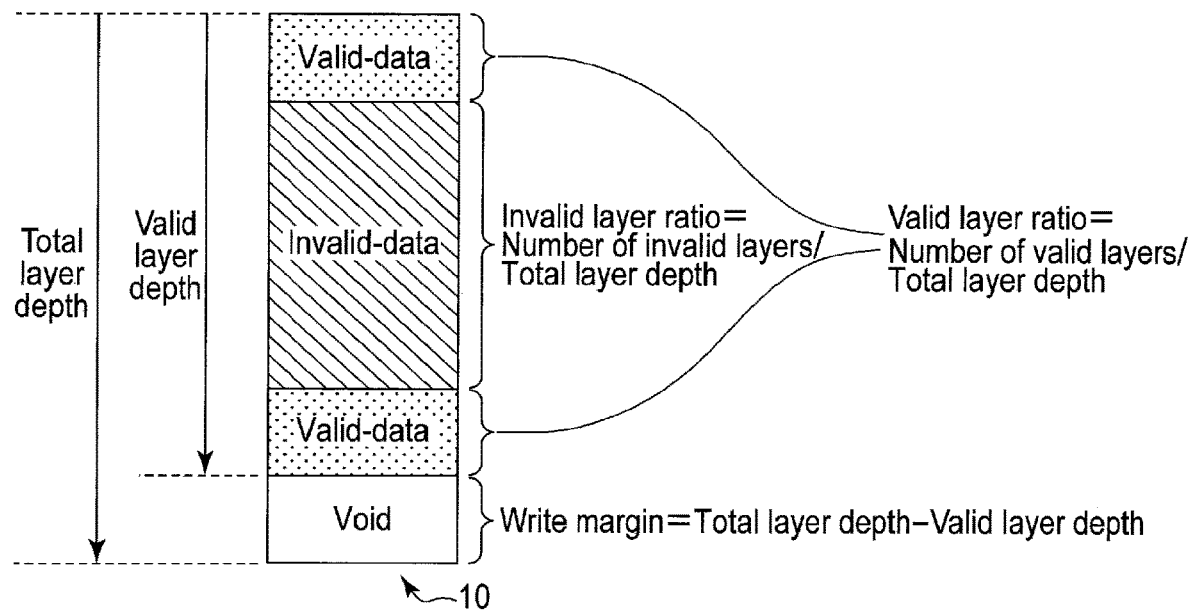
FIG. 18 is a diagram for explaining parameters for an MML.

In order to explain the compaction operation by the memory system 1 of the present embodiment, parameters related to blocks in the magnetic domain wall memory 3 will be defined. FIG. 18 illustrates one of MMLs 10 in a block, and for easier understanding, it is assumed that layers having the same depth in the MMLs 10 in the block have the same write state. Thus, the state of an MML 10 illustrated in FIG. 18 represents the state of all MMLs 10 in the block.

Relationships between layers included in the MML 10 are defined based on positions of the layers in the depth direction of the MML 10 such that a layer in a shallower position is referred to as an upper layer, and a layer in a deeper position is referred to as an lower layer. Items of data stored in the layers are shifted in a unit of a layer in a first direction from the uppermost (first) layer to the bottom (last) layer or in a second direction opposite to the first direction, thereby performing data write into each block and data read from each block by a last-in first-out method.

Each layer in the MML 10 has any one of three attributes of Valid-data, Invalid-data, and Void.

In a layer of the Valid-data attribute (also referred to as a valid layer), data that is most recently associated with a logical address (here, an LCA) and is possibly be read by the host 4 later (that is, valid data) is stored. The depth of the deepest valid layer in the MML 10 is defined as a valid layer depth. That is, the valid layer depth indicates, in blocks of the MML 10, a position of a valid layer that is most distant from the uppermost layer, that is, a position of a valid layer closest to the bottom layer.

A layer of the Invalid-data attribute (also referred to as an invalid layer) is a layer that stores data corresponding entry of which does not exist in the LUT 231 and below which a valid layer exists. In other words, the invalid layer stores data associated with no logical address and exists above a valid layer (that is, there is a valid layer in the first direction from the invalid layer).

A layer of the Void attribute (also referred to as a void layer) indicates that data may further be written into the MML 10. The void layer (or void layers) may be included in the lowermost part of the MML 10. That is, neither a valid layer nor an invalid layer exists below a void layer.

A write margin corresponding to the number of void layers indicates the size of a writable area in the MML 10 and is derived from subtracting a valid layer depth from a total layer depth that is the total number of the layers in the MML 10. Note that, when a layer stores data that is not associated with any logical address and there is no valid layer below the layer, the layer is a void layer.

When a write margin of each of MMLs 10 that constitute a block is 100%, the block is a free block. That is, when all layers in the MMLs 10 that constitute the block are void layers, the block is a free block. When a write margin of each of MMLs 10 that constitute a block is 0%, no data can be further written into the block.

A ratio of valid layers to all layers in one MML 10 (that is, a ratio of the number of valid layers to a total layer depth of an MML 10) will be defined as a valid layer ratio. A ratio of invalid layers to all layers in one MML 10 (that is, a ratio of the number of invalid layers to a total layer depth of an MML 10) will be defined as an invalid layer ratio.

When it is assumed that layers having the same depth in MMLs 10 in a block have the same write state as described above, a ratio of valid layers to all layers in the block (that is, a ratio of the numbers of valid layers to the number of all layers in the block) may be defined as the valid layer ratio. Furthermore, a ratio of invalid layers to all layers in the block (that is, a ratio of the numbers of invalid layers to the number of all layers in the block) may be defined as the invalid layer ratio.

Figure 19:
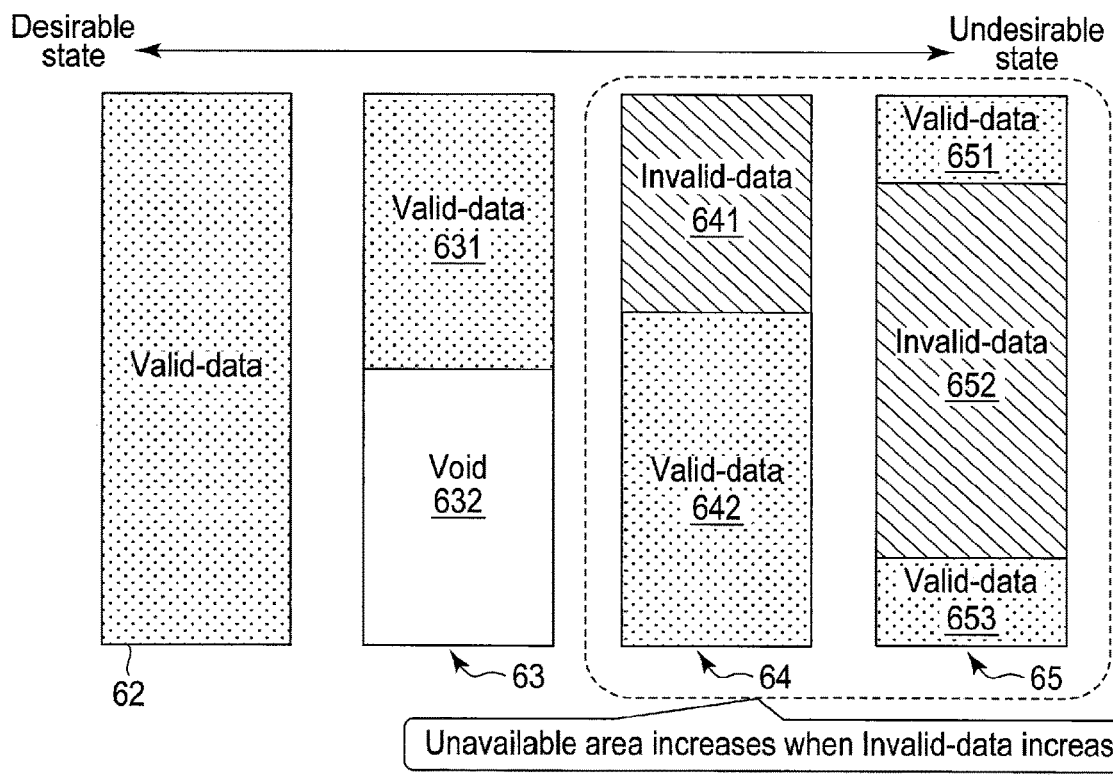
FIG. 19 is a diagram for explaining use states of an MML.

With reference to FIG. 19, a desirable state and an undesirable state of blocks being used will be explained.

Firstly, a block 62 in which all layers are valid layers is a block in a desirable state since all the layers are used for storage of Valid-data.

A block 63 composed of valid layers 631 and void layers 632 has a write margin corresponding to the void layers 632. Thus, while not all the layers in the block 63 are used for storage of Valid-data, since the write margin is available for storage of new data, the block 63 is in a desirable state next to the block 62 in which all the layers are valid layers.

A block 64 that is composed of invalid layers 641 and valid layers 642 and a block 65 that is composed of valid layers 651 and 653 and invalid layers 652 each include the invalid layers 641 and 652 that are unavailable for data storage, and thus, these blocks 64, 65 are in an undesirable state. In such blocks 64 and 65, data in the invalid layers 641 and 652 may be read by a read operation to exclude the invalid layers 641 and 652 from the blocks 64, 65. Note that, in the block 65, read operations on the valid layers 651 must be performed before read operations on the invalid layers 652 are performed, and thus, a load increases. Thus, the block 65 is in a less desirable state as compared to the block 64.

As described above, data write into the magnetic domain wall memory 3 and data read from the magnetic domain wall memory 3 are performed by a last-in first-out method. Furthermore, the magnetic domain wall memory 3 has a destruction read characteristic in which read data is erased from the magnetic domain wall memory 3.

Thus, while an erase operation is performed in a unit of a block in a NAND flash memory, data, which is read from the magnetic domain wall memory 3, is erased from the magnetic domain wall memory 3. With this characteristic, while a block in which data is written into all areas of the block is classified as a written block in the NAND flash memory, data write into all areas (layers) in a block is not required in the magnetic domain wall memory 3. That is, in the magnetic domain wall memory 3, a block in which data is written into at least one layer will be classified as a written block.

Furthermore, while compaction is performed to create a new free block in the NAND flash memory, compaction is performed in the magnetic wall domain memory 3 to increase a write margin of a block (or write margins of blocks).

FIGS. 20A and 20B illustrate an example of a compaction operation using blocks in the magnetic domain wall memory 3.

While FIG. 20A illustrates an example of a scenario 1 where a source block 45 whose valid layer ratio is 30% is selected, FIG. 20B illustrates an example of a scenario 2 where a source block 47 whose valid layer ratio is 40% is selected. Here, in either case, free blocks are selected as destination blocks 46 and 48. Since all layers in the destination blocks 46 and 48 as free blocks are void layers, the valid layer ratios and the invalid layer ratios of the blocks 46 and 48 are 0%, and the write margins of the blocks 46 and 48 are 100%.

As illustrated in FIG. 20A, the source block 45 is composed of valid layers storing Valid-data s0 and void layers. The invalid layer ratio of the source block 45 is 0% and the write margin of the source block 45 is 70%.

When a compaction operation is performed using the source block 45 and the destination block 46, the Valid-data s0 is read from the source block 45 and the read Valid-data s0 is written into the destination block 46. As a result, the write margin of the source block 45 becomes 100% and the write margin of the destination block 46 becomes 70%.

Thus, before and after the compaction operation, the write margin of the source block 45 and the write margin of the destination block 46 are simply switched, and the entire write margin of the source block 45 and the destination block 46 does not change.

On the other hand, as illustrated in FIG. 20B, the source block 47 is composed of valid layers storing Valid-data s1, invalid layers storing Invalid-data, and valid layers storing Valid-data S2. The invalid layer ratio of the source block 47 is 60%, and the write margin of the source block 47 is 0%.

When a compaction operation is performed using the source block 47 and the destination block 48, the Valid-data s1 is read, the Invalid-data is read, and the Valid-data s2 is read, from the source block 47. The Valid-data s1 and the Valid-data s2, which has been read from the source block 47, are written into the destination block 48. As a result, the write margin of the source block 47 becomes 100% and the write margin of the destination block 48 becomes 60%. Furthermore, the invalid layer ratio of the source block 47 becomes 0%.

Thus, before and after the compaction operation, the entire write margin of the source block 47 and the destination block 48 increases by the write margin of the destination block 48 that is 60%. That is, the entire write margin is improved by a difference between the 0% write margin in the source block 47 before the compaction operation and the 60% write margin in the destination block 48 after the compaction operation.

In the compaction operation on the NAND flash memory described above, a block having a small valid data ratio is selected as a source block. If a block having a small valid layer ratio is selected similarly in the compaction operation on the magnetic domain wall memory 3, not the block 47 in the scenario 2 whose valid layer ratio is 40% but the block 45 in the scenario 1 whose valid layer ratio is 30% is selected as a source block. In that case, the entire write margin does not change before and after the compaction operation. Thus, if a block having a small valid layer ratio is selected as a source block, the entire write margin may not be improved even when the compaction operation has been performed.

Thus, in the present embodiment, in a compaction operation on the nonvolatile memory 3 (for example, a magnetic domain wall memory) in which writing and reading of data are performed by a last-in first-out method, a block having a greater invalid layer ratio is selected preferentially as a source block. Furthermore, between blocks with the same invalid layer ratio, a block having a deeper valid layer depth is selected preferentially as the source block. That is, when several blocks having the same high invalid layer ratio are selected, a block having a deeper valid layer depth, that is, a block including a valid layer closer to the bottom layer is selected as the source block.

FIG. 21 illustrates differences between a NAND flash memory (or a NOR flash memory) and the magnetic domain wall memory 3 with regard to a compaction operation. In both the NAND flash memory and the magnetic domain wall memory 3, the compaction operation is activated when the free block ratio (or the number of free blocks) becomes below a threshold value. In the compaction operation on the NAND flash memory, the source block has a small valid data ratio and the destination block is a free block.

On the other hand, in the compaction operation on the magnetic domain wall memory 3 of the present embodiment, a source block is selected from blocks in the magnetic domain wall memory 3 based on the invalid layer ratios of the blocks. For example, a block having a greater invalid layer ratio is selected as the source block. When there are several blocks each having a greater invalid layer ratio (for example, a maximum invalid layer ratio), a block having a deeper valid layer depth is selected from these blocks as the source block.

Furthermore, the destination block is a free block whose invalid layer ratio is zero, or is a block including a void area the size of which is equal to or larger than the size of Valid-data included in the source block. That is, a free block all layers of which are void layers, or a block including void layers the number of which is equal to or greater than the number of valid layers included in the source block is selected as the destination block.

As illustrated in FIG. 1, the memory controller 2 manages the LUT 231, the reverse LUT 232, VoidCnt 233, and InValidCnt 234. The LUT 231 is used to translate a logical address into a physical address. For example, one LUT 231 is provided for all blocks in the magnetic domain wall memory 3.

The reverse LUT 232 is used to translate a physical address into a logical address. For example, one reverse LUT 232 is provided for each of the blocks in the magnetic domain wall memory 3.

VoidCnt 233 is used to manage a write margin of each block. InValidCnt 234 is used to manage an invalid layer ratio of each block.

As described above, each block includes a plurality of layers, and each page in one block includes a set of several adjacent layers. In the magnetic domain wall memory 3, for example, each of writing, reading, and deleting of data is performed in a unit of a page.

Thus, layers that constitute a page are at least one of one or more valid layers, one or more invalid layers, and one or more void layers. Thus, the write margin of a block may be managed using VoidCnt 233 that counts pages in the block that are composed of void layers (i.e., void pages in the block). Similarly, the invalid layer ratio of a block may be managed using InValidCnt 234 that counts pages in the block that are composed of invalid layers (i.e., invalid pages in the block). That is, instead of the write margin and the invalid layer ratio, VoidCnt 233 and InValidCnt 234 per page may be used, respectively.

<Management Method of Write Margin and Invalid Layer Ratio>

(Data Write)

Figure 23:
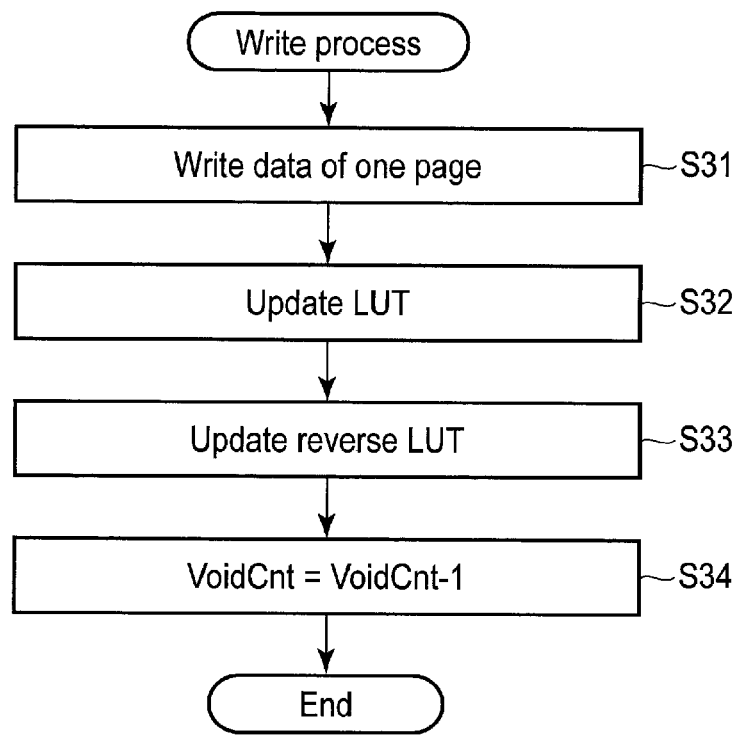
FIG. 23 is a flowchart illustrating an example of the procedure of a write process.

With reference to FIGS. 22A, 22B and 23, a management of a write margin in accordance with a data write operation will be explained. In the following description, for easier understanding, a case where each block in the magnetic domain wall memory 3 includes four pages will be explained. Furthermore, it is assumed that MMLs 10 constituting one block are in the same state.

FIG. 22A illustrates an example of MMLs 10 constituting a block B0, an LUT 231, and a reverse LUT 232 in a state X. The block B0 in the state X is a free block. All layers in a free block are void layers. In other words, all pages in a free block are pages of the void attribute (i.e., void pages). As an initial value of VoidCnt 233, the number of pages that can be written into the block B0 is set. That is, four is set to VoidCnt 233. Every time when writing of data in a unit of a page is performed on the block B0, one is subtracted from VoidCnt 233.

Furthermore, since there is no invalid layer (or Invalid-data page (i.e., invalid page)) in a free block, zero is set to InValidCnt 234. As above, the numbers of pages may be set as VoidCnt 233 and InValidCnt 234.

FIG. 22B illustrates an example of a case where page data LCAa_d of a logical address LCAa is written into a page P0 of the block B0. In this case, the page P0 becomes a page into which Valid-data is stored (i.e., a valid page), and an entry is added to the LUT 232. The entry includes the logical address LCAa, and the block ID B0 and page ID P0 representing a physical address to which the page data LCAa_d is written. Furthermore, in the reverse LUT 232, the logical address LCAa is recorded such that the logical address LCAa is associated with a physical address 0 corresponding to the page P0 of the block B0. Furthermore, VoidCnt 233 is subtracted by one because of the page P0 into which the page data LCAa_d is written. That is, since one is subtracted from four, VoidCnt 233 becomes three.

FIG. 23 is a flowchart of the procedure of a write process performed by the memory controller 2.

Firstly, the memory controller 2 writes page data of one page to a write destination block in the magnetic domain wall memory 3 (step S31). The memory controller 2 updates the LUT 231 such that a physical address indicative of a memory location of the page data in the magnetic domain wall memory 3 is mapped to a logical address corresponding to the written page data (step S32). Furthermore, the memory controller 2 updates the reverse LUT 232 such that the logical address corresponding to the page data is mapped to the physical address indicative of the memory location of the written page data in the magnetic domain wall memory 3 (step S33). Furthermore, the memory controller 2 subtracts one from VoidCnt 233 based on the writing of the page data of one page (step S34).

Through the above, the LUT 231, the reverse LUT 232, and VoidCnt 233 are updated in accordance with the data writing into the magnetic domain wall memory 3.

Note that, in the following description, for easier understanding, at every time when data of a page is written into a block, the page ID increases by one. The increased page ID specifies a page into which next data is to be written. For example, when 0th page data is written into a page of page ID 0 (that is, a page P0) in the block B0 and then, first page data is further written into the block B0, the first page data is written into a page of page ID P1 (that is, a page P1).

Furthermore, relationships between pages included in a block are defined, as in the relationships between layers included in an MML 10, such that a page in a shallower position is referred to as an upper page and a page in a deeper position is referred to as a lower page based on positions of the pages in the depth direction of the block.

(Data Delete)

With reference to FIGS. 24 to 28, a management of a write margin and an invalid layer ratio in accordance with a data deletion operation will be explained. In the magnetic domain wall memory 3, data is deleted in a unit of a page, for example. Deleting data of a page in the magnetic domain wall memory 3 corresponds to erasing an entry including a logical address corresponding to the data (may be referred to as address information) from the LUT 231.

When the magnetic domain wall memory 3 is requested to delete data of a logical address, the memory controller 2 erases an entry including the logical address from the LUT 231. The attribute of an area in which the deleted data is stored (that is, a page) is changed from Valid-data to (1) Invalid-data or (2) Void.

Figure 24:
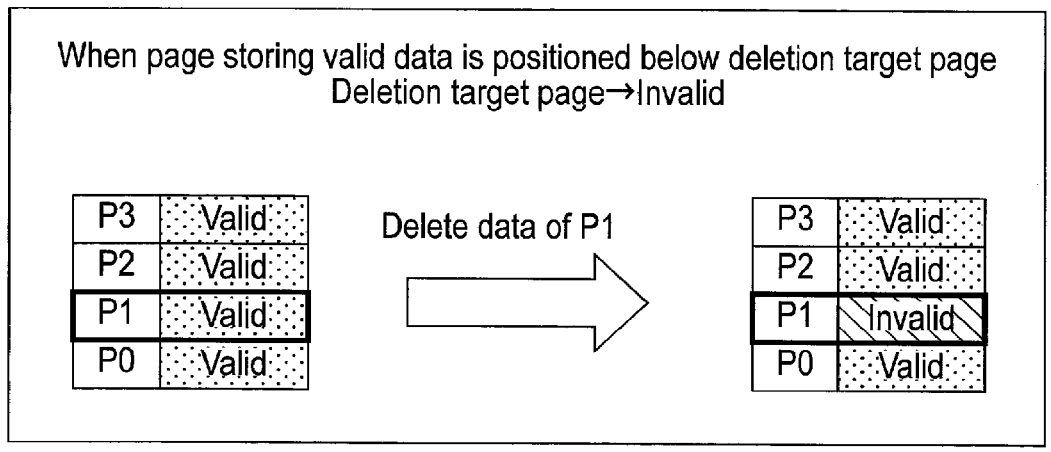
FIG. 24 is a diagram illustrating an example where a page in a block becomes an invalid area when data of the page written into the block is deleted.

FIG. 24 illustrates an example where the attribute of a page P1 into which deleted data was stored changes from Valid-data to Invalid-data. When there is a valid page below the page P1 of the deletion target, the attribute of the page P1 becomes Invalid-data.

Figure 25:
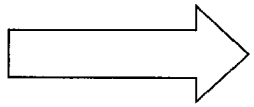
FIG. 25 is a diagram illustrating an example where a page in a block becomes a void area when data of the page written into the block is deleted.

In contrast, FIG. 25 illustrates an example where the attribute of a page P0 into which deleted data was stored changes from Valid-data to Void. When there is no valid page below the page P0 of the deletion target, the attribute of the page P0 becomes Void.

FIGS. 26A and 26B illustrate an example where InValid-Cnt 234 is updated when the attribute of a page, which stored deleted data, becomes Invalid-data. In a state A of FIG. 26A, in a block B0 composed of MMLs 10, data LCAc_d of a logical address LCAc, data LCAb_d of a logical address LCAb, and data LCAa_d of a logical address LCAa are stored in a page P0, a page P1, and a page P2, respectively. Furthermore, the bottom page in the block B0 is a void page. The LUT 231 and the reverse LUT 232 include mapping information of the logical addresses and the physical addresses corresponding to the block B0 in the state A.

When the data LCAb_d of the logical address LCAb is deleted from the block B0 in the state A, as illustrated in FIG. 26B, the memory controller 2 erases an entry including the logical address LCAb from the LUT 231. Then, when there is a valid page below the page P1 in the block B0 (that is, in the MMLs 10 constituting the block B0), the memory controller 2 determines that the attribute of the page P1 is Invalid-data. On the other hand, when there is no valid page below the page P1, the memory controller 2 determines that the attribute of the page P1 is Void.

Specifically, the memory controller 2 determines whether the LUT 231 includes an entry containing a page ID of the block B0 that is less than the page ID P1. That is, the memory controller 2 determines whether there is an entry corresponding to data written into the block B0 prior to the deleted data LCAb_d. When the LUT 231 includes an entry containing a page ID of the block B0 that is less than the page ID P1, the memory controller 2 determines that the attribute of the page P1 is Invalid-data. On the other hand, when the LUT 231 includes no entry containing a page ID of the block B0 that is less than the page ID P1, the memory controller 2 determines that the attribute of the page P1 is Void.

In the example of FIG. 26B, the LUT 231 includes an entry containing a page ID P0 of the block B0 that is less than the page ID P1. Thus, the memory controller 2 determines that the attribute of the page P1 is Invalid-data and adds one to InValidCnt 234 to update InValidCnt 234 from zero to one. Note that, in a case where data is deleted, the memory controller 2 does not update the reverse LUT 232 when the attribute of a page changes to Invalid-data, and updates the reverse LUT 232 when the attribute of a page changes to Void. In the example of FIG. 26B, since the attribute of the page P1, which stored the deleted data, changes to Invalid-data, the reverse LUT 232 is not updated.

FIGS. 27A and 27B illustrate an example where VoidCnt 233 and InValidCnt 234 are updated when the attribute of a page, which stored deleted data, becomes Void.

In a state B illustrated in FIG. 27A, in a block B0 composed of MMLs 10, data LCAb_d of a logical address LCAb is stored in a page P1. A page P0 is a void page and a page P2 is an invalid page. Furthermore, the bottom page in the block B0 is a void page. Thus, two is set as VoidCnt 233 and one is set as InValidCnt 234 in accordance with the block B0 in the state B.

The LUT 231 and the reverse LUT 232 include mapping information of the logical addresses and the physical addresses corresponding to the block B0 in the state B.

When the data LCAb_d of the logical address LCAb is deleted from the block B0 in the state B, as illustrated in FIG. 27B, the memory controller 2 erases an entry including the logical address LCAb from the LUT 232. Then, the memory controller 2 determines that the attribute of the page P1 in which the data LCAb_d was stored is Invalid-data or Void. Since the LUT 231 include no entry containing a page ID of the block B0 that is less than the page ID P1, the memory controller 2 determines that the attribute of the page P1 is Void, and adds one to VoidCnt 233 to update VoidCnt 233 from two to three. As described above, the memory controller 2 does not update the reverse LUT 232 when the attribute of a page changes to Invalid-data, and updates the reverse LUT 232 when the attribute changes to Void. In the example of FIG. 27B, since the attribute of the page P1 changes to Void, the memory controller 2 updates the reverse LUT 232. More specifically, the memory controller 2 erases the logical address LCAb associated with the page P1 from the reverse LUT 232.

When the attribute of a page changes to Void, the memory controller 2 determines whether one or more upper pages continuous from the page (that is, one or more upper pages adjacent to the page) change to void pages. Specifically, when the one or more upper pages are invalid pages, the memory controller 2 determines that the attributes of the one or more upper pages change from Invalid-data to Void. On the other hand, when the one or more upper pages are not Invalid pages, that is, when the one or more upper pages are valid pages, the memory controller 2 determines that the attributes of the one or more upper pages do not change.

In the example of FIG. 27B, when the attribute of the page P1 changes to Void, the memory controller 2 determines whether an upper page P2 that is continuous from the page P1 changes to a void page. Specifically, the memory controller 2 determines whether the LUT 231 includes an entry containing a page ID P2 of the block B0 that is greater than the page ID P1 by one. When the LUT 231 does not include an entry containing the page ID P2 of the block B0 that is greater than the page ID P1 by one, since the page P2 is an invalid page, the memory controller 2 determines that the attribute of the page P2 changes from Invalid-data to Void. On the other hand, when the LUT 231 includes an entry including the page ID P2 of the block B0 that is greater than the page ID P1 by one, since the page P2 is a valid page, the memory controller 2 determines that the attribute of the page P2 does not change.

As illustrated in FIG. 27B, the LUT 231 does not include an entry containing the page ID P2 of the block B0 that is greater than the page ID P1 by one, the memory controller 2 determines that the attribute of the page P2 is Void, adds one to VoidCnt 233 to update VoidCnt 233 from three to four, and subtracts one from InValidCnt 234 to update InValidCnt 234 from one to zero. Furthermore, since the attribute of the page P2 changes to Void, the memory controller 2 erases the logical address LCAa associated with the page P2 from the reverse LUT 232.

When the attribute of the page P2 changes to Void and there is an upper page that is continuous from the page P2, in a similar manner to the above-mentioned method with respect to the page P2, whether the upper page changes to a void page is determined. The determination is repeated until there is no upper page above the pages the attributes of which have changed to Void in the block B0, or an upper page continuous from the page the attribute of which has changed to Void is a Valid page. When the memory controller 2 determines that a page changes to a void page by the determination, the memory controller 2 erases the logical address associated with the page from the reverse LUT 232.

Figure 28:
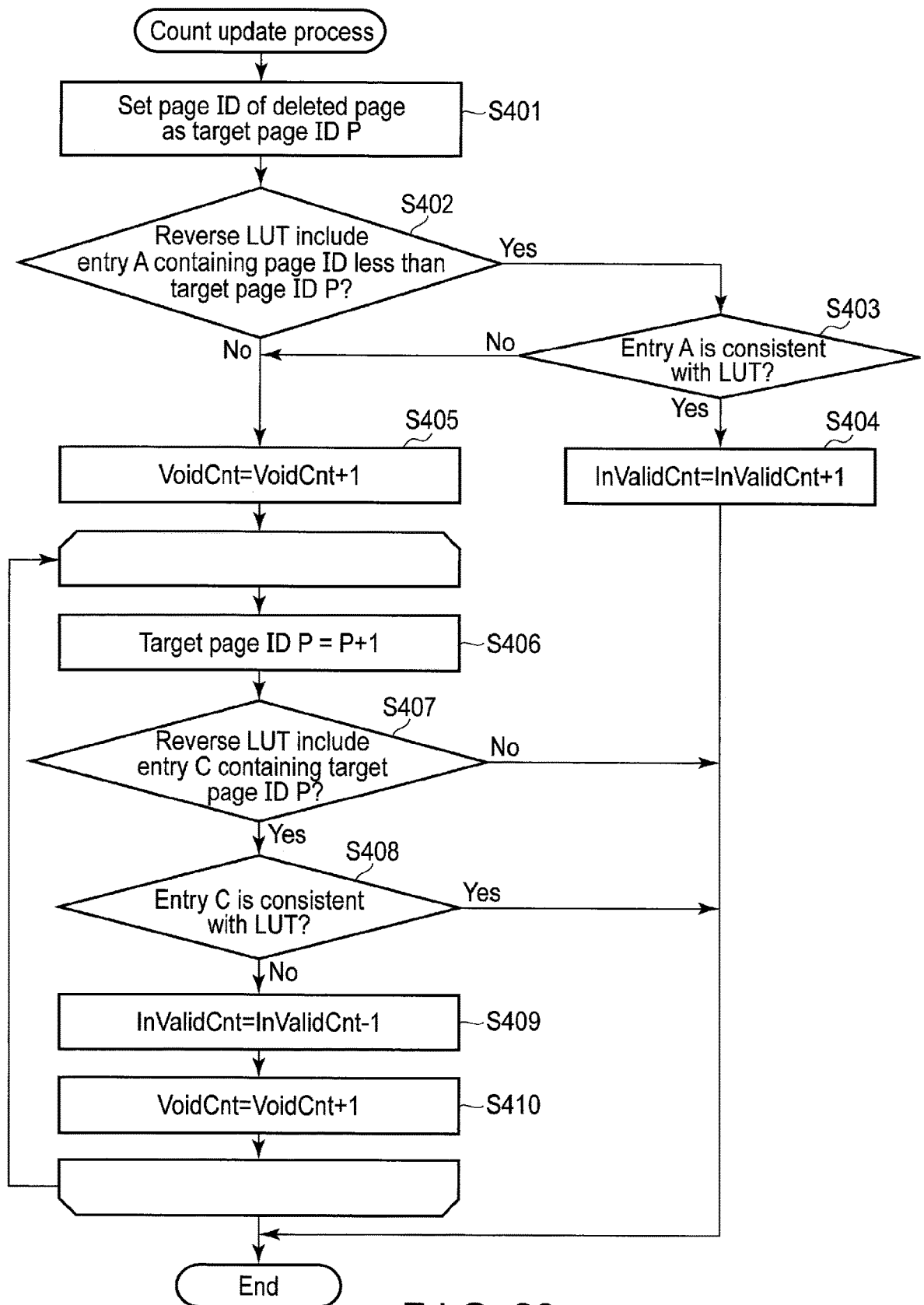
FIG. 28 is a flowchart illustrating an example of the procedure of a count update process.

With reference to a flowchart of FIG. 28, an example of the procedure of an update process of VoidCnt 233 and InValidCnt 234 performed when one page in a block is deleted will be explained. Here, for easier understanding, a case where the block from which a page is deleted is a block B0 is exemplified.

Firstly, the memory controller 2 sets a page ID of the deleted page as a target page ID P (step S401). Then, the memory controller 2 determines whether the reverse LUT 232 corresponding to the block B0, which contains the deleted page, includes an entry containing a page ID that is less than the target page ID P (step S402). That is, the memory controller 2 determines whether there are candidates to determine whether there is a valid page below the deleted page.

When the reverse LUT 232 includes an entry containing a page ID less than the target page ID P (hereinafter, referred to as an entry A) (YES in step S402), the memory controller 2 determines whether the entry A retrieved from the reverse LUT 232 is consistent with the LUT 231 (step S403). That is, it is determined whether a page whose page ID is less than the target page ID P is a valid page. As mentioned above, when data is deleted from a page, an entry including a logical address of the data is erased from the LUT 231. Furthermore, when the attribute of the page is changed to Invalid-data, the reverse LUT 232 is not updated, and on the other hand, when the attribute is changed to Void, the reverse LUT 232 is updated to erase the logical address associated with the page.

The memory controller 2 uses the LUT 231 and the reverse LUT 232 to confirm whether information indicated by the entry A of the reverse LUT 232 is consistent with the latest information indicated by the LUT 231. When the information indicated by the entry A of the reverse LUT 232 matches the latest information indicated by the LUT 231, it is understood that the entry A is consistent with the LUT 231. On the other hand, when the information indicated by the entry A of the reverse LUT 232 and the latest information indicated by the LUT 231 do not match, it is understood that the entry A is inconsistent with the LUT 231.

Specifically, the memory controller 2 uses a logical address included in the entry A (that is, an entry including a page ID that is less than the target page ID P in the reverse LUT 232) to retrieve an entry including the logical address (hereinafter referred to as entry B) from the LUT 231. Then, the memory controller 2 determines whether a block and a page indicated by the entry A match a block and a page indicated by the entry B. The entry A obtained from the reverse LUT 232 indicates a page ID of one page in the block B0. The entry B obtained from the LUT 231 indicates a block ID and a page ID.

For example, when the block ID indicated in the entry B is B0, and the page ID indicated by the entry A matches the page ID indicated by the entry B, the memory controller 2 determines that the block and the page indicated by the entry A match the block and the page indicated by the entry B. In that case, the memory controller 2 determines that the entry A of the reverse LUT 232 is consistent with the LUT 231.

On the other hand, when the block ID indicated in the entry B is not B0, or when the block ID indicated in the entry B is B0 but the page ID indicated by the entry A is different from the page ID indicated by the entry B, the memory controller 2 determines that the block and the page indicated by the entry A do not match the block and the page indicated by the entry B. In that case, the memory controller 2 determines that the entry A of the reverse LUT 232 is inconsistent with the LUT 231.

When the entry A of the reverse LUT 232 is consistent with the LUT 231 (YES in step S403), the deleted page changes from a valid page to an invalid page, and thus, the memory controller 2 adds one to InValidCnt 234 (step S404) and ends the process.

On the other hand, when the reverse LUT 232 does not include an entry containing a page ID that is less than the target page ID P (NO in step S402), or when there is the entry A containing a page ID that is less than the target page ID P (YES in step S402) but the entry A is inconsistent with the LUT 231 (NO in stop S403), the deleted page changes from a valid page to a void page, and thus, the memory controller 2 adds one to VoidCnt 233 (step S405). Furthermore, in the reverse LUT 232, the logical address associated with the deleted page is erased.

Then, the memory controller 2 adds one to the target page ID P (step S406). Then, the memory controller 2 determines whether the reverse LUT 232 includes an entry containing the target page ID P (step S407). That is, whether there is an upper page continuous from the page (P−1) the attribute of which has changed to Void is determined. For example, when the target page ID P is equal to or less than the maximum page ID associated with the logical address in the reverse LUT 232, or when the target page ID P is equal to or less than the number of pages included in the block, there is a possibility that a page of the target page ID P exists. When the reverse LUT 232 does not include an entry containing the target page ID P (NO in step S407), the process ends.

When the reverse LUT 232 includes an entry containing the target page ID P (hereinafter, referred to as an entry C) (YES in step S407), the memory controller 2 determines whether the entry C acquired from the reverse LUT 232 is consistent with the LUT 231 (step S408). That is, whether the page of the target page ID P is a valid page is determined.

Specifically, as in step S403, the memory controller 2 uses a logical address included in the entry C to retrieve an entry including the logical address (hereinafter, referred to as entry D) from the LUT 231. Then, the memory controller 2 determines whether a block and a page indicated by the entry C match a block and a page indicated by the entry D. The entry C acquired from the reverse LUT 232 indicates a page ID of one page in the block B0. The entry D acquired from the LUT 231 indicates a block ID and a page ID.

For example, when the block ID indicated in the entry D is B0, and the page ID indicated by the entry C and the page ID indicated by the entry D match, the memory controller 2 determines that the block and the page indicated by the entry C match the block and the page indicated by the entry D. In that case, the memory controller 2 determines that the entry C of the reverse LUT 232 is consistent with the LUT 231.

On the other hand, when the block ID indicated in the entry D is not B0, or when the block ID indicated in the entry D is B0 but the page ID indicated by the entry C is different from the page ID indicated by the entry D, the memory controller 2 determines that the block and the page indicated by the entry C do not match the block and the page indicated by the entry D. In that case, the memory controller 2 determines that the entry C of the reverse LUT 232 is inconsistent with the LUT 231.

When the entry C of the reverse LUT 232 (that is, an entry including the target page ID P in the reverse LUT 232) is consistent with the LUT 231 (YES in step S408), the process ends.

On the other hand, when the reverse LUT 232 includes the entry C containing the target page ID P (YES in step S407) but the entry C is inconsistent with the LUT 231 (NO in step S408), the page of the target page ID P is an invalid page and the attribute of the page changes to Void, and thus, the memory controller 2 subtracts one from InValidCnt 234 (step S409) and adds one to VoidCnt 233 (step S410), and the process returns to step S406. When the process returns to step S406, whether there is an upper page (that is, a page (P+1)) continuous from the page P in the block and whether the attribute of the upper page changes to Void are determined. Note that in the reverse LUT 232, a logical address associated with a page attribute of which has changed to Void (a page of the target page ID P) is erased.

Through the above, when one page in a block is deleted, VoidCnt 233 and InValidCnt 234 may be updated.

In the example described above, a case using a rule that at each time when data of a page is written into a block, the page ID indicative of a page into which next data is to be written is increased by one is explained. When this rule is used, it is easily determined whether a page having the attribute of Valid-data (a valid page) exists above or below a page in a block based on page IDs in entries recorded in the reverse LUT 232 and the LUT 231. For example, whether the attribute of a deleted page (i.e., a page storing deleted data) changes to Invalid-data or Void can be determined by simply checking if there is a valid page below the deleted page using the reverse LUT 232 and the LUT 231. However, any rule to manage blocks, pages, layers, and the like may be used instead of the above rule as long as the above determination can be performed.

Through the above management method, parameters such as VoidCnt 233, InValidCnt 234, an invalid layer depth, and the like are updated per block in accordance with writing of data and deletion of data. Note that a write margin and an invalid layer ratio of each block have a proportional relationship with VoidCnt 233 and InValidCnt 234, respectively. Thus, VoidCnt 233 and InValidCnt 234 may be used in substitution for the write margin and the invalid layer ratio, respectively. Furthermore, instead of a valid layer depth of a block, a valid page depth indicative of a depth of the deepest valid page in the block may be used, and instead of a total layer depth of the block, the number of pages in the block may be used.

(Compaction)

The memory controller 2 selects a source block and a destination block for compaction in order that a write margin of the magnetic domain wall memory 3 efficiently increases by a compaction operation.

(Selection of Source Block)

The memory controller 2 preferentially selects, for example, a block whose invalid layer ratio is large from blocks in the magnetic domain wall memory 3 as a source block. Furthermore, the memory controller 2 preferentially selects, for example, a block whose valid layer depth is deep from blocks with the same invalid layer ratio as a source block.

Figure 29:
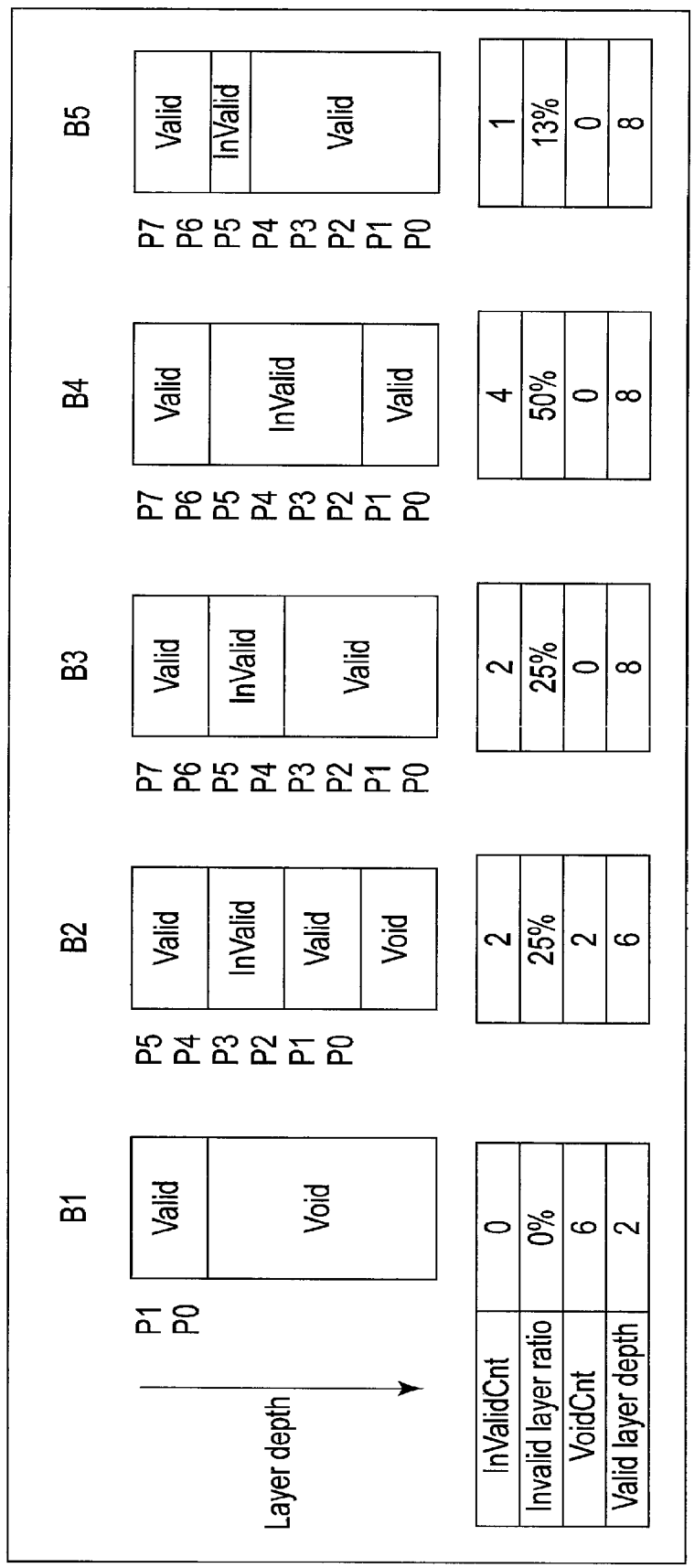
FIG. 29 is a diagram illustrating an example of a block to be selected as a source block of compaction.

With reference to FIG. 29, an example where a source block of compaction is selected will be explained. Here, a case where one source block is selected from five blocks B1 to B5 in the magnetic domain wall memory 3 will be explained. The number of pages in each block is eight. The calculation method of VoidCnt 233 and InValidCnt 234 is described above.

An invalid layer ratio is calculated by dividing InValidCnt 234 by eight that is the number of pages in each block. As the invalid layer ratio, InValidCnt 234 may be used as it is. Furthermore, as a valid layer depth, a valid page depth which is calculated by subtracting VoidCnt 233 from eight that is the number of pages in the block is used.

Within the blocks B1 to B5, a block with the maximum invalid layer ratio is the block B4 whose invalid layer ratio is 50%. Thus, the memory controller 2 selects the block B4 as a source block. When the compaction is performed using the block B4 as a source block, only data in areas corresponding to valid pages in the block B4 is copied to a destination block. Areas corresponding to invalid pages in the block B4 become available by the compaction. Thus, the bigger the invalid layer ratio of a block selected as a source block (that is, the area of Invalid-data in the block), the larger size of a writable area (a write margin) is obtained by performing one compaction operation.

If a source block is selected from the blocks B1, B2, B3, and B5 other than the block B4, the blocks with the maximum invalid layer ratio are the blocks B2 and B3 whose invalid layer ratio is 25%. In that case, the memory controller 2 selects the blocks B2 and B3 as candidates of a source block.

When there are several blocks with the maximum invalid layer ratio, the memory controller 2 preferentially selects a block with a deeper valid layer depth as a source block. Since the valid layer depth of the block B2 is six and the valid layer depth of the block B3 is eight, the memory controller 2 selects the block B3 with the deeper valid layer depth as a source block.

By preferentially selecting a block with a deeper valid layer depth as a source block, a block with a lesser write margin can be selected preferentially as a source block. That is, selecting a block with a deeper valid layer depth corresponds to selecting a block with a lesser write margin (or lesser VoidCnt 233).

(Selection of Destination Block)

As a destination block, the memory controller 2 selects one of two blocks including:

(1) A block that does not include an area of Invalid-data but includes one or more void areas whose size is equal to or larger than the size of one or more areas of Valid-data in a source block (that is, void layers the number of which is equal to or greater than the number of valid layers in a source block); and (2) a free block.

The memory controller 2 performs a compaction operation of writing data, which is stored in each of one or more valid layers in a source block, into a destination block. In both cases where (1) or (2) is selected as a destination block, the destination block does not include an area of Invalid-data, and thus, a writable area (a write margin) in the magnetic domain wall memory 3 increases after performing the compaction operation. Furthermore, when a free block shown as (2) is selected, data in the source block is written into the free block, and thus, a refresh effect that prevents memory deterioration of data with time lapse from writing of the data into memory cell(s) can be expected.

Note that data in a source block may be copied to several destination blocks. In that case, for example, when a sum of the sizes of void areas (or a sum of the numbers of void layers) in two blocks is equal to or greater than the size of areas of valid-data (or the number of valid layers) in the source block, the two blocks may be selected as destination blocks.

The memory controller 2 performs a compaction operation using the source block and the destination block selected as above. At that time, the LUT 231, the reverse LUT 232, VoidCnt 233, and InValidCnt 234 of the destination block are each updated in accordance with writing of Valid-data in the source block into the destination block. When all the Valid-data in the source block is copied (written) to the destination block, the source block becomes a free block.

Note that, when an error occurs in the Valid-data read from the source block, the Valid-data in which the error is corrected by an error correction process is written into the destination block. That is, the error correction process may be performed in parallel with the compaction process.

<Selection of Source Block in Consideration of Overprovisioning>

A storage device whose overprovisioning ratio is X % means a storage device having a user capacity and a storage capacity (an overprovisioning capacity) that is X % of the user capacity. A difference between the user capacity and a physical size (implemented size) is the overprovisioning capacity and a ratio of the overprovisioning capacity to the user capacity is the overprovisioning ratio.

A worst case scenario when data is written into a storage device is, as illustrated in FIG. 30, a state where all blocks included in the storage device have an invalid layer ratio corresponding to the X % overprovisioning ratio. In the above-mentioned method of selecting a source block for a compaction operation on the magnetic domain wall memory 3, a source block (or source block candidates) is selected from a great number of block candidates while a storage capacity being used increases. The block candidates are blocks other than free blocks in the magnetic domain wall memory 3. A process amount used to compare invalid layer ratios or valid layer depths between block candidates may possibly be increased when the storage capacity being used (the used capacity) increases, and thus, a time required to select a source block may be longer.

In that case, in order to shorten a time required to select a source block (that is, in order to increase a selection speed of a source block), the memory controller 2 may select a source block in consideration of the overprovisioning ratio and the used capacity. For example, when the used capacity exceeds a specific threshold value, or when a ratio of the used capacity to the user capacity or the physical size exceeds a specific threshold value, the memory controller 2 selects a block whose invalid layer ratio is equal to or greater than the overprovisioning ratio (more specifically, a block including MMLs 10 whose invalid layer ratio is equal to or greater than the overprovisioning ratio) as the source block. Alternatively, a block including MMLs 10 in which a ratio of invalid layers and void layers to all layers in the MMLs 10 is equal to or greater than the overprovisioning ratio (more specifically, a block including MMLs 10 each having a ratio of invalid layers and void layers to all layers is equal to or greater than the overprovisioning ratio) may be selected as the source block.

<Self-Compaction by Read Operation>

When the uppermost layer of an MML 10 is an invalid layer, a write margin of the MML 10 can be increased by compaction using only a read operation to read data from the invalid layer.

FIG. 31 illustrates an example of performing compaction using only a read operation on an MML 10 that includes an invalid layer as the uppermost layer. The memory controller 2 performs one or more read operations on the MML 10 that includes one or more invalid layers 661 continuous from the uppermost layer. The number of the one or more read operations corresponds to the number of the one or more invalid layers 661. By performing the read operations, valid layers 662 in the MML 10 are shifted to an area top of which is the uppermost layer. Shifting the valid layers 662 to the area top of which is the uppermost layer may be referred to as placing the valid layers 662 at the head of the MML 10.

Furthermore, layers below the shifted valid layers 62 are void layers 663. Thus, the compaction using only read operations increases the write margin by an amount corresponding to the void layers 663. Note that data (Invalid-data) read by the read operations is not sent to a data bus but is discarded. Thus, the write margin can be increased without using a data bus. Data read performed without sending data to a data bus may be referred to as self-read.

As a specific example, a case where the compaction is performed on a source block that includes an invalid page as the uppermost page with reference to FIGS. 32A, 32B, 32C, 33A, 33B, 33C, and 33D. The memory controller 2 selects a block composed of MMLs 10 in which one or more layers continuous from the uppermost layer are invalid layers, that is, a block in which one or more pages continuous from the uppermost page are invalid pages. Then, the memory controller 2 performs read operations on the block to read the one or more layers (pages).

In the example of FIG. 32A, the source block includes valid pages P0, P1, P2, and P3 that store data LCAd_d of a logical address LCAd, data LCAc_d of a logical address LCAc, data LCAb_d of a logical address LCAb, and data LCAa_d of a logical address LCAa, respectively. In the source block, InValidCnt 234 is zero, VoidCnt 233 is zero, the valid layer depth is four, and the write margin is zero (=0%).

When deletion of the data LCAa_d stored in the uppermost page P3 in the source block is requested, as illustrated in FIG. 32B, an entry including the logical address LCAa of the data LCAa_d is erased from the LUT 231. In response the erasure, the uppermost page P3 changes from a valid page to an invalid page, and one is added to InvalidCnt 234 to increase it from zero to one.

When InValidCnt 234 increases, the memory controller 2 performs one or more read operations in a unit of a page on the source block. The number of times of the one or more read operations corresponds to the incremental number of InvalidCnt 234. In this example, the memory controller 2 performs one read operation on the source block (that is, a read operation for one page), that is, the memory controller 2 performs a read operation to read the uppermost invalid page.

Through the above, as illustrated in FIG. 32C, the uppermost invalid page is erased from the source block, and the three valid pages are shifted to one-upper positions, respectively. Thus, the valid pages are placed at the head of the source block.

Pages exist below the shifted valid pages become void pages. Thus, by performing the compaction using only read operations, one void page is newly created and the write margin is increased by an amount corresponding to the void page. Furthermore, one is subtracted from InValidCnt 234 to decrease it from one to zero, and one is added to VoidCnt 233 to increase it from zero to one. Furthermore, the valid layer depth decreases from four to three by subtracting one from it, and the write margin increases from zero (=0%) to one (=25%) by adding one to it.

As above, since the number of times of read operations that are performed on the source block corresponds to the incremental number of InValidCnt 234, the uppermost page that is an invalid page is erased from the source block. Thus, the write margin of the block can be increased.

Furthermore, in the example of FIG. 33A, a source block is composed of valid pages P0 and P2 storing data LCAc_d of a logical address LCAc and data LCAa_d of a logical address LCAa, respectively, an invalid page P1 storing data LCAb_d, and the lowest void page. For the source block, InValidCnt 234 is one, VoidCnt 233 is one, the valid layer depth is three, and the write margin is one (=25%).

When deletion of the data LCAa_d stored in the uppermost page P2 in the source block is requested, as illustrated in FIG. 33B, an entry including the logical address LCAa of the data LCAa_d is erased from the LUT 231. In response to the erasure, the uppermost page P2 changes from a valid page to an invalid page, and one is added to InValidCnt 234 to increase from one to two.

When InValidCnt 234 increases, the memory controller 2 performs one or more read operations in a unit of a page on the source block. The number of times of the one or more read operations corresponds to the incremental number of InValidCnt 234. In this example, the memory controller 2 performs one read operation on the source block, that is, the memory controller 2 performs a read operation to read the uppermost invalid page P2. Through the above, as illustrated in FIG. 33C, the invalid page P1 storing the data LCAb_d and the valid page P0 storing the data LCAc_d are shifted to one-upper positions, respectively, from the positions indicated in FIG. 33B. Furthermore, the memory controller 2 erases the logical address LCAa associated with the read invalid page P2 from the reverse LUT 232.

A page below the shifted valid page P0 becomes a void page. Thus, by performing the compaction using only read operations, one void page is newly created and the write margin increases by an amount corresponding to the void page. Furthermore, one is subtracted from InValidCnt 234 to decrease it from two to one, and one is added to VoidCnt 233 to increase it from one to two. Furthermore, the valid layer depth decreases from three to two, and the write margin increases from one (=25%) to two (=50%).

Then, the memory controller 2 refers to the reverse LUT 232 and the LUT 231 to determine whether the uppermost page is an invalid page. Specifically, the memory controller 2 specifies the uppermost page of the pages with which logical addresses are associated in the reverse LUT 232, and retrieves the logical address associated with the specified page. Then, the memory controller 2 determines whether the LUT 231 includes an entry containing the retrieved logical address. When the LUT 231 does not include an entry containing the retrieved logical address, the memory controller 2 performs one read operation on the source block. When the LUT 231 includes an entry containing the retrieved logical address, the memory controller 2 does not perform a read operation.

In the reverse LUT 232 illustrated in FIG. 33C, the page P1 with which the logical address LCAb is associated is specified, and the logical address LCAb is retrieved. Then, since the LUT 231 does not include an entry containing the logical address LCAb, one read operation on the source block is performed. That is, a read operation to read the uppermost invalid page P1 is performed.

As a result, as illustrated in FIG. 33D, the uppermost invalid page P1 is erased from the source block and the valid page P0 is shifted to one-upper position. Thus, in the source block, the valid page is placed at the head of the block. Furthermore, the memory controller 2 erases the logical address LCAb associated with the read invalid page P1, from the reverse LUT 232.

Pages below the shifted valid page P0 become void pages. Thus, by performing the compaction using only read operations, one void page is newly created and the write margin increases by an amount corresponding to the void page. One is subtracted from InValidCnt 234 to decrease it from one to zero, and one is added to VoidCnt 233 to increase it from two to three. Furthermore, the valid layer depth decreases from two to one, and the write margin increases from two (=50%) to three (=75%).

As above, the number of times of read operations performed on the source block corresponds to the incremental number of InValidCnt 234. When an invalid page becomes the uppermost page in the source block by the performed read operations, a read operation is further performed. Thus, the uppermost page as an invalid page is erased from the source block, and the write margin of the block can be increased.

Figure 34:
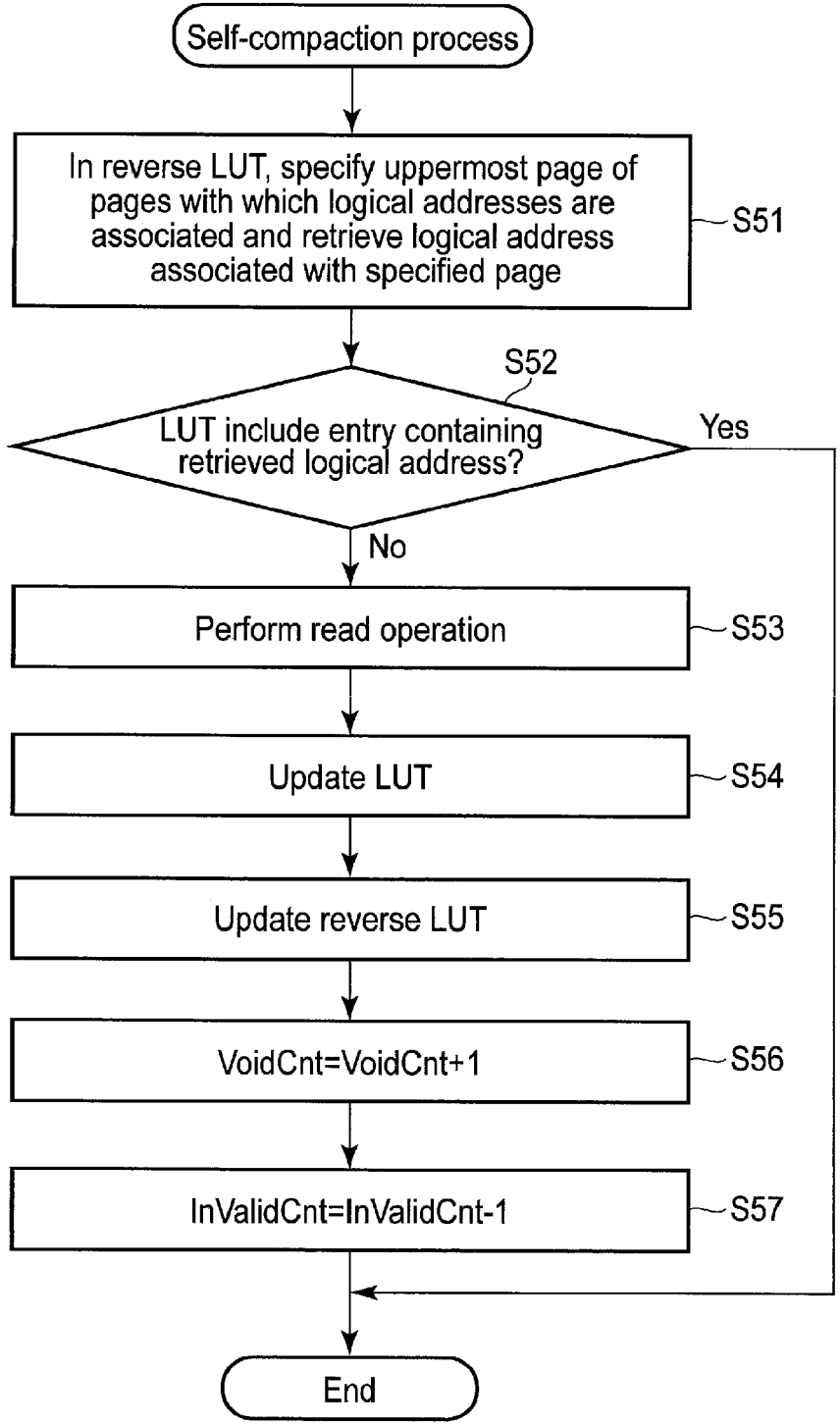
FIG. 34 is a flowchart of an example of the procedure of a self-compaction process using only read operations.

The flowchart of FIG. 34 illustrates an example of the procedure of a self-compaction process using only read operations. In this example, a case where the self-compaction process is performed on one target block (a source block) will be explained. In the self-compaction process, the reverse LUT 232 to manage the source block and the LUT 231 to manage all blocks in the magnetic domain wall memory 3 may be used.

Firstly, the memory controller specifies the uppermost page of pages with which logical addresses are associated in the reverse LUT 232 corresponding to the source block and retrieves the logical address associated with the specified page (step S51). Then, the memory controller 2 determines whether the LUT 231 includes an entry containing the retrieved logical address (step S52). When the LUT 231 includes an entry containing the retrieved logical address (YES in step S52), the process ends.

When the LUT 231 does not include an entry containing the retrieved logical address (NO in step S52), the memory controller 2 performs a read operation of one page on the source block (step S53). In accordance with the data read by the read operation, the memory controller 2 updates the LUT 231 (step S54) and updates the reverse LUT 232 (step S55). Furthermore, the memory controller 2 adds one to VoidCnt 233 (step S56) and subtracts one from InValidCnt 234 (step S57).

Through the above, the uppermost page as an invalid page is erased from the source block, and the write margin can be increased. Since data is stored in each block by a first-in last-out method, when one or more read operations on the source block are performed, one or more invalid pages continuous from the uppermost page of the source block can be erased without copying data, which is read by the read operations, to another block.

<Compaction where Source Block and Destination Block are Same>

The memory controller 2 may select a selected source block as a destination block. In that case, the memory controller 2 stores only Valid-data in the block, which is selected as the source block and the destination block, in the data buffer 25 or the like, and writes (writes back) the stored Valid-data in the block.

FIG. 35 illustrates an example of a compaction operation on a block selected as both a source block and a destination block. In the initial state, the block is composed of three valid pages, four invalid pages, and one void page. When a first read operation is performed on the block, data of the uppermost page as the valid page is read and all pages are shifted to one-upper positions, respectively. Thus, the lowest page becomes a void page. The read data is Valid-data d0, and thus, the Valid-data d0 is stored in the data buffer 25.

Then, when each of second to fifth read operations is performed, data of the uppermost page as the invalid page is read, and all pages are shifted to one-upper positions, respectively, and the lowest page becomes a void page. Thus, after the fifth read operation, as illustrated in FIG. 35, a state where Valid-data d5 is stored in the uppermost page appears.

Then, when a sixth read operation is performed, Valid-data d5 of the uppermost page is read, and all pages are shifted to one-upper positions, respectively. Thus, the lowest page becomes a void page. The read Valid-data d5 is stored in the data buffer 25.

The last Valid-data d6 in the block is not read, and is stored in the block as it is. Then, Valid-data d0 and Valid-data d5 stored in the data buffer 25 are written back into the block.

Through the above, the compaction can be performed without selecting a destination block that is different from a source block, that is, without preparing a block to be selected as a destination block. Thus, in the block selected as a source block and a destination block, an invalid area can be erased. Furthermore, since Valid-data is written back into the block, a refresh effect that prevents data deterioration with time can be expected.

Note that, in the above-described example, an example where the lowest Valid-data (the Valid-data d6 in FIG. 35) is left in the block is explained; however, all Valid-data including the lowest Valid-data in the block may be read and stored in the data buffer 25, and all the Valid-data may be written back into the block. Therefore, a refresh effect can be expected to all the Valid-data.

As explained above, the first embodiment is effective to control a nonvolatile memory in which writing and reading of data are performed by a last-in first-out method. The nonvolatile memory 3 includes first blocks each including MMLs 10 and performs writing and reading of data for each block by a last-in first-out method by shifting, in a unit of a layer, data portions stored in a plurality of layers, respectively, in a first direction from a top layer to a last layer or in a second direction opposite to the first direction. The MMLs 10 includes the plurality of layers. The plurality of layers include at least one of a valid layer storing data associated with a logical address and an invalid layer storing data that are not associated with a logical address. In a position adjacent to an invalid layer in the first direction, a valid layer exists. The memory controller 2 selects a source block for a compaction process from the first blocks based on a ratio of invalid layers to the plurality of layers (that is, an invalid layer ratio) in each of the first blocks.

By selecting a source block based on the ratio, an increasing amount of a write margin in the nonvolatile memory 3 by the compaction process can be increased effectively.

Second Embodiment

Error correction of data read from a nonvolatile memory 3 in a memory system 1 will be explained as a second embodiment. The error correction may be performed in a case where data (Valid-data) is read in the compaction explained in the first embodiment, or a case where data is read in accordance with a read request from the host 4.

The configuration of the memory system 1 according to the second embodiment is similar to that of the memory system 1 of the first embodiment. In the following description, elements different from that of the first embodiment will be mainly explained.

FIG. 37 illustrates a memory system 1 of the second embodiment. In the memory system 1, as compared to the memory system 1 of the first embodiment, a shift error table 235 used by the controller 23 is added. The shift error table 235 includes information to correct a shift error. Furthermore, the shift error table 235 is managed in a unit of a block. Details of the shift error table 235 will be explained later with reference to FIG. 54 and the like.

Errors occurring in the nonvolatile memory 3 (for example, a magnetic domain wall memory) in the memory system 1 include (I) a random error and (II) a shift error. A random error occurs by (I-A) a reversal of magnetization through a time lapse after the setting of magnetization, or (I-B) magnetization failure caused by setting to an erroneous magnetization in a memorization process.

<Random Error>

FIG. 37 illustrates a case where a compaction operation is performed on a block in which a random error (I-A) caused by a reversal of magnetization through a time lapse after the setting of magnetization is occurred.

As illustrated in FIG. 37, at time t0, no error occurs in a source block and a destination block. Then, at time t1 after t0, random errors caused by a reversal of magnetization are occurred in both the source block and the destination block. Because of the random errors caused by the reversal of magnetization, bit reverse errors occur in data of each block.

When the compaction is performed using the source block and the destination block at time t1, firstly, Valid-data s1 and Valid-data s2 are read from the source block. An error correction process is performed on each of the read Valid-data s1 and Valid-data s2 by using an ECC included in each data. Thus, the bit reverse errors occurring in the read Valid-data s1 and Valid-data s2 are corrected.

Then, the Valid-data s1 and the Valid-data s2 after the error correction are written into the destination block. Since the source block can be reused as a free block, a write margin can be increased by an amount of an invalid area included in the source block.

On the other hand, Valid-data d0 stored in the destination block before the compaction operation is pushed into (shifted to) a lower layer in the destination block when the Valid-data s1 and the Valid-data s2 in the source block are further written into the destination block by the compaction operation. Since the Valid-data d0 stored in the destination block is not read in the compaction operation, the error correction process is not performed on the Valid-data d0. Thus, the Valid-data d0 stored in the destination block is pushed into the lower layer of the destination block without correcting bit reverse errors occurred in the Valid-data d0.

In an area such as Valid-data d0, an amount of errors may increase through a further time lapse, and the errors may be no longer corrected by performing an error correction process using an ECC. That is, the error correction process using the ECC may be unsuccessful.

In the present embodiment, the random error (I-A) caused by the reversal of magnetization can be solved by the compaction. Specifically, the memory controller 2 selects a block in which data is stored for a long period (may be referred to as an old block) as a source block, selects a free block as a destination block, and performs the compaction operation. The memory controller 2 may select a block in which data is stored for a period that is equal to or longer than a threshold value as a source block, or may preferentially select a block in which data is stored for a period longer than periods for which data in other blocks is stored, as a source block.

Methods to specify an old block from the blocks in the nonvolatile memory 3 may include: (a) a method of further adding information indicative of a written time to each entry in the reverse LUT 232 and specifying an old block based on the write times; and (b) a method of preliminarily determining a writing order of the blocks in the nonvolatile memory 3 and specifying a block which comes after a most recently written block based on the writing order, as an old block. In the method of (b), it is assumed that the nonvolatile memory 3 includes three blocks, and the writing order is determined as block IDs 1, 2, and 3 in this order. In that case, at the time when writing of data into the block of block ID 3 is finished, the memory controller 2 specifies the block of block ID 1 as an old block.

By selecting an old block as a source block, a block with higher possibility that random errors caused by reversal of magnetization (that is, bit reverse errors caused by a time lapse) occur can be selected as a source block.

Figure 38:
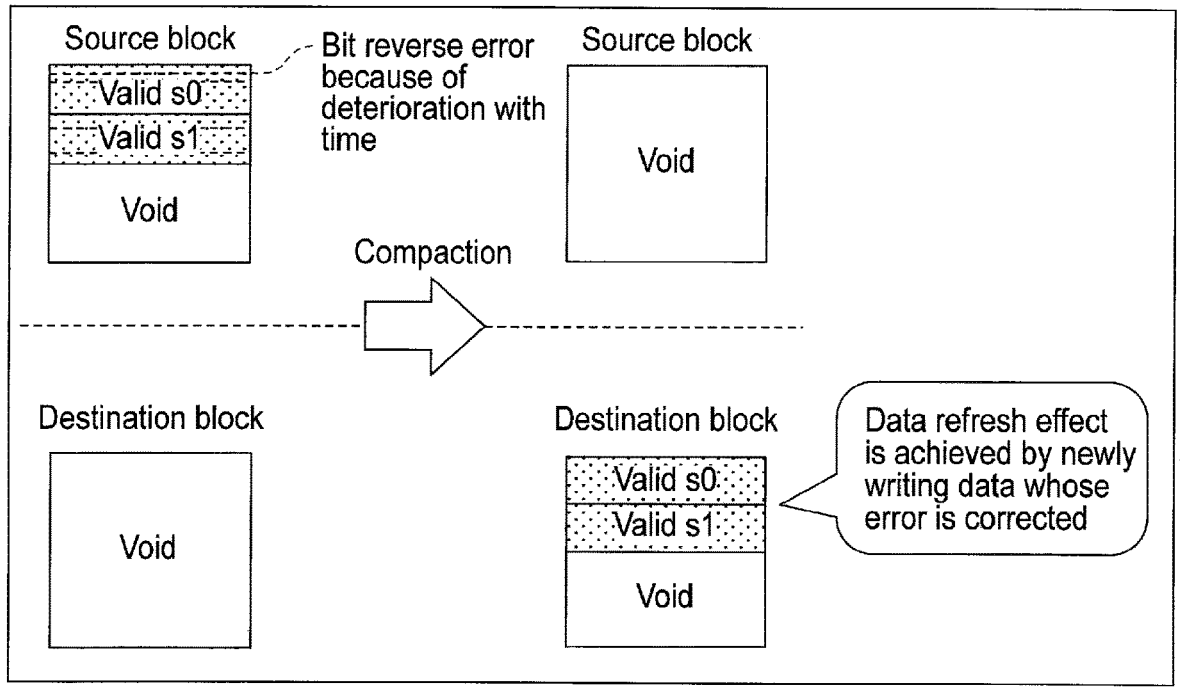
FIG. 38 is a diagram illustrating an example of an effect of compaction when a free block is used as a destination block.

In an example illustrated in FIG. 38, bit reverse errors occur in Valid-data s0 and s1 in a source block, which is an old block, because of deterioration with time. The memory controller 2 reads the Valid-data s0 and s1 from the source block, and performs the error correction process on the read Valid-data s0 and s1. Then, the memory controller 2 writes the Valid-data s0 and s1 after the error correction into a destination block, which is a free block.

Through the above compaction operation, the Valid-data s0 and s1 after the error correction are newly written into the destination block, and thus, a refresh effect can be achieved.

Figure 39:
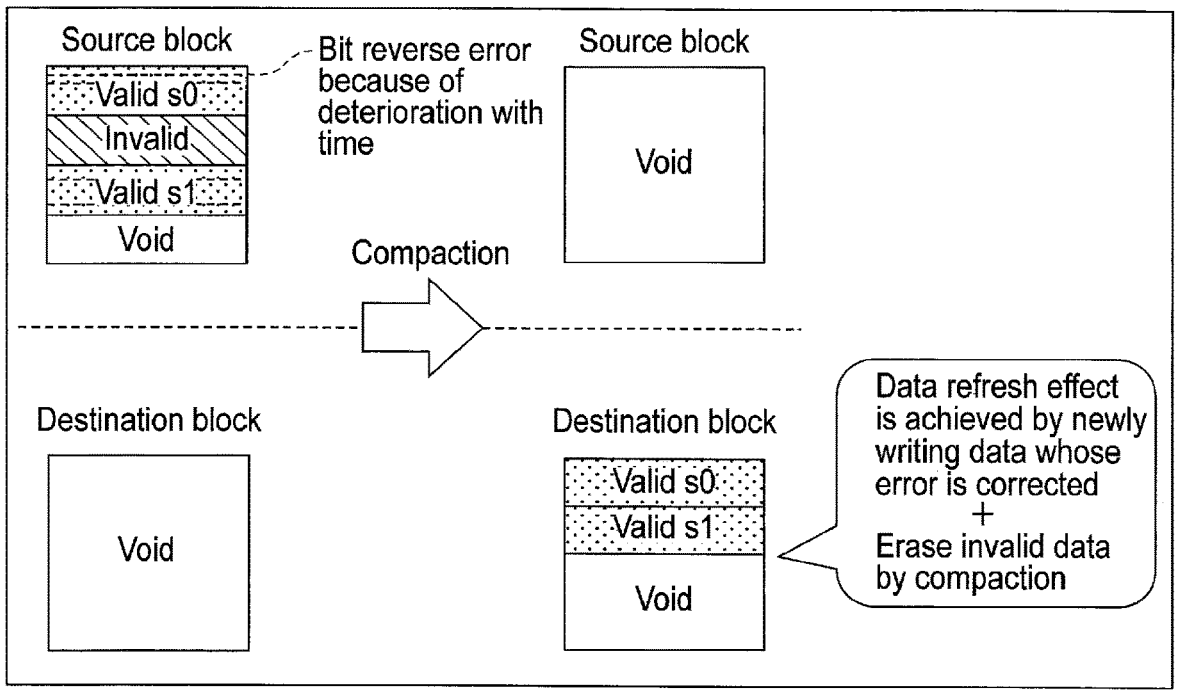
FIG. 39 is a diagram illustrating another example of effects of compaction when a free block is used as a destination block.

FIG. 39 further illustrates an example where a source block, which is an old block, includes an area of Invalid-data. In each area of Valid-data s0 and s1 in the source block, bit reverse errors occur because of deterioration with time. The memory controller 2 reads the Valid-data s0 and s1 from the source block, and performs the error correction process on the read Valid-data s0 and s1. Then, the memory controller 2 writes the Valid-data s0 and s1 after the error correction into the destination block, which is a free block.

Through the compaction operation, the Valid-data s0 and s1 after the error correction are newly written into the destination block, and thus, a refresh effect can be achieved, and furthermore, since the invalid area is erased from the source block and the source block is reused as a free block, the write margin increases.

Note that, the magnetization failure (I-B) caused by setting to an erroneous magnetization in a memorization process occurs when the magnetization produced for memorization does not work intentionally and an MML 10 cannot be magnetized in an intentional state. An error caused by the magnetization failure is an error that may occur immediately after writing of data; however, it may be corrected by the above-mentioned error correction process.

<Shift Error>

Figure 40:
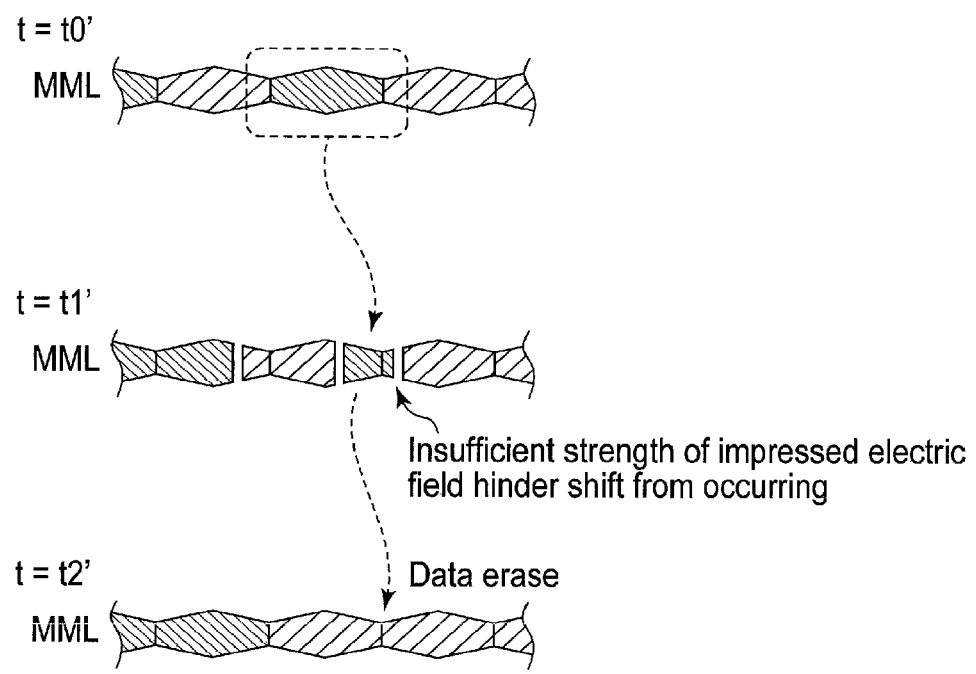
FIG. 40 is a diagram illustrating an example where an intended shift does not occur in an MML.

A shift error (II) is, as illustrated in FIG. 40, an error that occurs when the strength of an impressed electric field becomes insufficient and an intentional shift does not occur while data is shifted in an MML 10. In the example of FIG. 40, an area in the MML 10 magnetized in a magnetization direction (for example, a magnetization direction N) and an area in the MML 10 magnetized in a different magnetization direction (for example, a magnetization direction S) are depicted in different hatchings. A shift error may occur both in a shift operation for reading data and a shift operation for writing data. Specifically, as explained above with the example of FIG. 4, a shift error occurs by an erroneous shift operation when the moving speeds of magnetic domain walls 16 (or magnetic domains) in the MML 10 are uneven.

When data with a shift error in the MML 10 is read, the read data is, as a whole, shifted starting from the position in which the shift error occurs as compared to data to be originally read. In the MML 10, writing and reading of data are performed by a last-in first-out method. Thus, data stored in the lower layer in the MML 10, that is, data with the greater number of times of shifts has high possibility that a shift error occurs, and furthermore, an influence of a shift error occurred in a higher layer spreads to lower layers.

With reference to FIG. 41, an example of a shift error and random errors occurring in a frame included in a block. As mentioned above, writing of data into a block and reading of data from a block are performed in a unit of a page. The size of one page is preliminarily defined in accordance with the size of a frame that includes user data and an ECC. Thus, in the nonvolatile memory 3, generally, writing and reading of data are performed in a unit of data that is referred to as page (that is, in a unit of a frame). In this example, for easier explanation, the units of frame and page are the same. That is, pages in a block correspond to frames in the block, respectively. Layers in the block are logically divided into the frames. Each of the frames includes a set of several layers adjacent to each other.

Furthermore, multiple MMLs 10 (in this example, M0 to M1000+α) physically constitute a block. In each MML 10, 1-bit data may be stored in each layer.

As illustrated in FIG. 41A, each frame (in this example, a frame β) in the block includes a data portion of one page (for example, 4 KB) and an ECC (parity). In this example, the frame β includes 39 layers from a layer L38, which corresponds to the uppermost layer, to a layer L0, which corresponds to the lowest layer. Errors are detected in the frame 3 by the error correction process using the ECC. In the error correction process, whether each error is a shift error or a random error cannot be distinguished. However, for easier understanding, the figure illustrates the layers in the frame β so as to identify positions of a shift error and positions of random errors. In the frame β, the shift error occurs in the layers L36 to L0, and the random errors occur in the layers L2 and L1.

FIG. 41B illustrates layers in the MMLs 10 constituting the block, and each of the error occurring in the frame β is mapped to the corresponding layer of the layers. It shows that the shift error occurs in layers in an MML M1 of the block that include a layer L36+α (corresponding to a layer L36 in the frame β) and layers subsequent to the layer L36+α, and the random errors occur in a layer L2+α (corresponding to the layer L2 in the frame β) and a layer L1+α (corresponding to the layer L1 in the frame β) in an MML M1000+(α−1). In FIG. 41B, a layer in which a shift error occurs is depicted by dots, and a layer in which a random error occurs is depicted by hatch lines.

In the MML M1, the shift error occurring in the layer L36+α propagates to the layers lower than the layer L36+α, and thus, the shift error occurs in the layers subsequent to the layer L36+α. That is, the layers in which the shift error occur may include one layer (in this example, the layer L36+α) in which an excessive shift or an insufficient shift actually occurs and the lower layers in the same MML that are affected by the one layer.

Figure 42:
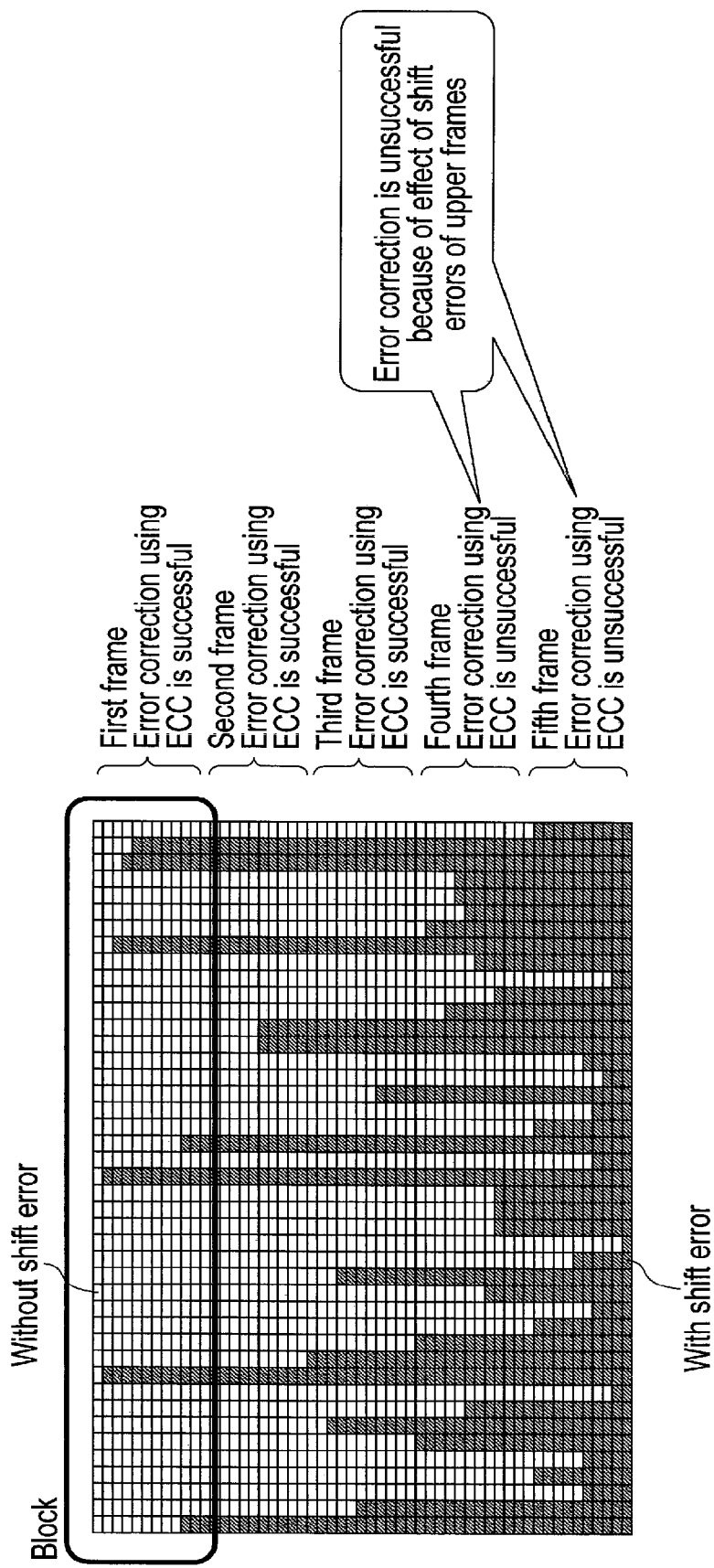
FIG. 42 is a diagram illustrating an example where an error correction of lower layer frame is unsuccessful under the influence of errors occurring in upper frames.

Furthermore, as illustrated in FIG. 42, in a block composed of frames, an effect of a shift error occurring in an upper frame propagates to the lower frames. In this example, a block includes first to fifth frames in order. The first frame is the uppermost frame and the fifth frame is the lowest frame.

In FIG. 42, each row extending in the vertical direction indicates one MML 10, and each line extending in the horizontal direction indicates one layer. That is, in the example of FIG. 42, MMLs 10, which are indicated by the rows arranged in the horizontal direction, and layers, which are indicated by lines arranged in the vertical direction, represent a block. In each MML 10 corresponding to one row, there is no error in the layers depicted as blank, and a shift error occurs in the layers depicted by hatch lines.

Each frame includes one or more MMLs 10 with shift errors. Furthermore, by an influence of a shift error occurring in an upper frame, the number of MMLs 10 with shift errors increases in the lower frames. That is, the error amount increases in the lower frames.

For example, when the upper frames of first, second, and third frames are read, the error correction using an ECC in each frame is successful and the shift error can be corrected. In contrast, when the lower frames of fourth and fifth frames are read, since the error amount is great, the error correction using an ECC included in each frame is unsuccessful, and the shift error may not be corrected.

In the present embodiment, a shift error occurring in an upper frame is learnt, and a lower frame is adapted to the learning result. Thus, the shift error in the lower frame, which occurs by an influence of the shift error occurred in the upper frame, can be corrected. The error correction process using an ECC performed on the lower frame that is adapted to the learning result increases the possibility that the error correction process using an ECC is successful. Note that a term "learn" means acquiring information to correct a shift error occurred. Furthermore, a term "adapt" means correcting a shift error using the acquired information.

Note that, as a method of solving a shift error, for example, there is a method of adding an ECC (parity) of greater strength to data portions eventually stored in the lower position as described above with reference to FIG. 6. In this example, the size of a data portion to be eventually stored in a page in the bottom position (that is, page data initially input in a block) including an ECC is greater than the size of a data portion eventually stored in a page in the top position (that is, page data lastly input in the block). Note that the size of data portion is greater than the size of an ECC.

However, in this method, ECCs having variable error correction strengths must be managed. Each of the ECCs is added to a data portion of each layer (or a page). An error correction strength of an ECC changes in accordance with a position in an MML 10 in which a corresponding data portion is eventually stored. Now, a case where the compaction is performed to read data from a source block and to write the read data into a destination block will be considered. In this case, when a position in the source block in which data has been stored (for example, an upper layer) and a position in the destination block in which the data should be stored (for example, a lower layer) are different, a data length of a frame including the data and an ECC changes between a time when the data is stored in the source block and a time when the data is stored in the destination block. Thus, in the method of adding an ECC having a variable error correction strength to a data portion of each layer (or each page), the management is difficult.

Thus, in the present embodiment, instead of the method of adding an ECC having greater strength to a data portion eventually stored in a lower position in an MML 10, a method of learning a shift error occurring in an upper frame and adapting a lower frame to the learning result is used. Thus, the data management becomes easier and the accuracy of correction of errors occurring in read data.

With reference to FIGS. 43 to 50, the method of learning a shift error occurring in an upper frame and adapting a lower frame to the learning result will be specifically explained.

Figure 43:
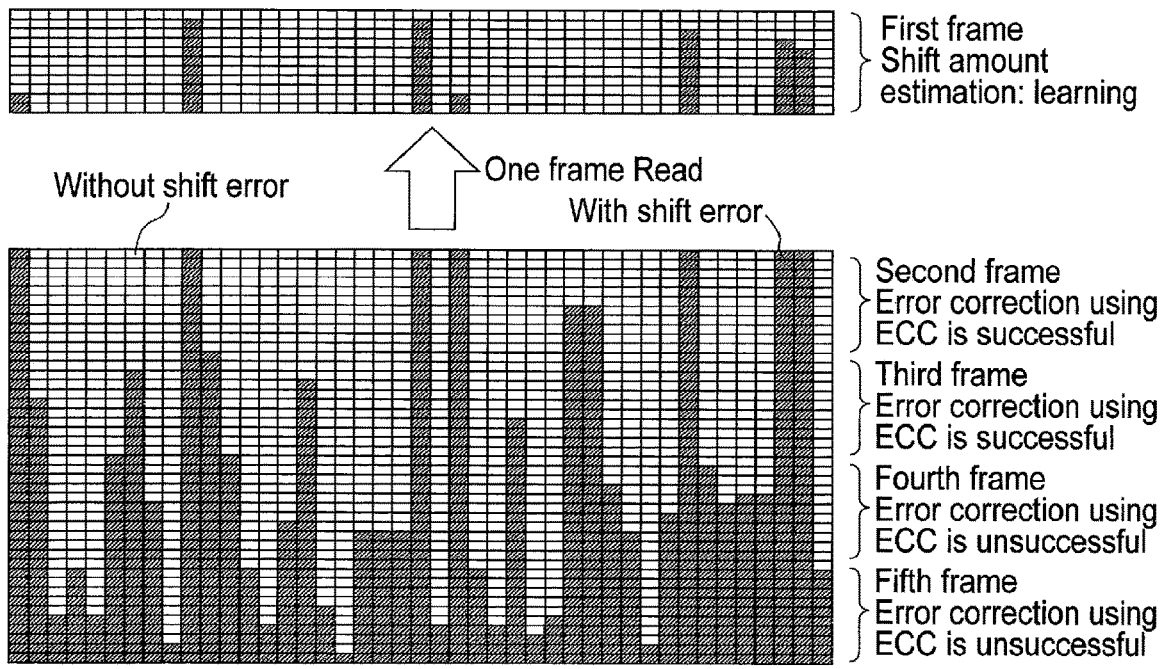
FIG. 43 is a diagram illustrating an example where a shift amount is learnt in a first frame.

Firstly, as illustrated in FIG. 43, the memory controller 2 reads a first frame in a block and performs the error correction process using an ECC in the first frame. When the error correction process is successful, and errors of one or more data pieces (bits) are corrected, the memory controller 2 specifies one or more MMLs 10 in which the errors occurred. Then, when the errors correspond to one or more shift errors, the memory controller 2 learns information to correct the shift errors and adds the learning result to a dictionary (for example, the shift error table 235). To the dictionary, for example, with respect to each of the shift errors, information to specify an MML 10 in which a shift error occurred and a data shift amount to correct the shift error (for example, a direction and the number of bits to shift) are added. Note that a method to determine whether an error that occurred corresponds to a shift error will be explained later with reference to FIGS. 55 to 69.

Figure 44:
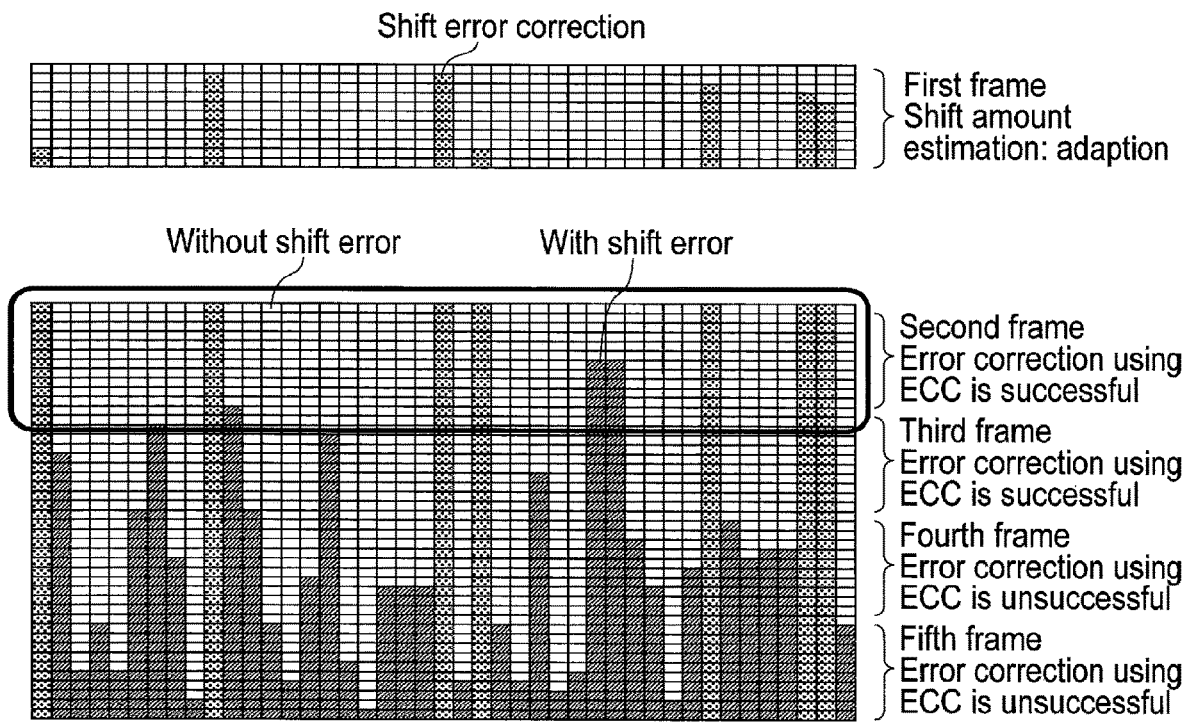
FIG. 44 is a diagram illustrating an example where the first frame is adapted to the learnt shift amount.

As illustrated in FIG. 44, when the read first frame is adapted to the information to correct the shift errors in the dictionary, the shift errors in the first frame can be corrected. In each MML 10 corresponding to one row, the layers depicted in dots indicate layers in which the shift error has been corrected. Furthermore, in each of frames below the first frame, shift errors occur similarly in the one or more MMLs 10 in which the shift errors occurred in the first frame. Thus, by adapting each of the frames below the first frame to the information to correct the shift errors added to the dictionary, the shift errors in each of the frames below the first frame which have occurred because of the influence of the shift errors in the first frame can be corrected.

Specifically, in the learning in the first frame and the adaption of the second frame, the memory controller 2 firstly performs the error correction process on the first data portion in the first frame using the ECC in the first frame. Then, when a shift error, which is occurred in an MML 10, is corrected in this error correction process, the memory controller 2 replaces data piece (e.g., 1-bit data) stored in a layer in the MML 10 with data piece stored in another layer in the MML 10 to correct data portion in the second frame. Thus, the shift errors in the second frame, which have occurred because of the shift errors in the first frame, can be corrected.

Figure 45:
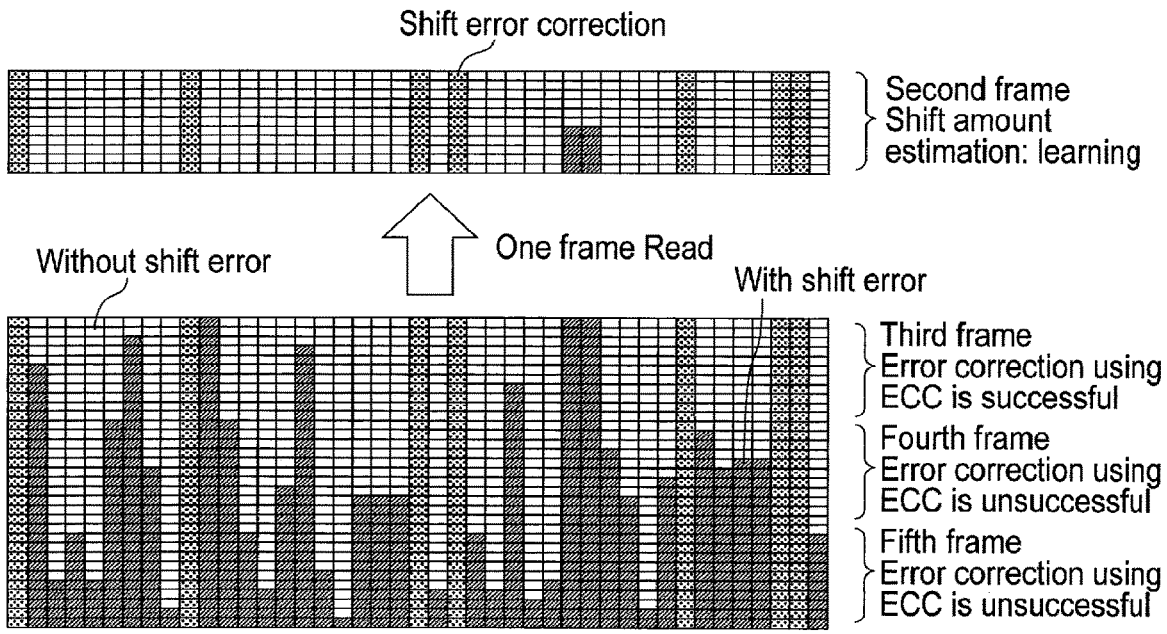
FIG. 45 is a diagram illustrating an example where a shift amount is learnt in a second frame.

Then, as illustrated in FIG. 45, the memory controller 2 reads the second frame in the block, and performs the error correction process using an ECC in the second frame. When the error correction process is successful and one or more errors have been corrected, the memory controller 2 specifies one or more MMLs 10 in which the errors occurred. When the errors correspond to one or more shift errors, the memory controller 2 learns information to correct the shift errors and adds the learning result to the dictionary. Here, for example, a difference from the information for the shift errors learnt in the first frame may be added.

Figure 46:
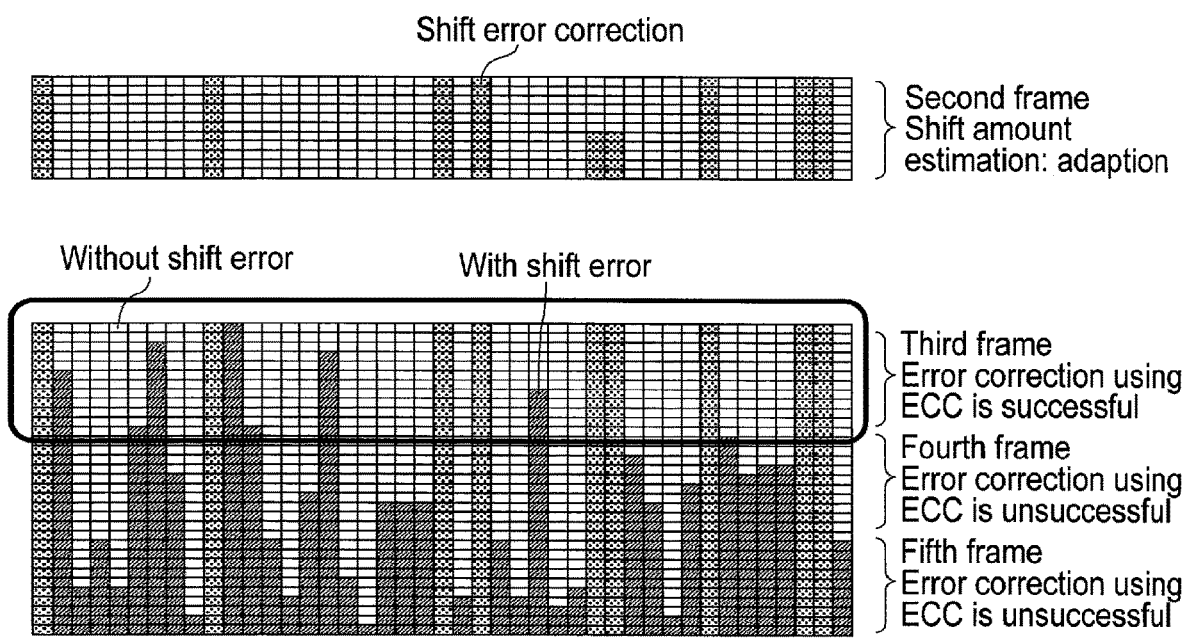
FIG. 46 is a diagram illustrating an example where the second frame is adapted to the learnt shift amounts.

As illustrated in FIG. 46, when the read second frame is adapted to the information to correct the shift errors added to the dictionary, the shift errors in the second frame can be corrected. Furthermore, in each of frames below the second frame, one or more shift errors occur in one or more MMLs 10 in which the shift errors occurred in at least one of the first frame and the second frame. Thus, by adapting each of the frames below the second frame to the information to correct the shift errors added to the dictionary, the shift errors in each of the frames below the second frame which have occurred because of the influence of the shift errors in the first and second frames can be corrected.

Then, as illustrated in FIG. 47, the memory controller 2 reads the third frame in the block, and performs the error correction process using an ECC in the third frame. When the error correction process is successful and one or more errors have been corrected, the memory controller 2 specifies one or more MMLs 10 in which the errors occurred. When the errors correspond to one or more shift errors, the memory controller 2 learns information to correct the shift errors and adds the learning result to the dictionary. Here, for example, a difference from the information for the shift errors learnt in the first and second frames may be added.

As illustrated in FIG. 48, when the read third frame is adapted to the information to correct the shift errors added to the dictionary, the shift errors in the third frame can be corrected. Furthermore, in each of frames below the third frame, one or more shift error occur in one or more MMLs 10 in which the shift errors occurred in at least one of the first, second, and third frames. Thus, by adapting each of the frames below the third frame to the information to correct the shift errors added to the dictionary, the shift errors in each of the frames below the third frame which have occurred because of the influence of the shift errors in the first, second, and third frames can be corrected.

Furthermore, as illustrated in FIG. 49, the memory controller 2 reads the fourth frame in the block. Since the error correction process using an ECC in the fourth frame is unsuccessful, the read fourth frame is adapted to the information indicative of the learning result of the shift errors with respect to the first, second, and third frames, and the error correction process using an ECC in the adapted fourth frame is performed.

As mentioned above with reference to FIG. 42, when the error correction process using the ECC in the read fourth frame as it is, since the error amount is great, the error correction is unsuccessful. However, in the fourth frame adapted to the dictionary indicative of the learning result of the shift errors, the shift errors in the fourth frame which occurred because of the influence of the shift errors of the first, second, and third frames are corrected, and the error amount is decreased. Thus, the possibility that the error correction process performed on the fourth frame is successful can be increased.

When the error correction is successful and errors of one or more data pieces are corrected, the memory controller 2 specifies one or more MMLs 10 in which the errors occurred. When the errors correspond to one or more shift errors, the memory controller 2 learns information to correct the shift errors and adds the learning result to the dictionary. Here, for example, a difference from information for the shift errors learnt in the first, second, and third frames may be added.

As illustrated in FIG. 50, when the read fourth frame is adapted to the information to correct the shift errors added to the dictionary, the shift errors of the fourth frame can be corrected. Furthermore, in the fifth frame, one or more shift errors occur in one or more MMLs 10 in which the shift errors occurred in at least one of the first, second, third, and fourth frames. Thus, by adapting the fifth frame to the information to correct the shift errors added to the dictionary, the shift errors in the fifth frame which have occurred because of the influence of the shift errors in the first, second, third, and fourth frames can be corrected.

As mentioned above with reference to FIG. 42, when the error correction process using an ECC is performed on the read fifth frame as it is, since the error amount is great, the error correction is unsuccessful. However, in the fifth frame adapted to the dictionary indicative of the learning result of the shift errors, the shift errors in the fifth frame which occurred because of the influence of the shift errors of the first, second, third, and fourth frames are corrected, and the error amount is decreased. Thus, the possibility that the error correction process performed on the fifth frame is successful can be increased.

Figures 51A, 51B:
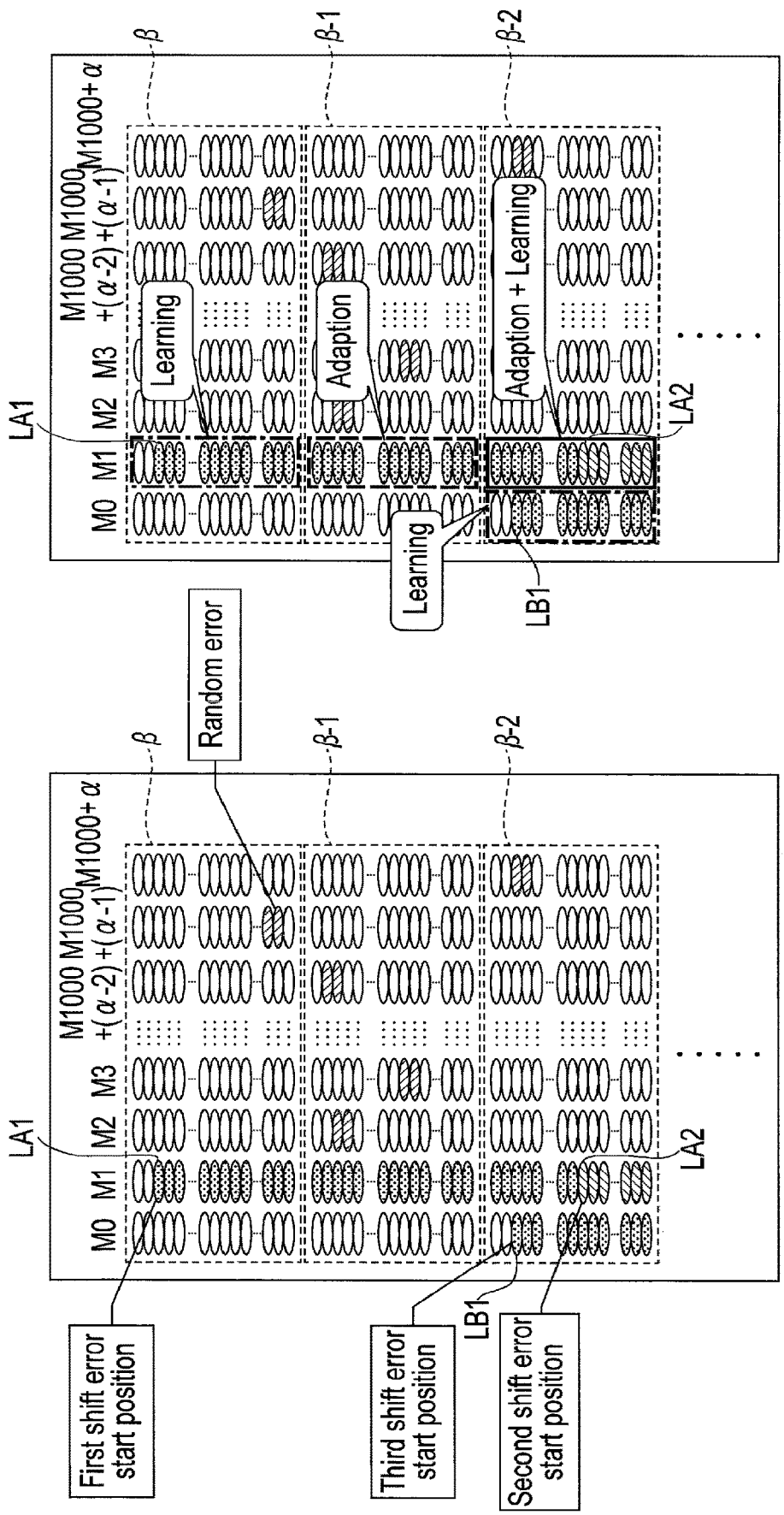
FIG. 51A is a diagram illustrating an example of start positions of shift errors.
FIG. 51B is a diagram illustrating an example of learning and adaption in accordance with the start positions of the shift errors.

Furthermore, FIGS. 51A and 51B illustrates an example where a block in the nonvolatile memory 3 includes three frames of a frame β, a frame β−1, and a frame β−2. As illustrated in FIG. 51A, in an MML M1, a first shift error that starts at a layer LA1 in the frame β, and a second shift error that starts at a layer LA2 in the frame β−2 occur. Furthermore, in an MML M0, a third shift error which starts at a layer LB1 in the frame β−2 occurs. Furthermore, several random errors occur in each of the frames β, β−1, and β−2.

As illustrated in FIG. 51B, when the error correction process on the read frame β is successful, the first shift error that starts at the layer LA1 in the MML M1 is learnt, and the learning result is added to the dictionary. Then, the read frame β−1 is adapted to the dictionary to which the learning result of the first shift error is added, and thus, the first shift error occur in the frame β−1, that is, the first shift error affecting the frame β−1 can be corrected.

Then, the read frame β−2 is adapted to the dictionary to which the learning result of the first shift error is added, and thus, the first shift error occur in the frame β−2, that is, the first shift error affecting the frame β−2 can be corrected. Then, when the error correction process on the frame β−2 in which the first shift error has been corrected (or the read frame β−2) is successful, the second shift error that starts at the layer LA2 in the MML M1 and the third shift error that starts at the layer LB1 in the MML M0 are learnt, and the learning results are further added to the dictionary.

Thus, when frames in a block are read, learning of a shift error may be performed using each frame, and adaption to correct a shift error of each frame may be performed.

Figure 52:
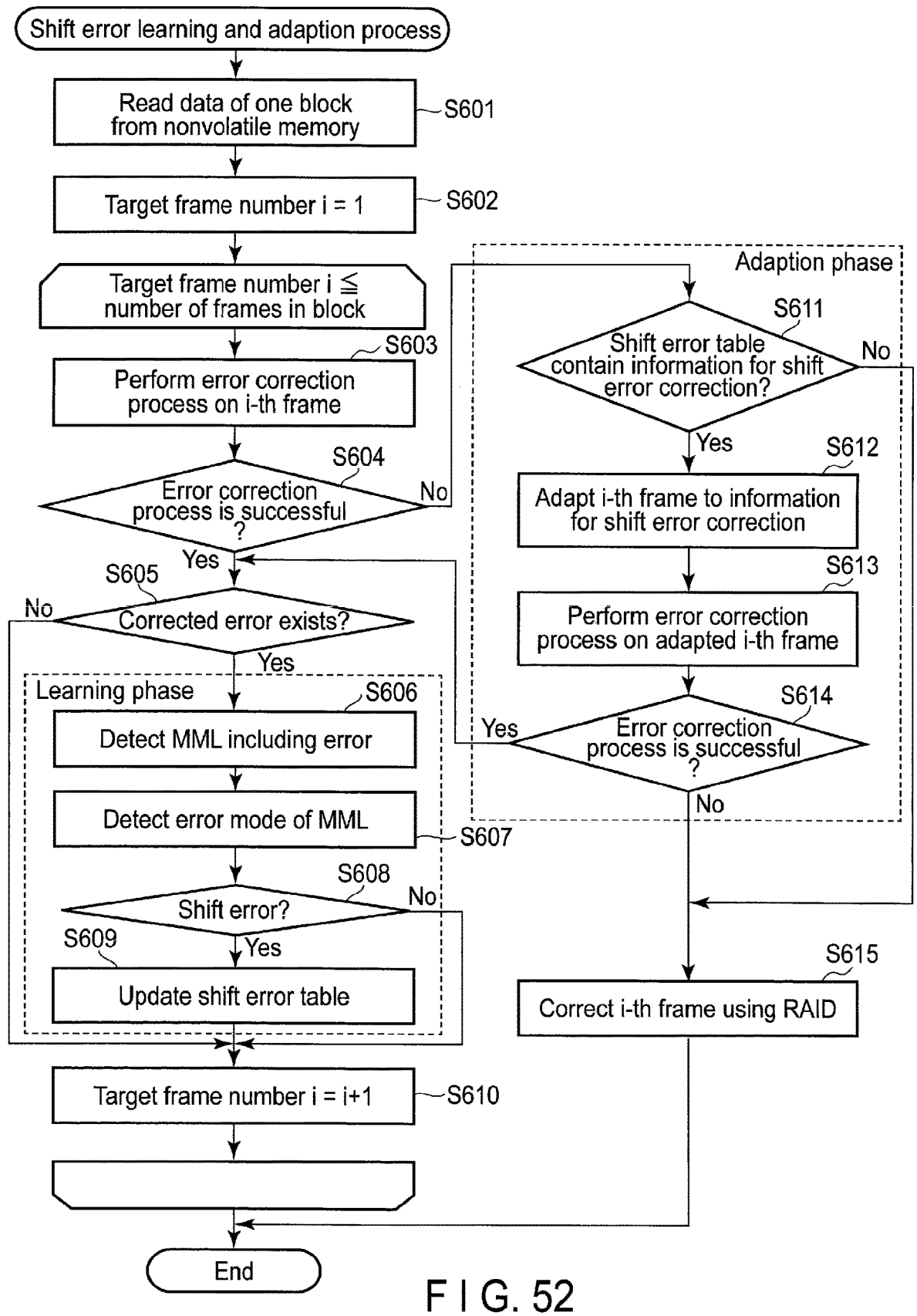
FIG. 52 is a flowchart illustrating an example of the procedure of a shift error learning and adaption process.

FIG. 52 illustrates an example of the procedure of a shift error learning and adaption process performed by the memory controller 2. In this example, for easier understanding, an example where the shift error learning and adaption are performed after all data stored in one block is collectively read. However, the shift error learning and adaption may be performed at each time when data in a unit of a frame is read from one block.

Firstly, the memory controller 2 reads all data stored in one block in the nonvolatile memory 3 and stores the data in the data buffer 25 or the like (step S601). That is, frames forming the block are read and are stored in the data buffer 25 or the like. Then, the memory controller 2 sets one as a target frame number i (step S602).

When the target frame number i is equal to or less than the number of frames in the block, the memory controller 2 performs the error correction process on i-th frame (step S603). The memory controller 2 performs the error correction process using an ECC (parity) included in the i-th frame. The ECC is a code that can specify an error position and is, for example, a BCH code. Then, the memory controller 2 determines whether the error correction process is successful (step S604). When the error correction process is successful (YES in step S604), the memory controller 2 determines whether an error was corrected in the error correction process (step S605). The error is occurred in one or more data bits in the i-th frame, and is detected and corrected in the error correction process.

When an error was corrected in the error correction process (YES in step S605), the memory controller 2 detects an MML 10 that is one of MMLs 10 forming the block and included the error (step S606). Furthermore, the memory controller 2 detects an error mode of the error that occurred in the MML 10 (step S607). The detected error mode corresponds to a random error or a shift error. A method of detecting an error mode will be described later with reference to FIGS. 55 to 69.

When the error mode indicates a shift error (YES in step S608), the memory controller 2 updates the shift error table 235 including information to correct the shift error (step S609). The shift error table 235 may include one or more entries each including, for example, information to specify an MML 10 in which a shift error occurred and a shift amount to shift data for correction. The memory controller 2 may add an entry including information to correct a shift error to the shift error table 235, or may update, when the shift error table 235 includes an entry corresponding to an MML 10 in which a shift error occurred, the shift amount in the entry.

When the corrected error does not correspond to a shift error (NO in step S608), that is, when it is a random error, step S609 is skipped.

Steps S606 to S609 are a learning phase to learn, when the i-th frame includes an error and the error is corrected, information related to a shift error per MML 10. Thus, when there are MMLs 10 including errors, the learning phase may be performed per MML 10.

Then, the memory controller 2 adds one to the target frame number i (step S610), and when the target frame number i is equal to or less than the number of frames in the block, the process returns to step S603, and the process for the next frame is performed. When the target frame number i exceeds the number of frames in the block, the process ends.

Furthermore, when the error correction process on the i-th frame is unsuccessful (NO in step S604), the memory controller 2 determines whether the shift error table 235 includes information for shift error correction (step S611). When the shift error table 235 includes information for shift error correction (YES in step S611), the memory controller 2 adapts the i-th frame to the information for shift error correction (step S612). The memory controller 2 performs the error correction process on the adapted i-th frame (step S613). The memory controller 2 performs the error correction process using an ECC (parity) included in the adapted i-th frame. Then, the memory controller 2 determines whether the error correction process is successful (step S614). When the error correction process is successful (YES in step S614), the process proceeds to step S605. Then, when there is a corrected error in step S614, the process transitions to the learning phase of the error (steps S606 to S609).

On the other hand, when the error correction process is unsuccessful (NO in step S614), or the shift error table 235 does not include information for shift error correction (NO in step S611), the memory controller 2 corrects the error with a different error correction method instead of the method using the shift error table 235 (step S615), and the process ends. The different error correction method is, for example, a method using Redundant Arrays of Inexpensive Disks (RAID).

Steps S611 to S614 are an adaption phase to adapt the read i-th frame to the information of shift error correction indicated in the shift error table 235 when the error correction process on the i-th frame is unsuccessful. In step S614, the error correction process is performed on the i-th frame adapted to the information for shift error correction, that is, on the i-th frame with decreased error amount obtained by correcting the shift error using the shift error table 235. Thus, the error correction process performed on the i-th frame adapted to the information for shift error correction (step S614) has a greater possibility of success as compared to the error correction process performed on the i-th frame at it is read from the nonvolatile memory 3 (step S604). When the error correction process of step S614 is successful, it may be concluded that errors in the i-th frame that could not be corrected by the simple error correction process of step S604 are corrected using the shift error table 235. Furthermore, the error corrected in the error correction process of step S614 can be learnt in the learning phase, and the learning result (that is, update of the shift error table 235) may be reflected upon the error correction on the subsequent frames.

Through the above, in parallel with the error correction process using an ECC on each frame, a shift error in each frame is learnt and the subsequent frames are adapted to the learning result. Therefore, even if an error occurs in read data, a possibility of acquiring correct data is increased.

Note that, in the above-described example, when the error correction process is unsuccessful, the process transitions to the adaption phase of steps S611 to S614; however, regardless of success or failure of the error correction process, the process may transition to the adaption phase. Thus, the memory controller 2 may transition to the adaption phase before the error correction process is performed, for example.

Figure 53:
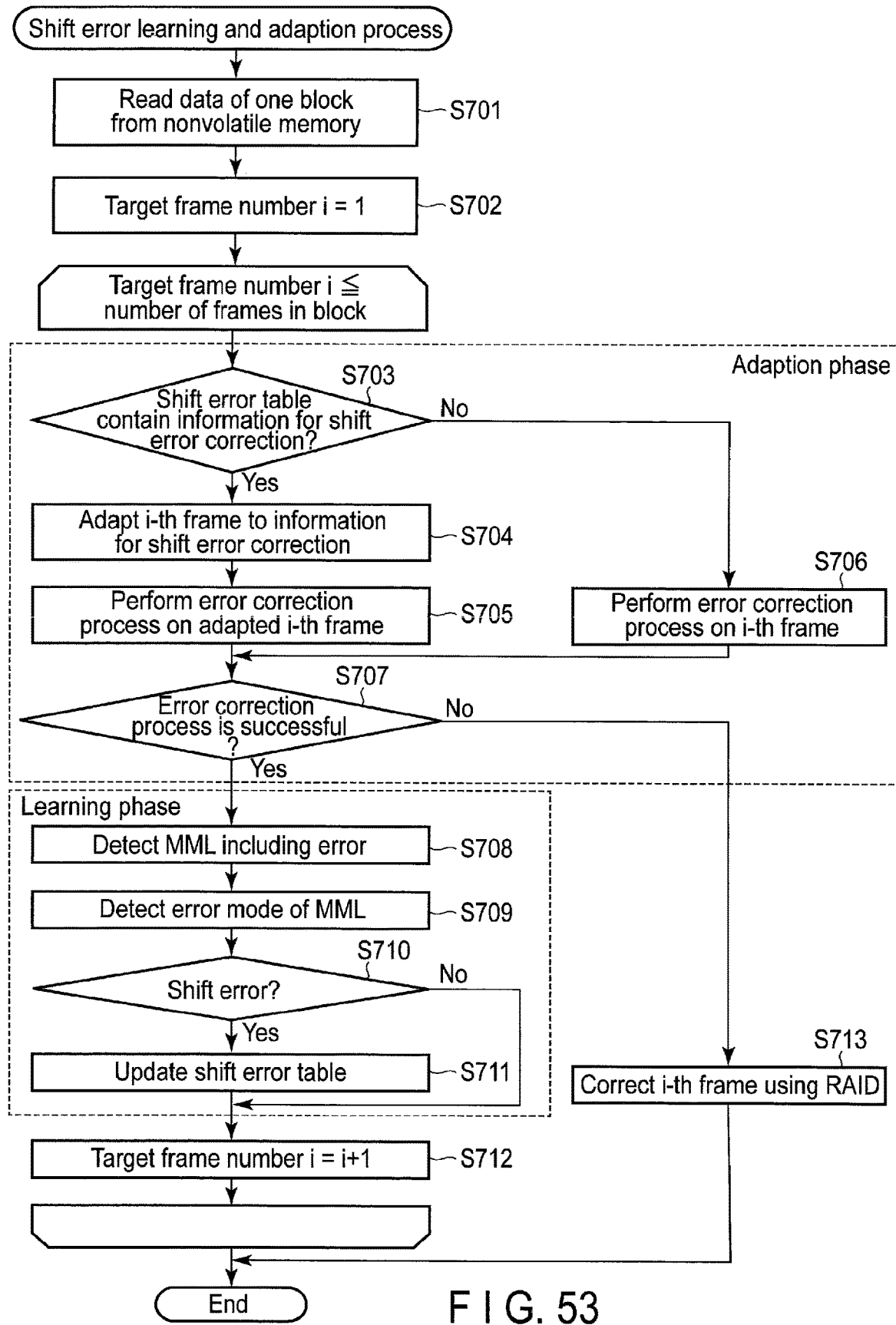
FIG. 53 is a flowchart of another example of the procedure of a shift error learning and adaption process.

The flowchart of FIG. 53 illustrates an example of the procedure of the shift error learning and adaption process including transition to the adaption phase before performing the error correction process. Steps S701 and S702 are the same as steps S601 and S602 that are described above with reference to the flowchart of FIG. 52. Then, the memory controller 2 does not perform the i-th frame and transitions to the adaption phase.

Specifically, the memory controller 2 determines whether the shift error table 235 includes information for shift error correction (step S703). When the shift error table 235 includes information for shift error correction (YES in step S703), the memory controller 2 adapts the i-th frame to the information for shift error correction (step S704). The memory controller 2 performs the error correction process on the adapted i-th frame (step S705).

On the other hand, when the shift error table 235 does not include information for shift error correction (NO in step S703), the memory controller 2 performs the error correction process on the i-th frame (that is, the i-th frame that is not adapted to information for shift error correction) (step S706).

Then, the memory controller 2 determines whether the error correction process of step S705 or S706 is successful (step S707). When the error correction process is successful (YES in step S707), the process proceeds to step S708, and when there is an error corrected in the error correction process of step S705 or S706, the process transitions to the learning phase for the error (steps S708 to S711). The specific process of the learning phase is similar to the learning phase of steps S606 to S609 explained with reference to the flowchart of FIG. 52.

Then, the memory controller 2 adds one to the target frame number i (step S712), and when the target frame number i is equal to or less than the number of frames in the block, the process returns to step S703, and the process for the next frame is performed. When the target frame number i exceeds the number of frames in the block, the process ends.

Furthermore, when the error correction process of step S705 or S706 is unsuccessful (NO in step S707), the memory controller 2 corrects the error with a different error correction method instead of the method using the shift error table 235 (step S713), and the process ends. The different error correction method is, for example, a method using RAID.

As above, the memory controller 2 transitions to the adaption phase before performing the error correction process. In that case, the memory controller 2 can perform, when there is information for shift error correction, the error correction process on a frame adapted to the information.

Figure 54:
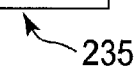
FIG. 54 is a diagram illustrating a configuration example of a shift error table.

FIG. 54 illustrated a configuration example of the shift error table 235. The shift error table 235 is managed in a unit of a block, for example. Furthermore, the shift error table 235 includes entries corresponding to MMLs 10 in the nonvolatile memory 3. Each of the MMLs 10 is an MML in which a shift error occurred. Each entry includes, for example, an MML position and a shift amount.

In an entry corresponding to an MML 10 in which a shift error occurred, the MML position indicates information to specify the MML 10. As the MML position, information to specify one MML 10 of the MMLs 10 in the nonvolatile memory 3 such as a value and identification information is set.

Furthermore, the shift amount in the entry indicates a shift amount to correct the shift error occurred in the MML 10. As the shift amount, any information that can specify a direction in which data of bits read from the MML 10 is to be shifted, and the number of bits by which the data is to be shifted. For example, when a vector such as "+1" and "−2" is used, the positive or negative (+ or −) specifies the direction in which data is to be shifted, and the value specifies the number of bits by which the data is to be shifted.

When a data portion in a subsequent frame is adapted to the shift error table 235, the memory controller 2 shifts (moves) bits in the data portion in a shift direction, which is indicated by the shift amount, by the number of bits (for example, by N bits), indicated by the shift amount. Thus, the bits in a certain range in the data portion are replaced with a different bits in the data portion.

Note that, when frames in a block are read in a unit of a frame, the memory controller 2 may manage the shift error table 235 so as to store, in the shift error table 235, not only a shift amount but also data bits that are to be arranged in a different frame because of the shifting based on the shift amount. Data bits may be shifted between two adjacent frames by the shifting based on the shift amount over the boundary between the frames. That is, data bits in one frame that are adjacent to the boundary may be replaced with data bits in the other frame that are adjacent to the boundary. Thus, in order to shift a data portion in a frame based on a shift amount, the memory controller 2 may manage data bits in a different frame required in the shifting by using the shift error table 235.

When shift errors occur in one MML 10, the shift error table 235 may include entries that correspond to the shift errors, respectively. Alternatively, with respect to one MML 10, one entry in which shift amounts to correct the shift errors are integrated may be included.

Figure 55:
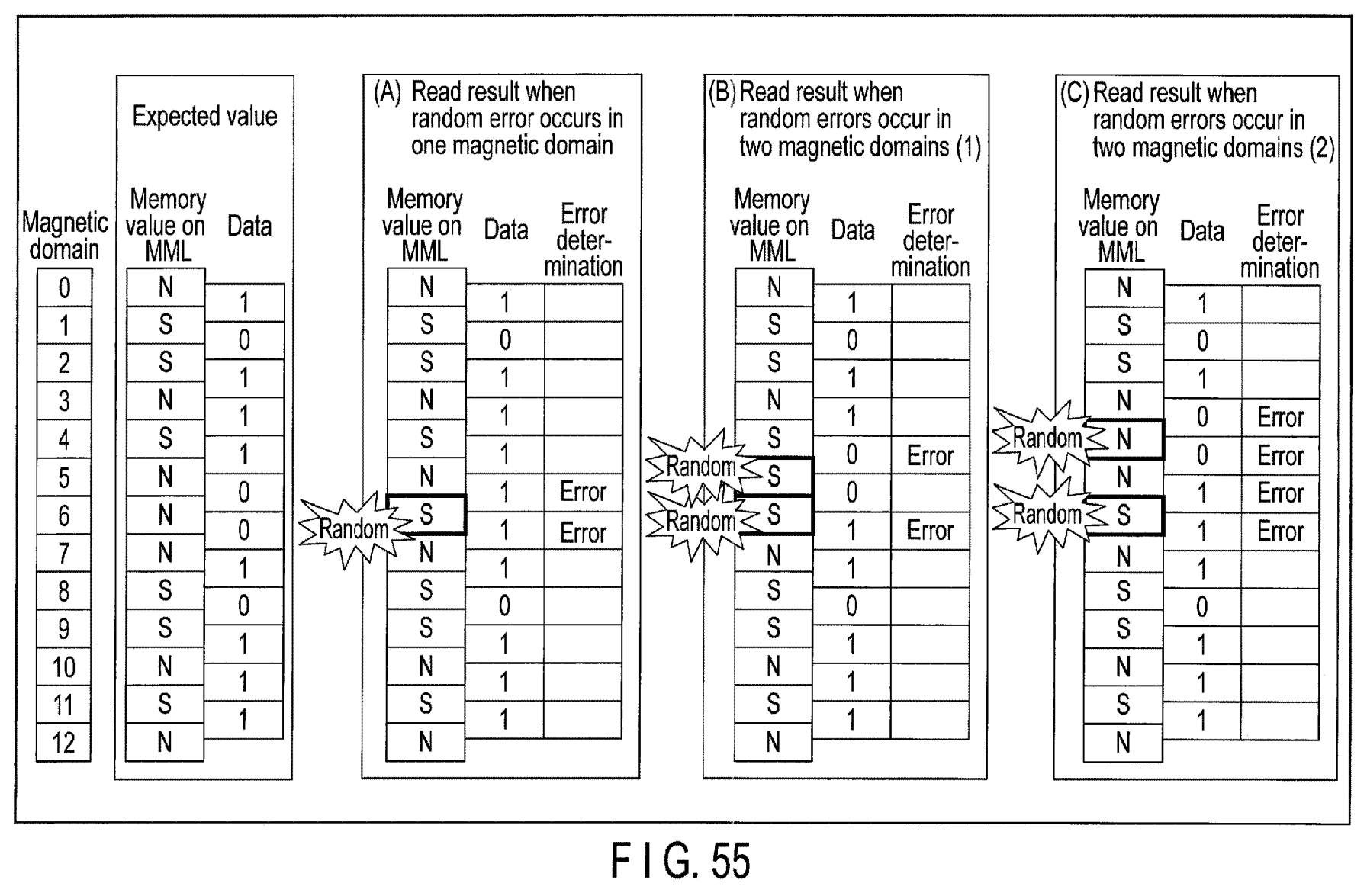

FIG. 55 illustrates an example of a result of data read when one or more random errors occur. In this example, an MML 10 includes thirteen magnetic domains, and 12-bit data is stored using the thirteen magnetic domains. The magnetization direction N or S of each magnetic domain in the MML 10 is used as a memory value of each magnetic domain. For example, a state where magnetization directions of two continuous magnetic domains in the MML 10 are matched means storage of data "0", and a state where the magnetization directions are not matched means storage of data "1". Note that, in the thirteen magnetic domains in the MML 10, one in the shallowest position is a magnetic domain 0, and one in the deepest position is a magnetic domain 12. When the memory values of the magnetic domains in the MML 10 are read, the memory value of the shallowest magnetic domain 0 is firstly read and the memory value of each of the following magnetic domains 1 to 11 is read in this order, and then the memory value of the magnetic domain 12 is read lastly.

Expected values illustrated in FIG. 55 indicate ideal memory values to be memorized in the MML 10 and data corresponding thereto. In the following description, (A) an example of read result where a random error occurs in one position, (B) a first example of read result where random errors occur in two positions, and (C) a second example of read result where random errors occur in two positions will be explained.

(A) When a random error occurs in one memory value when the magnetization direction N memorized in the magnetic domain 6 in the MML 10 is reversed to the magnetization direction S, errors occur in two continuous data bits (in this example, the sixth and seventh data bits) in the 12-bit data including the first to twelfth bits arranged in the read order. That is, when an erroneous magnetization direction is memorized in one magnetic domain in the MML 10, the continuous 2-bit data becomes erroneous.

(B) When random errors occur in two memory values when the magnetization direction N memorized in each of the magnetic domains 5 and 6 in the MML 10 is reversed to the magnetization direction S, errors occur in the fifth and seventh data bits in the 12-bit data including the first to twelfth bits arranged in the read order. Note that, since the data becomes one of binary values including zero and one, the sixth data bit is obtained as a correct value because of an effect of the two random errors occurred in the two magnetic domains 5 and 6, that is, because of the error occurring twice. That is, when an erroneous magnetization direction is memorized in each of the two continuous magnetic domains in the MML 10, 2-bit data become erroneous.

Furthermore, (C) when random errors occur in two memory values when the magnetization direction N memorized in each of the magnetic domains 4 and 6 in the MML 10 is reversed to the magnetization direction S, errors occur in the fourth, fifth, sixth, seventh data bits in the 12-bit data including the first to twelfth bits arranged in the read order. That is, when an erroneous magnetization direction is memorized in each of the two separated magnetic domains in the MML 10 (that is, not continuous magnetic domains), 4-bit data of 4 bits become erroneous.

FIG. 56 illustrates an example of data read result when a shift error occurs. Magnetic domains in an MML 10 and values of data obtained based on a memory value of each magnetic domain are as described above with reference to FIG. 55. Expected values indicate ideal memory values to be memorized in an MML 10 and data corresponding thereto.

As illustrated in FIG. 56, when a shift error occurs, irregular errors occur in 12-bit data including first to twelfth data bits arranged in the read order. In this example, a shift error occurs caused by an insufficient shift in a direction from the lower layer to the upper layer in a read operation. Specifically, in the read operation, because of an insufficient shift of the magnetic domain 2 in the direction from the lower layer to the upper layer, a magnetic domain 3 having the magnetization direction S, which is same as that of the magnetic domain 2, is added, and thus, magnetic domains, which are to be positioned after the magnetic domain 2 originally as indicated in the expected values, are positioned after the magnetic domain 3. Thus, irregular errors occur in the 12-bit data in the read result.

Note that, in addition to the above, there may be a shift error caused by an excessive shift in the direction from the lower layer to the upper layer in a read operation, a shift error caused by an excessive shift in the direction from the upper layer to the lower layer in a write operation, and a shift error caused by an insufficient shift in the direction from the upper layer to the lower layer in a write operation.

With reference to FIGS. 57 to 61, a first example where one shift error occurs in multiple-bit data read from an MML 10 will be explained. The shift error may be a shift error caused by an insufficient shift in a read operation or a shift error caused by an excessive shift in a write operation. As in the examples described with reference to FIGS. 55 and 56, a case where the MML 10 includes thirteen magnetic domains and 12-bit data is stored using the thirteen magnetic domains will be considered.

FIG. 57 illustrates expected values and a read result in which a shift error occurs. The expected values indicate ideal memory values to be memorized in the MML 10 and data corresponding thereto. The read result in which the shift error occurs indicates memory values actually read from the MML 10, data corresponding thereto, and error determination result of each data.

In the read memory values on the MML 10, since the magnetization direction S is added to the magnetic domain 3, the magnetization directions to be originally set in magnetic domains 3 to 11 are set to the magnetic domains 4 to 12, respectively. Furthermore, the magnetization direction N to be originally set to the magnetic domain 12 is lost.

Addition of the magnetization direction S to the magnetic domain 3 may occur because of, for example, an insufficient shift operation included in a read operation to read a magnetization direction of the magnetic domain 2 (that is, a shift operation in the direction from a lower layer to an upper layer), or an excessive shift operation included in a write operation to write a magnetization direction of the magnetic domain 2 (that is, a shift operation in the direction from an upper layer to a lower layer).

When the 12-bit data based on the read memory values on the MML 10 is regarded as data from a first data bit to a twelfth data bit in the read order of the corresponding memory values, errors occur in the third, sixth, ninth, and tenth data bits. That is, as illustrated in FIG. 58, the read 12-bit data does not include any regular error corresponding to a random error, which occurs in one memory value and thus, two continuous data bits become erroneous, but includes irregular errors.

FIG. 59 illustrates an example of a shortest path 81 acquired from an edit graph based on the data of the read result and the data of the expected values. The edit graph indicates a path to match the read of the result data and the data of the expected values. The edit graph is acquired by the following steps (1) to (4), for example.

(1) On a plane in which M bits forming the data of the read result are arranged orderly in the vertical direction and N bits forming the data of the expected values are arranged orderly in the horizontal direction, points (i, j) each specified by an i-th bit of the data of the read result and a j-th bit of the data of the expected values are set. Note that i∈[0, M], and j∈[0, N]. It is assumed that the same values are set to the 0th bit of the data of the read result and the 0th bit of the data of the expected values. Furthermore, a bit specified by less value of each of i, j will be referred to as an upper bit, and a bit specified by greater value of each of i, j will be referred to as a lower bit.

(2) With respect to the points (i, j) where i E [1, M] and j∈[0, N], an edge in the vertical direction from the point (i−1, j) to the point (i, j) (that is, a line segment) is depicted on the plane.

(3) With respect to the points (i, j) where i e [0, M] and j∈[1, N], an edge in the horizontal direction from the point (i, j−1) to the point (i, j) is depicted on the plane.

(4) When the i-th bit of the data of the read result is equal to the j-th bit of the data of the expected values, an edge in a diagonal direction from the point (i−1, j−1) to the point (i, j) is depicted on the plane.

The memory controller 2 specifies, from many edges (line segments) depicted in steps (1) to (4) to acquire the above edit graph, edges to form the shortest path 81 connecting the point (0, 0) to the point (M, N). In order to retrieve a path having a shortest distance from many paths connecting the point (0, 0) to the point (M, N), various algorithms may be applied to the memory controller 2, and for example, Wu algorithm is applied. Then, when there are candidates of shortest paths having the shortest distance, the memory controller 2 selects, from the candidates, a path including greater number of diagonal direction edges as the shortest path 81.

Each of the edges forming the path connecting the point (0, 0) to the point (M, N) indicates a change used to match the data of the read result and the data of the expected values.

Of the edges forming the edit graph, an edge that ends at a point (i, j) indicates;

(a) when the edge is in the diagonal direction, that the i-th bit of the data of the read result and the j-th bit of the data of the expected values match, (b) when the edge is in the horizontal direction, that the j-th bit of the data of the expected values is inserted after the i-th bit of the data of the read result, and (c) when the edge is in the vertical direction, that the i-th bit of the data of the read result is deleted.

In the shortest path 81 of FIG. 59, an edge 811 in the vertical direction that ends at a point (2, 1) indicates deletion of the second bit of the data of the read result, and an edge 812 in the horizontal direction that ends at a point (12, 12) indicates insertion of the twelfth bit of the data of the expected values after the twelfth bit of the data of the read result.

Thus, as illustrated in FIG. 60, by deleting the second bit in the data of the read result and inserting the twelfth bit of the data of the expected values after the twelfth bit of the data of the read result, the data of the read result and the data of the expected values are matched. Deleting the second bit of the data of the read result may correspond to shifting the bits, which include the third bit and thereafter of the data of the read result, in the direction from lower bits to upper bits (to the left in FIG. 60) by one bit.

Furthermore, from the edges forming the shortest path 81 illustrated in FIG. 59, a dominant (main) diagonal edge 813 is specified. The edge 813 starts from the point (2, 1) and ends at the point (12, 11). A gap between the dominant diagonal edge 813 and the diagonal line 82 from the point (0, 0) to the point (M, N) represents a shift amount to correct a shift error. That is, the edge 813 included in the shortest path 81 indicates, as compared to the diagonal line 82, that a shift error of one bit occurs from the second bit of the data of the read result in the downward direction (the direction from upper bits to lower bits).

Thus, as illustrated in FIG. 61, when bits including the third bit and thereafter of the data of the read result are shifted by one bit in the direction from lower bits to upper bits (to the left in FIG. 61), the errors occurring in the bits can be decreased to one error.

With reference to FIGS. 62 to 66, a second example where one shift error occurs in multiple-bit read from an MML 10 will be explained. The shift error may be a shift error caused by an excessive shift in a read operation or a shift error caused by an insufficient shift in a write operation. As in the example described with reference to FIGS. 55 and 56, a case where the MML 10 includes thirteen magnetic domains and 12-bit data is stored using the thirteen magnetic domains will be considered.

Figures 62, 63:
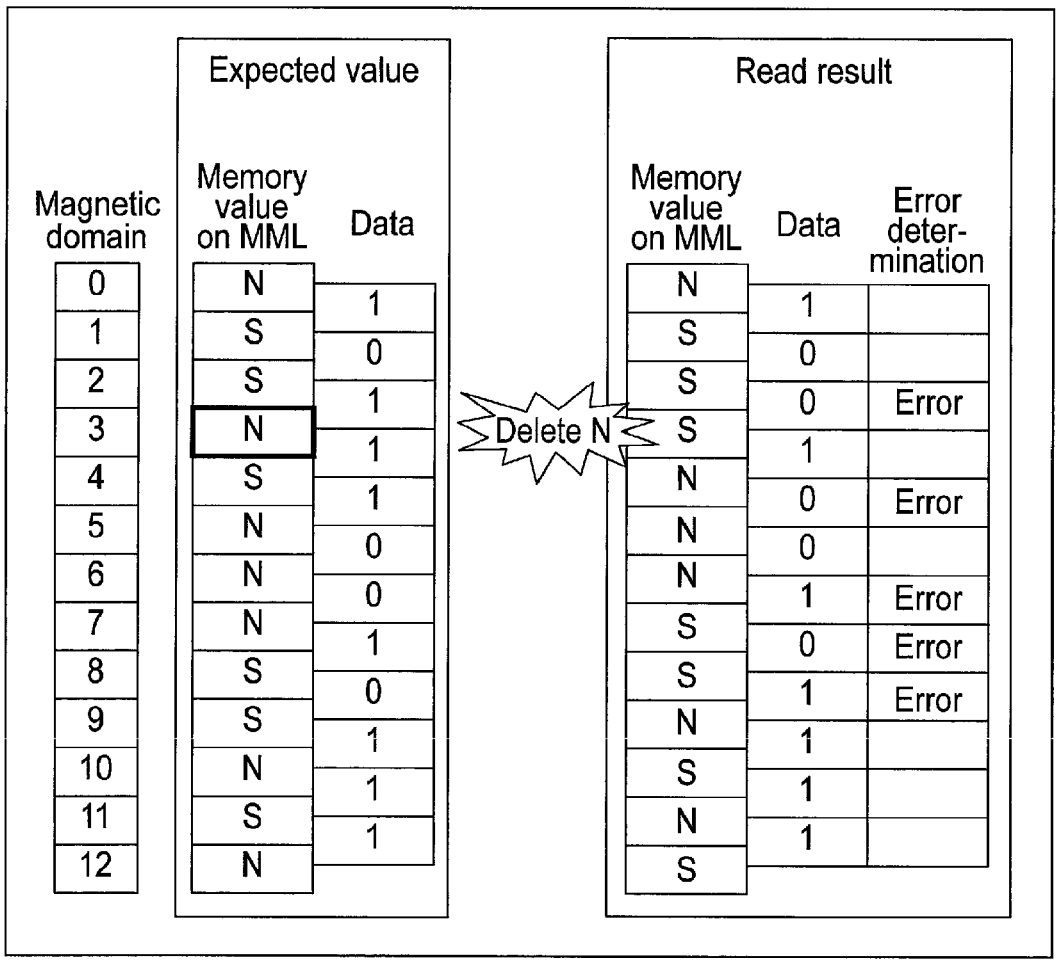
FIG. 62 is a diagram illustrating a second example of expected values and a read result when a shift error occurs.
FIG. 63 is a diagram illustrating an example of the read result of FIG. 62 and an error correction result.

FIG. 62 illustrates expected values and a read result in which a shift error occurs. The expected values indicate ideal memory values to be memorized in the MML 10 and data corresponding thereto. The read result in which the shift error occurs indicates memory values actually read from the MML 10, data corresponding thereto, and error determination result of each data.

In the read memory values on the MML 10, since the magnetization direction N is deleted from the magnetic domain 3, the magnetization directions to be originally set in magnetic domains 4 to 12 are set to the magnetic domains 3 to 11, respectively. Furthermore, the magnetization direction S is set to the magnetic domain 12.

Deletion of the magnetization direction N from the magnetic domain 3 may occur because of, for example, an excessive shift operation included in a read operation to read a magnetization direction of the magnetic domain 3 (that is, a shift operation in the direction from a lower layer to an upper layer), or an insufficient shift operation included in a write operation to write a magnetization direction of the magnetic domain 3 (that is, a shift operation in the direction from an upper layer to a lower layer).

When the 12-bit data based on the read memory values on the MML 10 is regarded as data from a first bit to a twelfth bit in the read order of the corresponding memory values, errors occur in the third, fifth, seventh, eighth, and ninth data bits. That is, as illustrated in FIG. 63, the read 12-bit data does not include any regular error corresponding to a random error, which occurs in one memory value and thus, two continuous data bits become erroneous, but includes irregular errors.

FIG. 64 illustrates an example of a shortest path 85 acquired from an edit graph based on the data of the read result and the data of the expected values. The memory controller 2 specifies, from many edges (line segments) depicted according to the above steps (1) to (4) to acquire the edit graph, edges to form the shortest path 85 connecting the point (0, 0) to the point (M, N). A method to acquire the shortest path 85 is described as above with reference to FIG. 59.

In the shortest path 85 in FIG. 64, an edge 852 in the vertical direction that ends at the point (3, 2) indicates deletion of the third bit of the data of the read result, an edge 851 in the horizontal direction that ends at the point (3, 3) indicates insertion of the third bit of the data of the expected values after the third bit of the data of the read result, an edge 853 in the horizontal direction that ends at the point (3, 4) indicates insertion of the fourth bit of the data of the expected values after the third bit of the data of the read result, and an edge 854 in the vertical direction that ends at the point (12, 12) indicates deletion of the twelfth bit of the data of the read result.

Thus, as illustrated in FIG. 65, by deleting the third bit in the data of the read result, inserting the third bit of the data of the expected values after the (deleted) third bit of the data of the read result, and inserting the fourth bit of the data of the expected values after the third bit of the data of the read result, the data of the read result and the data of the expected values are matched. Deletion of one bit and insertion of two bits may correspond to shifting the bits including the fourth bit and thereafter of the data of the read result in the direction from upper bits to lower bits (to the right in FIG. 60) by one bit.

Furthermore, from the edges forming the shortest path 85 indicated in FIG. 64, a dominant (main) diagonal edge 855 is specified. The edge 855 starts from the point (3, 4) and ends at the point (11, 12). A gap between the dominant diagonal edge 855 and the diagonal line 86 from the point (0, 0) to the point (M, N) represents a shift amount to correct a shift error. That is, the edge 855 included in the shortest path 85 indicates, as compared to the diagonal line 86, that a shift error of one bit occurs from the third bit of the data of the read result in the upward direction (the direction from lower bits to upper bits).

Thus, as illustrated in FIG. 66, when bits including the fourth bit and thereafter of the data of the read result is shifted by one bit in the direction from upper bits to lower bits (to the right in FIG. 66), the errors occurring in the bits can be decreased to one error.

Figure 67:
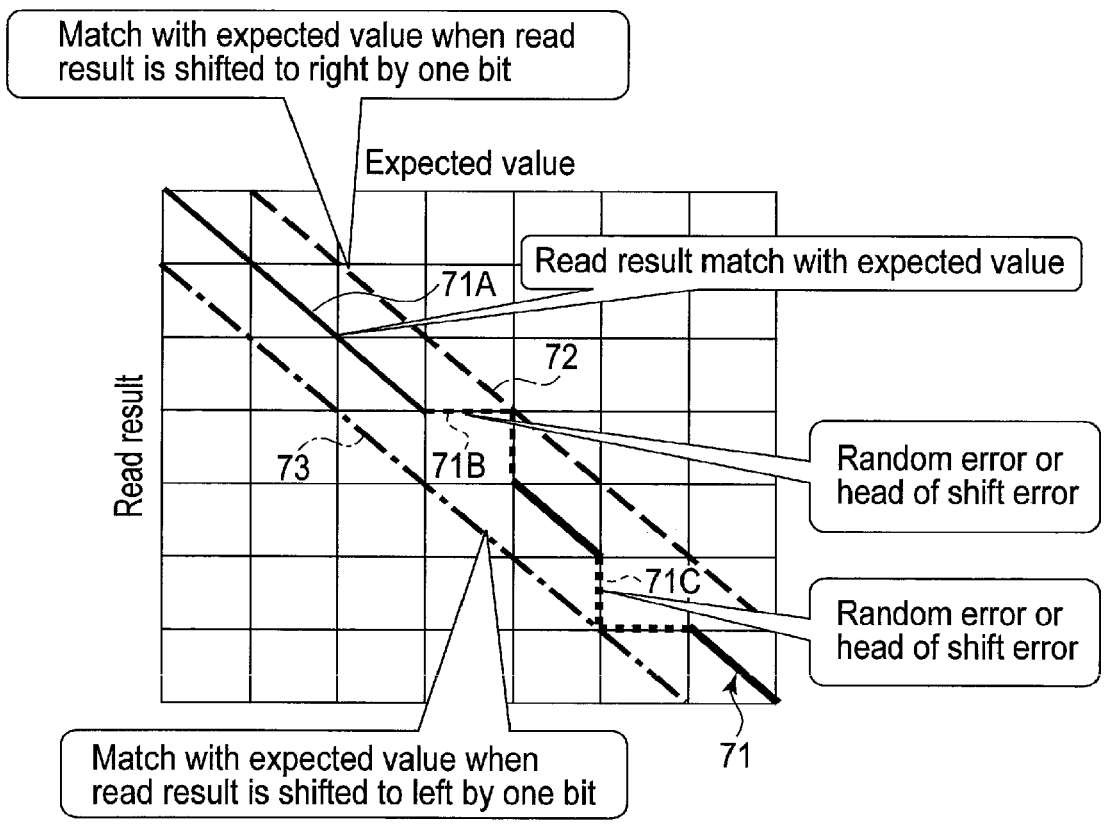
FIG. 67 is a diagram illustrating an example of errors distinguished using edit graphs.

Furthermore, FIG. 67 illustrates an example where a shift error and a random error are determined based on the shortest path derived from the edit graph based on the data of the read result and the data of the expected values.

As illustrated in FIG. 67, an edge 71A in a diagonal direction included in a shortest path 71 is determined that neither a random error nor a shift error occurs therein since the data of the read result and the data of the expected values match. An edge 71B of the shortest path 71 in the horizontal direction is determined that a random error occurs therein, or it is determined as a head of a shift error and is determined that the data of the read result in which the shift error occurs matches the data of the expected values when the data of the read result is shifted by one bit to the right (in the direction from upper bits to lower bits). An edge 71C of the shortest path 71 in the vertical direction is determined that a random error occurs therein, or it is determined as a head of a shift error and is determined that the data of the read result in which the shift error occurs matches the data of the expected values when the data of the read result is shifted by one bit to the left (in the direction from lower bits to upper bits).

A shortest path 72 is determined as a shift error and is determined that the data of read result in which the shift error occurs matches the data of the expected values when the data of the read result is shifted by one bit to the right (in the direction from upper bits to lower bits). Furthermore, a shortest path 73 is determined as a shift error and is determined that the data of read result in which the shift error occurs matches the data of the expected values when the data of the read result is shifted by one bit to the left (in the direction from lower bits to upper bits).

FIG. 68 Illustrates an example of the read result in which a random error in one position occurs in addition to a shift error in one position. In the example of FIG. 68, as in the example explained above with reference to FIG. 56, because of the addition of the magnetization direction S to the magnetic domain 3, a shift error in which the magnetization directions to be originally set in the magnetic domains 3 to 11 are set in the magnetic domains 4 to 12, respectively, and the magnetization direction N to be set in the magnetic domain 12 is lost occurs. Then, a random error in which the magnetization direction N set in the magnetic domain 7 is reversed to the magnetization direction S occurs.

Figure 69B:
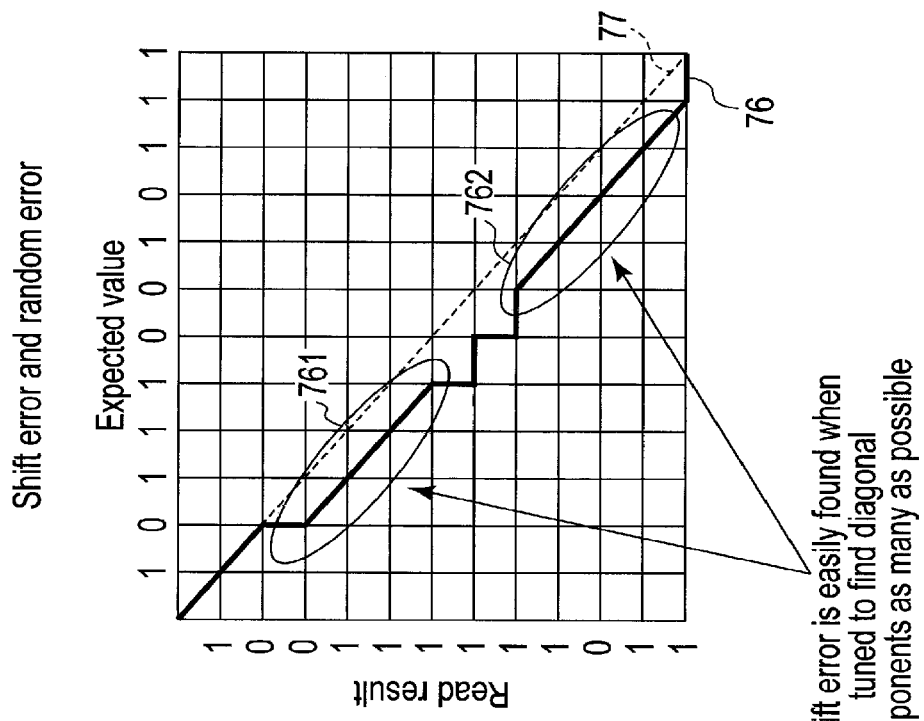
FIG. 69B is a diagram illustrating an example where an occurrence of shift and random errors is determined using an edit graph.
Figure 69A:
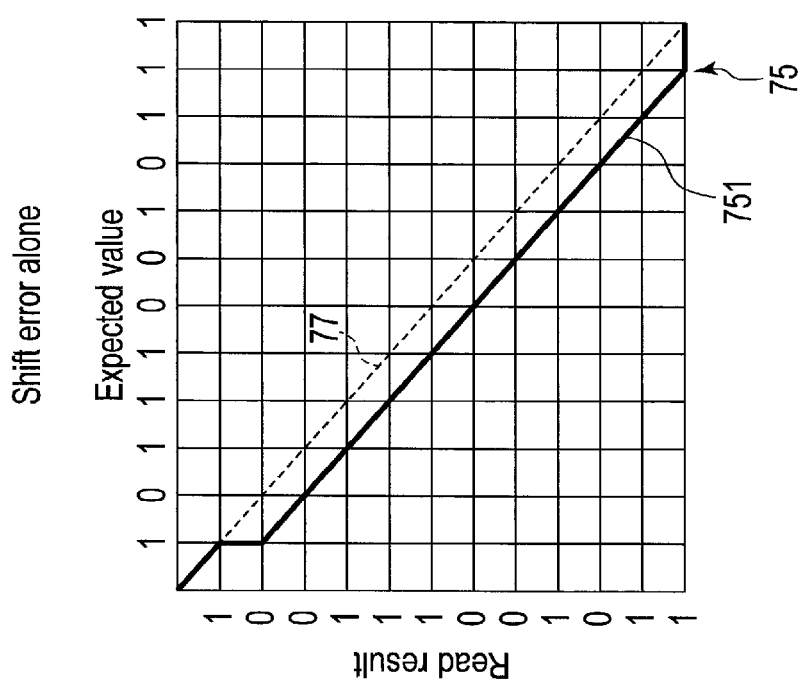
FIG. 69A is a diagram illustrating an example where an occurrence of a shift error is determined using an edit graph.

FIGS. 69A and 69B illustrate an example where a shift error and a random error are determined based on the shortest path derived from the edit graph based on the data of the read result and the data of the expected values.

FIG. 69A indicates a shortest path 75 acquired from the edit graph based on the data of the read result and the data of the expected values at the time when only the shift error occurs. The memory controller 2 can determine that a shift error occurs, and determine the data of read results in which the shift error occurs matches the data of the expected values when the data of the read result is shifted by one bit to the left (in the direction from lower bits to upper bits) based on a gap between an edge 751 in a dominant diagonal direction included in the shortest path 75 and a diagonal line 77.

Then, FIG. 69B indicates a shortest path 76 acquired from the edit graph based on the data of the read result and the data of the expected values at the time when the random error occurs in addition to the shift error. The shortest path 76 includes two edges 761 and 762 in a diagonal direction having the same gap with respect to the diagonal line 77, and an edge in the vertical direction and an edge in the horizontal direction are included in a manner to cut the two edges 761 and 762. The memory controller 2 selects at least one of the two edges 761 and 762 in the diagonal direction as a dominant edge in the diagonal direction included in the shortest path 76. Then, based on the gap between the dominant edges 761 and 762 in the diagonal direction and the diagonal line 77, the memory controller 2 may determine that a shift error occurs and that the data of the read result in which the shift error occurs matches the data of the expected values when the data of the read result is shifted by one bit to the left (in the direction from lower bits to higher bits). That is, even if the random error occurs in addition to the shift error, the shift error that occurs in the data of the read result can be estimated by specifying the longer edges 761 and 762 in the diagonal direction from the shortest path 76.

This example indicates a case where each of the two dominant edges 761 and 762 in the diagonal direction is determined as a shift error and is determined that the data of the read result in which the shift error occurs matches the data of the expected values when the data of the read result is shifted by one bit to the left. If the shifting directions and shifting amounts of the two dominant edges 761 and 762 in the diagonal direction are different, the memory controller 2 performs a shift on first bits corresponding to the edge 761 and another shift on second bits corresponding to the edge 762. That is, the memory controller 2 shifts the first bits in a direction with a shift amount based on the gap between the edge 761 and the diagonal line 77 and shifts the second bits in a different direction with a different shift amount based on the gap between the edge 762 and the diagonal line 77.

Through the above, whether a shift error occurs in bits of data of the read result read from an MML 10 can be determined, and a shift amount (that is, a direction in which the bits are shifted and the number of bits by which the bits are shifted) to correct the shift error can be determined. The memory controller 2 updates, with respect to the shift error, the shift error table 235 using information to specify the MML 10 in which the shift error occurs and information indicative of the shift amount to correct the shift error (for example, shifting by one bit in the direction from lower bits to upper bits). The memory controller 2 may add an entry including the above information to the shift error table 235 or may update a preliminarily existing entry using the above information.

Then, the data of the read result from lower frames are adapted to the information indicated in the shift error table 235, and thus, an influence of the shift error propagating to the data of the lower frames can be removed. Thus, for example, a possibility of error correction can be increased without using a method of adding to a data portion an ECC having different error correction strengths for each position in the MML 10 where the data portion is eventually stored.

Furthermore, when data read from a source block of compaction is adapted to the information indicated in the shift error table 235, data can be corrected while increasing a write margin. That is, the data corrected by shift error correction using the shift error table 235 and error correction using an ECC can be written into a destination block. Note that the information indicated in the shift error table 235 are applied to not only data read in the compaction but also data read in accordance with a read request from the host 4. Note that the compaction may be started when a free block ratio (or the number of free blocks) becomes below a threshold value, or when a written time becomes older than a threshold value while write times included in the reverse LUT 232 are periodically checked.

As explained above, the second embodiment is effective for the control of a nonvolatile memory in which data writing and reading are performed by a last-in first-out method. The nonvolatile memory 3 includes blocks each including one or more MMLs 10, and performs writing and reading of data for each block by a last-in first-out (LIFO) method by shifting, in a unit of a layer, data portions stored in a plurality of layers included in the one or more MMLs 10 in a first direction from a top layer to a bottom layer or in a second direction opposite to the first direction. Each of the blocks includes a plurality of frames. Each of the plurality of frames includes a set of adjacent layers into which the plurality of layers are logically divided. The memory controller 2 reads, from the frames included in one block of the blocks, a first frame including a first data portion and a first ECC and a second frame including a second data portion and a second ECC. The memory controller 2 performs an error correction process on the first data portion using the first ECC, and when an error corrected in the error correction process occurs in a first MML 10 of the MMLs 10, corrects the second data portion by replacing data stored in a first layer of the first MML 10 with data stored in a second layer of the first MML 10.

As can be understood from the above, based on a result of the error correction process performed on the first data portion using the first ECC, an error that occurred in the first data portion is learnt and a second data portion is adapted to the learning result. Thus, errors occurring in the second data portion can be reduced through a method different from the error correction process using the second ECC.

Each of various functions described in some embodiments of the present invention may be realized by a circuit (e.g., processing circuit). An exemplary processing circuit may be a programmed processor such as central processing unit (CPU). The processor executes computer programs (instructions) stored in a memory thereby perform the described functions. The processor may be a microprocessor including an electric circuit. An exemplary processing circuit may be a digital signal processor (DSP), an application specific integrated circuit (ASIC), a microcontroller, a controller, or other electric circuit components. The components other than the CPU described according to the embodiments may be realized in a processing circuit.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
a nonvolatile memory including first blocks each including magnetic memory lines and configured to perform writing and reading of data for each block by a last-in first-out (LIFO) method by shifting, in a unit of a layer, data portions stored in a plurality of layers, respectively, in a first direction from a top layer to a last layer or in a second direction opposite to the first direction, the magnetic memory lines including the plurality of layers; and
a controller configured to control the nonvolatile memory, wherein
the plurality of layers include at least one of a layer of a first attribute storing a data portion associated with a logical address and a layer of a second attribute storing a data portion that is not associated with any logical address,
at a location adjacent to a layer of the second attribute in the first direction, a layer of the first attribute exists, and
the controller is configured to select a source block of a compaction process from the first blocks based on a ratio of layers of the second attribute to the plurality of layers in each of the first blocks.

2. The memory system of claim 1, wherein
the controller is configured to preferentially select a block from the first blocks as the source block, the selected block has the ratio higher than the ratios of blocks other than the selected block.

3. The memory system of claim 1, wherein
the controller is configured to:
select second blocks from the first blocks, the second blocks each having the ratio higher than the ratios of blocks other than the second blocks; and
select, from the second blocks, a block including a layer of the first attribute closer to the last layer, as the source block.

4. The memory system of claim 1, wherein
the plurality of layers further include a layer of a third attribute, wherein the third attribute is different from the first attribute and the second attribute,
a layer of the first attribute and a layer of the second attribute are not positioned in the first direction from a layer of the third attribute, and
the controller is configured to select as the source block from the first blocks, either a block that does not include a layer of the third attribute and has a ratio of layers of the second attribute to the plurality of layers that is equal to or greater than an overprovisioning ratio indicative of a ratio of an overprovisioning capacity to a physical capacity of the nonvolatile memory, or a block that has a ratio of layers of the second attribute and the third attribute to the plurality of layers that is equal to or greater than the overprovisioning ratio.

5. The memory system of claim 1, wherein
the controller is further configured to select, from the first blocks, the source block based on a time elapsed from a time of writing data into each of the first blocks.

6. The memory system of claim 1, wherein
the plurality of layers further include a layer of a third attribute, wherein the third attribute is different from the first attribute and the second attribute,
a layer of the first attribute and a layer of the second attribute are not positioned in the first direction from a layer of the third attribute, and
the controller is configured to select a block from the first blocks as a destination block of the compaction process, wherein all layers in the selected block are layers of the third attribute.

7. The memory system of claim 1, wherein
the plurality of layers further include a layer of a third attribute, a layer of the first attribute does not exist in the first direction from a layer of the third attribute, and
the controller is configured to select a block from the first blocks as a destination block of the compaction process, wherein a number of layers of the third attribute included in the destination block is equal to or greater than a number of layers of the first attribute included in the source block.

8. The memory system of claim 6, wherein
the controller is configured to write data, which is stored in each of one or more layers of the first attribute in the source block, into the destination block in the compaction process.

9. The memory system of claim 1, further comprising
a random access memory controlled by the controller, wherein
the controller is further configured to:
store data portions, which are stored in one or more layers of the first attribute in the source block, respectively, to the random access memory; and write the data portions stored in the random access memory into the source block.

10. The memory system of claim 1, wherein the controller is further configured to:
select a third block from the first blocks, wherein the third block includes one or more layers of the second attribute continuous from a top layer; and
perform a read operation on the third block, the read operation including reading data portions from the one or more layers.

11. The memory system of claim 1, wherein
each of the first blocks includes a plurality of frames,
each of the plurality of frames includes a set of adjacent layers obtained by logically dividing the plurality of layers, and
the controller is further configured to:
read a first frame and a second frame of the plurality of frames in a fourth block of the first blocks, the first frame including a first data portion and a first error correction code, the second frame including a second data portion and a second error correction code;
perform an error correction process on the first data portion using the first error correction code; and
when an error corrected in the error correction process occurs in a first magnetic memory line of the magnetic memory lines, correct the second data portion by replacing data stored in a first layer in the first magnetic memory line with data stored in a second layer in the first magnetic memory line.

12. The memory system of claim 11, wherein
the fourth block is the source block.

13. The memory system of claim 1, further comprising a random access memory controlled by the controller, wherein
each of the first blocks includes a plurality of frames,
each of the plurality of frames includes a set of adjacent layers obtained by logically dividing the plurality of layers, and
the controller is further configured to:
read the plurality of frames in a fourth block of the first blocks;
store the read frames to the random access memory;
perform an error correction process on a first data portion in a first frame of the read frames using a first error correction code in the first frame; and
when an error corrected in the error correction process occurs in a first magnetic memory line of the magnetic memory lines, correct a second data portion in a second frame of the read frames by replacing data stored in a first layer in the first magnetic memory line with data stored in a second layer in the first magnetic memory line.

14. The memory system of claim 13, wherein
the fourth block is the source block.

* * * * *